United States Patent [19]
Fujimori et al.

[11] Patent Number: 5,660,917
[45] Date of Patent: Aug. 26, 1997

[54] THERMAL CONDUCTIVITY SHEET

[75] Inventors: Yoshinori Fujimori, Tokyo; Jun Momma; Tomiya Sasaki, both of Yokohama; Hideo Iwasaki, Kawasaki; Toshiya Sakamoto, Yokohama; Hiroshi Endo, Yokohama; Katsumi Hisano, Yokohama; Naoyuki Sori, Yokohama; Kazumi Shimotori, Kitakyushu; Noriaki Yagi, Yokohama; Hiromi Shizu, Fujisawa; Takashi Sano, Yokohama, all of Japan

[73] Assignee: Kabushiki Kaisha Toshiba, Kawasaki, Japan

[21] Appl. No.: 393,007

[22] PCT Filed: Jul. 6, 1993

[86] PCT No.: PCT/JP93/00929

§ 371 Date: Apr. 3, 1995

§ 102(e) Date: Apr. 3, 1995

[87] PCT Pub. No.: WO95/02313

PCT Pub. Date: Jan. 19, 1995

[51] Int. Cl.$^6$ ............................................. B32B 9/00
[52] U.S. Cl. ............... 428/195; 428/318.4; 428/319.3; 428/327; 428/365; 428/375; 428/480; 428/902; 428/913; 523/222; 165/46; 165/185
[58] Field of Search ...................... 428/195, 913, 428/292, 297, 302, 303, 365, 902, 375, 318.4, 319.3, 327, 480; 523/222; 165/185, 46

[56] References Cited

U.S. PATENT DOCUMENTS 4,256,792  3/1981  Koepke et al. ................... 428/119

FOREIGN PATENT DOCUMENTS

| 0 437 656 | 7/1991 | European Pat. Off. . |
| 0 528 606 | 2/1993 | European Pat. Off. . |
| 62-240538 | 10/1987 | Japan . |
| 3-151658 | 3/1991 | Japan . |
| 3151659 | 3/1991 | Japan . |
| 3-20068 | 3/1991 | Japan . |
| 3-200397 | 9/1991 | Japan . |
| 5-102355 | 4/1993 | Japan . |

*Primary Examiner*—Patrick Ryan
*Assistant Examiner*—Abraham Bahta
*Attorney, Agent, or Firm*—Foley & Lardner

[57] ABSTRACT

A thermal conductivity sheet is provided which is superior all in heat radiating characteristics (thermal conductivity) in the direction of sheet thickness, close-contact with respect to parts to be cooled, and electrical insulation. In a thermal conductivity sheet 1 in which a plurality of highly thermally conductive insulators 3 are dispersed in a matrix insulator 2, the highly thermally conductive insulators 3 are oriented obliquely or erectly in the direction of thickness of the thermal conductivity sheet 1 such that at least one end faces of the highly thermally conductive insulators 3 are exposed to a surface of the matrix insulator 2. Preferably, a ratio of the total sectional area of the highly thermally conductive insulators 3 to the total surface area of the thermal conductivity sheet 1 is set to be equal to or larger than 1%.

51 Claims, 19 Drawing Sheets

THERMAL CONDUCTIVITY SHEET

TECHNICAL FIELD

The present invention relates to a thermal conductivity sheet (heat radiating sheet, or heat releasing sheet), and more particularly to a thermal conductivity sheet which is superior in a heat radiation, electrical insulation and pliability or flexibility, which has excellent close-contact property with respect to electronic equipment parts such as transistors, capacitors and LSI packages, and which can efficiently dissipate or transmit the heat produced by parts to the exterior.

BACKGROUND ART

Electric/electronic parts such as transistors, capacitors and LSI packages tend to shorten the service life and deteriorate the reliability with the heat generated during operation. As measures for preventing such drawbacks, it has been proposed to interpose a thermal conductivity sheet, which is superior in thermal conductivity and close-contact, between electric/electronic parts and a heat sink (cooling means), such as a heat radiating fin, thermally connected to the electric/electronic parts for dissipating the generated heat to the exterior through the thermal conductivity sheet.

The thermal conductivity sheet is generally manufactured by dispersing a thermal conductivity filler in a matrix resin and shaping the mixture into the form of a sheet. Silicone rubber, for example, is employed as the matrix resin, while boron nitride in the form of particles, plates and needles, for example, is employed as the thermal conductivity filler.

More specifically, the thermal conductivity sheet is manufactured using the above-exemplified materials of a thermal conductivity filler and a matrix resin by any of three primary methods below.

In the first method, a matrix resin (e.g., silicone rubber) and a thermal conductivity filler (e.g., boron nitride (BN)) are combined and mixed with each other to prepare a material mixture. The material mixture is then shaped into the form of a sheet by using rolls, a calender, an extruder or the like as with usual rubber materials. The shaped sheet is pressed and vulcanized.

In the second method, a matrix resin (e.g., silicone rubber) and a thermal conductivity filler (e.g., boron nitride) are mixed and diluted in a solvent. A resulting mixture is then formed into a sheet by a doctor blade process. The sheet is dried, pressed and then blade process, vulcanized.

In the third method, a matrix resin (e.g., silicone rubber) of 100 weight parts and a thermal conductivity filler (e.g., boron nitride) of 200 or more weight parts are combined together to prepare a compound material containing the thermal conductivity filler at a high ratio. The material is mixed by using a closed type kneading machine such as a kneader to form a powdery rubber material. A predetermined amount of the powdery rubber material is filled in a mold for shaping into a sheet, following which the molded sheet is pressed and vulcanized.

FIG. 41 is a sectional view showing a structure of the conventional thermal conductivity sheet fabricated by any of the prior art manufacture methods described above. In a prior art thermal conductivity sheet 10, thermal conductivity fillers 12 are combined and distributed in a matrix resin 11 in a condition where the long axes of the thermal conductivity fillers 12 are oriented in the direction of plane of the thermal conductivity sheet 10 (the longitudinal direction thereof).

The thermal conductivity fillers 12 are oriented so longitudinally of the sheet because the fillers 12 are aligned in the direction of rolling or extrusion when the material mixture is rolled or extruded for shaping into the sheet.

The inventors have found that the thermal conductivity sheet fabricated by any of the prior art manufacture methods has a problem below. Since the thermal conductivity fillers 12 are oriented in the direction of sheet plane, there is a tendency that the adjacent thermal conductivity fillers 12 are contacted with each other and the thermal conductivity fillers 12 as a whole are substantially continuously extended in the direction of plane of the thermal conductivity sheet 10 (the longitudinal direction thereof). Accordingly, heat is easy to transmit in the direction of plane of the thermal conductivity sheet 10, but is hard to transmit in the direction of thickness of the thermal conductivity sheet 10. As a result, the thermal conductivity sheet has poor performance when it is used for the purpose of mainly utilizing its heat radiating characteristics in the direction of sheet thickness.

The inventors have also found the fact as follows. In a thermal conductivity sheet in which a large amount of brittle materials such as ceramics and metals are distributed as thermal conductivity filler in a soft matrix resin, the modulus of elasticity is increased and pliability is decreased. Therefore, when the thermal conductivity sheet is fitted to a part to be cooled, the thermal conductivity sheet 10 is difficult to deform following surface irregularities of the cooled part. This results in the problem that the thermal conductivity sheet 10 does not sufficiently closely contact with the surface of the cooled part, the thermal conductivity resistance is increased, and hence the heat radiating characteristics are deteriorated.

A thermal conductivity sheet disclosed in Japanese patent laid-open No. 54-163398 is formed of a composite of resin and boron nitride powder. The particle size of the boron nitride powder is set to be 0.2 to 1 time the sheet thickness, and the powder is filled into the sheet by pressing while it is also exposed to the sheet surface. Also, a thermal conductivity sheet disclosed in Japanese patent laid-open No. 3-20068 is of a structure that inorganic filler particles are arranged to lie continuously while contacting with each other. Any of the above-mentioned thermal conductivity sheets is intended to enhance thermal conductivity by increasing the density of fillers, which possess thermal conductivity, to such an extent that the fillers are present in the continuous form.

As a result of studies made by the inventors, however, it has been found that the thermal conductivity sheet lowers flexibility with an increase in a contact rate of the filler particles, and it eventually exhibits thermal conductivity as low as 4 W/m·K and slight flexibility and hence has a difficulty in drastically improving the thermal conductivity.

On the other hand, as disclosed in Japanese patent laid open No. 3-151658, there is known a thermal conductivity sheet in which small thermal conductivity fillers in the form of particles, plates, needles, etc. are oriented in the direction of sheet thickness such that the thermal conductivity fillers are contacted with each other, i.e., that the thermal conductivity fillers are arranged continuously with no resin layers therebetween.

In the above thermal conductivity sheet, however, since the thermal conductivity fillers are arranged continuously with no resin layers therebetween, flexibility (pliability) of the thermal conductivity sheet is impaired. Stated otherwise, in an attempt of increasing the density of the fillers to increase the thermal conductivity, it is inevitable for the thermal conductivity sheet becomes hard and brittle. Thus, the inventors have found that when the above thermal conductivity sheet is fitted to electronic/electric parts and heat sinks, the contact area is reduced, the contact thermal resistance is generated, and a sufficient degree of thermal conductivity cannot be obtained.

As another example in which thermal conductivity fillers are oriented in the direction of sheet thickness, a thermal conductivity member is disclosed in Japanese patent laid-open No. 62-240538. This thermal conductivity member is of a structure that metal short fibers or metal powders are planted or buried in an adhesive layer on a base sheet so as to form continuous heat radiating paths. When the metal short fibers are arranged in the direction of sheet thickness and the base sheet is made of an electrically conductive material, the electrically conductive material must be completely isolated by the adhesive layer in order that the thermal conductivity member has electrical insulation in its entirety. In this case, the thermal conductivity is improved by filling and dispersing metal powders in the adhesive layer.

As a result of studies made by the inventors, however, the following problems have been found. Because the amount of filled metal powders is restricted as a necessity to keep electrical insulation, the thermal conductivity is inevitably lowered. Also, the sufficiently large density of the filled metal powders entails a difficulty in ensuring flexibility. When the base sheet is made of the insulating materials disclosed in the above laid-open publication, the thermal conductivity of the thermal conductivity member as a whole is lowered and the effect of radiating and dissipating heat becomes insufficient. Further, when the thermal conductivity member, in which metal short fibers are planted in the adhesive layer on the base sheet, is fitted over an electric circuit, an electric trouble is apt to occur in that the metal short fibers may contact with each other to cause a short-circuit between a voltage applied portion and a ground potential portion on the circuit.

Additionally, as disclosed in Japanese patent laid-open No. 56-35494, there is known a thermal conductivity body in which a coating film comprising metal oxide particles dispersed in adhesive organic high molecules is formed on a highly thermally conductive base sheet. In this prior art, while the highly thermally conductive base sheet itself has sufficiently large thermal conductivity, the coating film consisted of a resin and harmless metal oxide particles except BeO dispersed in the resin has low thermal conductivity. Thus, it has been found from studies made by the inventors that the thermal conductivity body has low thermal conductivity as a whole and an effective heat radiating and dissipating action cannot be excepted.

Though the technical field is different from the present invention, various electrically conductive sheets having anisotropy are disclosed in Japanese patent laid-open No. 62-31909, No. 55-111014, No. 63-86322, No. 2-68811, No. 2-68812, for example. In any of the disclosed electrically conductive sheets, the sheet is given with anisotropy, while focusing on electric conductivity, by a structure that a conductive member is penetrated through the sheet in the direction of thickness thereof and the conductive member is exposed to the sheet surface. Stated otherwise, the disclosed electrically conductive sheets are intended to keep electric conductivity with high reliability, and are basically different in technical nature from the thermal conductivity sheet of the present invention which is intended to satisfy electrical insulation, thermal conductivity and flexibility at the same time.

Japanese patent laid-open No. 64-76608 discloses an electrically conductive member in which bumps are formed on an electrically conductive base material, and Japanese patent laid-open No. 1-286206 discloses an electrically conductive member in which a layer of a metal having the low melting point is formed on an electrically conductive portion. However, any of these prior parts has an object to ensure electrical connection of the electrically conductive member, and hence is different from the thermal conductivity sheet of the present invention aiming at thermal connection.

Furthermore, in the thermal conductivity sheet which is formed by arranging thermal conductivity fillers having the particle size of several µm to 10 µm such that the fillers lie continuously while contacting with each other with no resin layers therebetween, as disclosed in the above-cited Japanese patent laid-open publication (No. 3-20068), flexibility (pliability) of the thermal conductivity sheet is impaired. Therefore, the contact area of the thermal conductivity sheet with respect to electronic/electric parts and heat sinks (cooling means) is reduced and the contact thermal resistance is increased. Consequently, a sufficient degree of thermal conductivity cannot be expected.

In this way, as the dispersion density of thermal conductivity fillers is increased, the thermal conductivity is improved, but the flexibility of the thermal conductivity sheet is lowered. Then, it is difficult to obtain a thermal conductivity sheet which satisfies both high thermal conductivity and good flexibility, by any compounding techniques described above as the prior art methods.

With remarkable development of electronic/electric parts in recent years, an increase in integration, speed and output of electronic equipment, including semiconductor devices, is progressed and, correspondingly, the amount of heat generated from heat generating parts such as semiconductor devices is also increased. There is thus a demand for a thermal conductivity sheet which is more superior in heat radiating characteristics.

The present invention has been accomplished with a view of solving the problems described above, and its object is to provide a thermal conductivity sheet which is markedly superior in heat radiating characteristics (thermal conductivity) in the direction of sheet thickness, electrical insulation, and close-contact with respect to parts to be cooled.

DISCLOSURE OF THE INVENTION

To achieve the above object, the inventors have conducted experiments of distributing various highly thermally conductive insulators in matrix insulators, and confirmed influences of the orientation and the amount of filled highly thermally conductive insulators upon heat radiating characteristics. As a result, a thermal conductivity sheet having superior heat radiating characteristics has been obtained particularly when the highly thermally conductive insulators are arranged in the direction of thickness of the thermal conductivity sheet and at least one end faces of the highly thermally conductive insulators are exposed to a surface of the matrix insulator. The present invention has been accomplished based on the above finding.

More specifically, the present invention resides in a thermal conductivity sheet in which a plurality of highly thermally conductive insulators are continuously interconnected through a flexible matrix insulator, wherein the highly thermally conductive insulators are arranged obliquely or erectly in the direction of thickness of the thermal conductivity sheet such that at least one end faces of the highly thermally conductive insulators are exposed to a surface of the matrix insulator. Preferably, the highly thermally conductive insulators are arranged obliquely or erectly in the direction of thickness of the thermal conductivity sheet such that both end faces of the highly thermally conductive insulators are exposed to surfaces of the matrix insulator.

Here, the matrix insulator is made of, for example, a thermoplastic resin such as silicone rubber, polyolefinic elastomer, polyethylene, polypropylene, polystyrene, poly-p-xylene, polyvinyl acetate, polyacrylate, polymethacrylate, polyvinyl chloride, polyvinylidene chloride, fluorine-base plastic, polyvinyl ether, polyvinyl ketone, polyether, polycarbonate, thermoplastic polyester, polyamide, diene-base plastic, polyurethane-base plastic, silicone and inorganic plastic, or a thermosetting resin such as a phenol resin, furan resin, xylene/formaldehyde resin, ketone/formaldehyde resin, urea resin and epoxy resin.

On the other hand, the highly thermally conductive insulator is made of a material which has high thermal conductivity and also has electrical insulation, such as aluminum nitride, boron nitride, silicon nitride, silicon carbide, BeO, C—BN, diamond, HP—TiC and alumina ceramic. In addition to the above-mentioned insulator in the form of a single layer, the highly thermally conductive insulator may be formed by integrally laminating an insulating thin film (insulating layer) on a surface of a conductor. Here, the conductor means general kinds of metals and is made of at least one selected from among typical metals such as gold, silver, copper and aluminum. The insulating thin film may be made of a heat-resistant high molecular material or the like in addition to any of the above-mentioned materials for the matrix insulator.

The thickness of the insulating thin film is properly selected depending on the voltage applied to the thermal conductivity sheet as a final product, but is desirably equal to or less than 0.1 mm to prevent a deterioration in thermal conductivity characteristics of the conductor itself. In order to maintain electrical insulation, it is required for the insulating thin film to have electrical insulation resistivity (volume resistivity) equal to or larger than $10^{12}$ Ω-cm. The insulating thin film may be made of any of insulating ceramics such as aluminum nitride (AlN), boron nitride (BN), silicon nitride ($Si_3N_4$), alumina ($Al_2O_3$) and zirconium oxide ($ZrO_2$).

The thermal conductivity of the highly thermally conductive insulators is set to be equal to or larger than 25 W/m·K.

It is to be understood that the long axes of the numerous highly thermally conductive insulators oriented obliquely or erectly in the direction of thickness of the thermal conductivity sheet are not all necessarily aligned in a certain direction, and the sheet may be of an oriented structure that the highly thermally conductive insulators oriented at various angles are mixed together.

With the thermal conductivity sheet thus constructed, since the highly thermally conductive insulators are arranged obliquely or erectly in the direction of thickness of the thermal conductivity sheet such that at least one end faces of the highly thermally conductive insulators are exposed to the surface of the matrix insulator, heat radiating paths with high thermal conductivity are formed continuously in the direction of thickness of the thermal conductivity sheet. It is therefore possible to effectively transmit heat in the direction of thickness of the thermal conductivity sheet, and to greatly improve the efficiency of cooling electronic/electric parts to which the thermal conductivity sheet is fitted.

Particularly, by arranging the highly thermally conductive insulators such that the insulators are oriented obliquely with respect to the direction of thickness of the thermal conductivity sheet, the sheet can have higher pliability and flexibility in the direction of sheet thickness than the sheet in which the insulators are oriented erectly. It is therefore possible to develop an effect of releasing stresses imposed from parts to be cooled, and to improve close-contact of the thermal conductivity sheet with respect to the cooled parts.

Also, by setting a ratio of the total sectional area of the highly thermally conductive insulators to the total surface area of the thermal conductivity sheet to be equal to or larger than 1%, the thermal conductivity sheet as a whole can have higher thermal conductivity than a thermal conductivity sheet which is made of only a general resin material.

It is to be understood that the highly thermally conductive insulators arranged in the matrix insulator are not all necessarily penetrated through the thermal conductivity sheet in the direction of sheet thickness, and the sheet may be of an arrangement that the highly thermally conductive insulators penetrating through the sheet and the highly thermally conductive insulators not penetrating through the sheet but lying horizontally or obliquely are mixed together.

To achieve a high predetermined value of thermally conductivity, however, it is required to adjust the total sectional area of the highly thermally conductive insulators penetrating through the sheet to be equal to or larger than 1% with respect to the total surface area of the thermal conductivity sheet. If the area ratio is less than 1%, the effect of improving the thermal conductivity of the thermal conductivity sheet would be poor.

Conversely, if the area ratio exceeds 90%, the thermal conductivity would be further increased, but the flexibility (pliability) of the thermal conductivity sheet would be lowered, the close-contact with respect to the cooled parts would be impaired, and the production cost would be raised because of the increased amount of expensive highly thermally conductive insulators used. For that reason, the area ratio is preferably set to fall in the range of about 1 to 90%, more preferably in the range of about 10 to 60%.

Particularly, when an AlN sintered body which has thermal conductivity of 200 W/m·K or more and a diameter of 0.5 mm is used as the highly thermally conductive insulator, the present thermal conductivity sheet having the area ratio set to be equal to or larger than 15% exhibits thermal conductivity two or more times that of the prior art ones. Despite of such a drastic increase in the thermal conductivity, the modulus of elasticity (Young's modulus) of the matrix insulator remains constant and the flexibility of the thermal conductivity sheet is not impaired. In this connection, it is important to distribute a large number of highly thermally conductive insulators each having a small sectional area uniformly all over the matrix insulator, rather than arranging a small number of highly thermally conductive insulators each having a large sectional area. Using highly thermally conductive insulators each of which is thin and has a small sectional area is also effective to further increase the pliability of the thermal conductivity sheet.

The highly thermally conductive insulators and the matrix insulator constituting the thermal conductivity sheet may be arranged with certain regularity so as to form the thermal conductivity sheet which has anisotropy in thermal conductivity and/or modulus of elasticity in the direction of plane of the thermal conductivity sheet. For example, a thermal conductivity sheet may be formed by preparing highly thermally conductive insulators and matrix insulators all of which has a length equal to the sheet width and arraying both the insulators alternately into a unitary structure. In this thermal conductivity sheet, continuous heat radiating paths are formed not only in the direction of sheet thickness but also in the axial direction of the highly thermally conductive insulators, enabling heat to be transmitted effectively. Further, this thermal conductivity sheet can be easily bent in a direction perpendicular to the axial direction and hence can be fitted to surfaces of cylindrical parts to be cooled form with a high degree of close-contact. When the thermal conductivity sheet is used in a condition of undergoing stress from a part to be cooled, the effect of releasing the stress is developed by fitting the thermal conductivity sheet to the part such that the acting direction of the stress agrees with the direction in which the thermal conductivity sheet has the low modulus of elasticity. As a result, the close-contact between the cooled part and the thermal conductivity sheet is maintained in a good condition for a long term.

For the thermal conductivity sheet using columnar highly thermally conductive insulators of which sectional areas are constant in the axial direction thereof, there is a risk that, for example, when the thermal conductivity sheet is deformed upon external forces applied to the sheet, the highly thermally conductive insulators are apt to easily slip off from the matrix insulator and the heat radiating capability may be lowered. Therefore, by forming the highly thermally conductive insulators into, e.g., a barrel or a hyperboloidal drum such that sectional areas of the highly thermally conductive insulators are changed in the axial direction thereof, the insulators can be effectively prevented from slipping off from the matrix insulator.

Furthermore, the highly thermally conductive insulator comprises a plurality of columnar highly thermally conductive insulator elements which are adjacent to each other in the direction of thickness of the thermal conductivity sheet with their central axes offset from each other, and a coupling element for integrally coupling the adjacent columnar highly thermally conductive insulator elements in the direction of plane of the thermal conductivity sheet.

In the thermal conductivity sheet of the above structure, when the sheet is subject to pressing force in the direction of sheet thickness, the highly thermally conductive insulator elements can be easily deformed at the coupling elements to flex to some extent. Therefore, the thermal conductivity sheet can easily release stresses and can also easily deform as a whole in conformity with surface configurations of parts to be cooled, thereby improving a degree of the close-contact. Particularly, by forming the coupling element to have a thickness equal to or smaller than ½ of the height of the columnar highly thermally conductive insulator elements, the thermal conductivity sheet is allowed to more easily flex at the coupling elements, which increases the elasticity and pliability of the thermal conductivity sheet as a whole and hence provides the further improved close-contact with respect to the cooled parts.

With another structure that the highly thermally conductive insulator comprises a plurality of highly thermally conductive insulator elements which are interconnected in the direction of thickness of the thermal conductivity sheet, and the highly thermally conductive insulator elements adjacent to each other are freely movable relatively at contact surfaces therebetween, when the thermal conductivity sheet is subject to external stresses, the individual insulating elements are independently movable at the contact surfaces in both the directions of thickness and plane of the sheet, and can provide the thermal conductivity sheet with higher pliability than the sheet employing the highly thermally conductive insulators each of which is in the form of a single column. Accordingly, even if a cooled part such as an electronic/electric part has irregularities on its surface, the thermal conductivity sheet can satisfactorily closely contact with the part surface and can posses superior heat radiating characteristics for a long term.

In this connection, the contact surfaces of the insulator elements adjacent to each other may be not only parallel to the direction of plane of the thermal conductivity sheet, but also inclined with respect to the direction of sheet plane or formed to be saw-toothed in section. By so forming the contact surfaces, when adjacent insulator elements are relatively displaced by external forces, the adjacent filler elements are kept partly contacted with each other and a possibility of losing the heat radiating paths is small.

Also, the height between both end faces of the highly thermally conductive insulators may be set to be smaller than the thickness of the matrix insulator so that recessed steps are formed between surfaces of the matrix insulator and the end faces of the highly thermally conductive insulators.

With the thermal conductivity sheet having such recessed steps formed thereon, the surfaces of the soft matrix insulator are somewhat higher than both the end faces of the highly thermally conductive insulators exposed to the surfaces of the matrix insulator. Therefore, even when the thermal conductivity sheet is fitted to a cooled part having irregularities on its surface, the projecting soft matrix insulator is allowed to deform following the irregularities on the cooled part surface so that the end faces of the highly thermally conductive insulators and the surface of the matrix insulator can be both closely contact with the cooled part surface to effectively transmit the heat.

In addition, convex bumps made of a soft metal may be formed on the end faces of the highly thermally conductive insulators exposed to the surfaces of the matrix insulator. Used as the soft metal is, e.g., a metal having the low melting point equal to or lower than 200° C. such as Bi—Pb, Bi—Pb—Sn, Bi—Sn—Cd, Bi—Sn—Zn, Bi—Cd, and Pb—Sn.

With the thermal conductivity sheet having such bumps formed thereon, when the thermal conductivity sheet is press-fitted to cooled parts, the bumps are collapsed so as to deform following irregularities on surfaces of semiconductor devices and heat radiating fins. Therefore, a degree of close-contact between both the members is increased and the contact thermal resistance can be greatly reduced.

The thermal conductivity sheet according to the present invention is manufactured by a manufacturing method for a thermal conductivity sheet in which highly thermally conductive insulators are arranged in a matrix insulator, the method comprising the steps of arranging highly thermally conductive insulators in the predetermined form obliquely or erectly in the direction of thickness of the thermal conductivity sheet, covering both end faces of the highly thermally conductive insulators with a masking agent, coating the matrix insulator around the highly thermally conductive insulators except the covered both end faces to prepare a preform, removing the masking agent from the preform, and heating and shaping the preform into a sheet. Here, a paraffin, styrene rubber or the like is used as the masking agent.

Alternately, in a manufacture method for a thermal conductivity sheet in which highly thermally conductive insulators are distributed in a matrix insulator, the method may comprise the steps of arranging a number of highly thermally conductive insulators with spacings therebetween such that their long axes are parallel to each other, coating the matrix insulator around the highly thermally conductive insulators to prepare a block-like preform, and slicing or cutting the block-like preform at a predetermined cut angle with respect to the long axes of the highly thermally conductive insulators to prepare a plurality of thermal conductivity sheets.

With the above manufacture method, by cutting (slicing) the block-like preform at a cut angle of 90 degrees with respect to the long axes of the highly thermally conductive insulators, the thermal conductivity sheet in which the highly thermally conductive insulators are erected in the direction of sheet thickness can be mass-produced.

On the other hand, by setting the cut angle to an acute angle, the thermal conductivity sheet in which the highly thermally conductive insulators are inclined with respect to the direction of sheet thickness and which has superior elasticity can be mass-produced. If the cut angle is less than 30 degrees, the heat radiating paths defined by the highly thermally conductive insulators would be long and the cooling capability of the thermal conductivity sheets would be poor. Therefore, the cut angle is preferably set to be in the range of 30 to 90 degrees. Particularly, to obtain the thermal conductivity sheet in which the highly thermally conductive insulators are inclined with respect to the direction of sheet thickness and which has superior elasticity, the cut angle is set to be in the range of 30 to 60 degrees.

In any of the above manufacture methods, by applying a coating agent, which contains a lipophilic group, over surfaces of the highly thermally conductive insulators to form coating layers, prior to the step of coating the matrix insulator around the highly thermally conductive insulators, wetting between the matrix insulator and the highly thermally conductive insulators is improved and the content of the highly thermally conductive insulators in the entire thermal conductivity sheet can be increased without reducing the bonding strength therebetween. It is hence possible to optionally prepare the thermal conductivity sheet which has any desired thermal conductivity.

In the thermal conductivity sheet according to the present invention, as described above, the highly thermally conductive insulators are not simply filled and compounded in the matrix insulator, but the thermal conductivity sheet comprises portions possessing thermal conductivity and portions possessing flexibility which are distinctly separated in terms of functions, while ensuring electrical insulation of the thermal conductivity sheet as a whole. With such a feature, the thermal conductivity, the flexibility and the electrical insulation can be appropriately adjusted in design. Consequently, the thermal conductivity sheet which has all of the thermal conductivity, the flexibility and the electrical insulation can be provided.

BEST MODE FOR CARRYING OUT THE INVENTION

Embodiments of the present invention will be described below in more detail with reference to the accompanying drawings.

Embodiment 1

Figure 1:
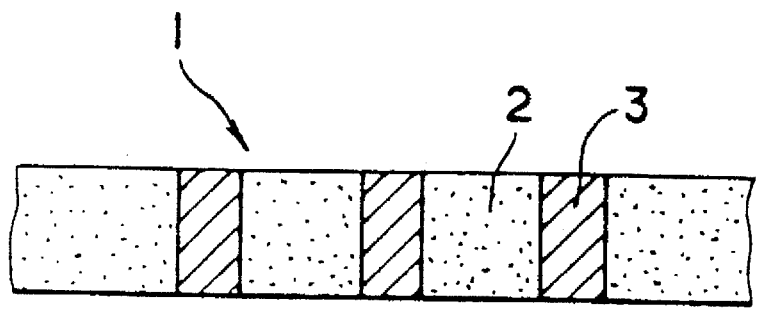
FIG. 1 is a sectional view showing a first embodiment of a thermal conductivity sheet according to the present invention.
Figure 2:
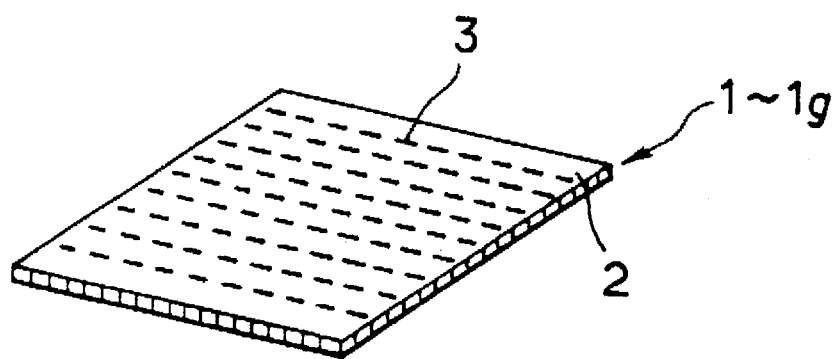
FIG. 2 is a perspective view of the thermal conductivity sheet shown in FIG. 1.

FIG. 1 is a sectional view showing a first embodiment of a thermal conductivity sheet according to the present invention, and FIG. 2 is a perspective view of the thermal conductivity sheet shown in FIG. 1.

The thermal conductivity sheet according to the first embodiment is a thermal conductivity sheet 1 in which a plurality of highly thermally conductive insulators 3 are dispersed and arranged in a matrix insulator 2, the highly thermally conductive insulators 3 being oriented in the matrix insulator 2 erectly in the direction of thickness of the thermal conductivity sheet 1 such that the highly thermally conductive insulators 3 are penetrated through the thermal conductivity sheet 1 in the direction of thickness of thereof and their both end faces are exposed to surfaces of the matrix insulator 2.

Figure 3:
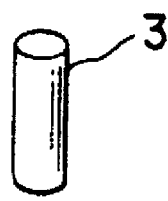
FIG. 3 is a perspective view showing one exemplified configuration of highly thermally conductive insulators for use with the thermal conductivity sheet shown in FIG. 1.

The matrix insulator 2 is made of silicone rubber, polyolefinic elastomer, etc. Each of the highly thermally conductive insulators 3 is formed of an aluminum nitride sintered body having thermal conductivity as high as 200 W/m·K and having electrical insulation, and is shaped into a column with a diameter of 0.5 mm and a height of 0.5 mm as shown in FIG. 3. The highly thermally conductive insulators 3 are erected in the direction of thickness of the thermal conductivity sheet 1 and their both end faces are exposed to the surfaces of the thermal conductivity sheet 1.

A ratio of the total sectional area (total exposed area) of the highly thermally conductive insulators 3 the surface area of the thermal conductivity sheet 1 is set to be in the range of 0.1 to 90%, and a predetermined amount of the highly thermally conductive insulators 3 are combined in the matrix insulator. Further, the highly thermally conductive insulators 3 made of aluminum nitride are sintered to improve thermal conductivity.

As material making up the thermal conductivity sheet 1, additives such as hardeners, plasticizers and machining aids may be appropriately mixed as required in addition to the matrix insulator 2 and the highly thermally conductive insulators 3.

A manufacture method of the thermal conductivity sheet i will be described below. First, the highly thermally conductive insulators 3 made of aluminum nitride were each sintered into a column of a predetermined size (e.g., with a diameter of 0.5 mm and a height of 0.5 mm). The highly thermally conductive insulator 3 was formed as a sintered body having thermal conductivity of about 200 W/m·K by preparing a material mixture of aluminum nitride material powder added with a sintering aid, yttrium oxide of 3 wt %, compacting the material mixture into a compact, and firing the compact in a nitrogen atmosphere at 1800° C.

Then, a coating agent, such as a surfactant which contains a highly lipophilic group (e.g., an amide-base surfactant or a titanate-base coupler), was applied over surfaces of the highly thermally conductive insulators 3. By so applying the coating agent over the surfaces of the highly thermally conductive insulators 3, wettability between the matrix insulator 2 and the highly thermally conductive insulators 3 is improved and the content of the highly thermally conductive insulators 3 in the entire thermal conductivity sheet 1 can be increased so as provide predetermined values of the thermal conductivity and the Young's modulus.

Then, the highly thermally conductive insulators 3 each being in the form of a column were arranged erectly in the direction of sheet thickness, both the end faces of the erected insulators 3 were covered with paraffin for masking, and thereafter the matrix insulator 2 was coated in a predetermined thickness around the highly thermally conductive insulators 3. After coating the matrix insulator 2, the masking agent covering both the end faces of the columnar highly thermally conductive insulators 3 were removed.

Then, the coated matrix insulator 2 including the columnar highly thermally conductive insulators 3 erected in the matrix insulator 2 with their both end faces exposed was vertically placed in a mold. Specifically, the coated matrix insulator 2 was arranged such that both the masked end faces of the highly thermally conductive insulators 3 were positioned to lie in the opposite surfaces of the thermal conductivity sheet in the direction of sheet thickness, followed by heating and pressing to thereby manufacture the thermal conductivity sheet 1 according to the present invention.

In the thermal conductivity sheet 1 of the first embodiment thus obtained, as shown in FIG. 1, the columnar highly thermally conductive insulators 3 are distributed in the matrix insulator 2 while being arranged in the direction of thickness of the thermal conductivity sheet 1 (i.e., in the vertical direction), and both the end faces of the highly thermally conductive insulators 3 are exposed to the surfaces of the matrix insulator 2 so as to form heat radiating paths which are continuously extended in the direction of sheet thickness. Therefore, heat is effectively transmitted in the direction of thickness of the thermal conductivity sheet 1.

Figure 4:
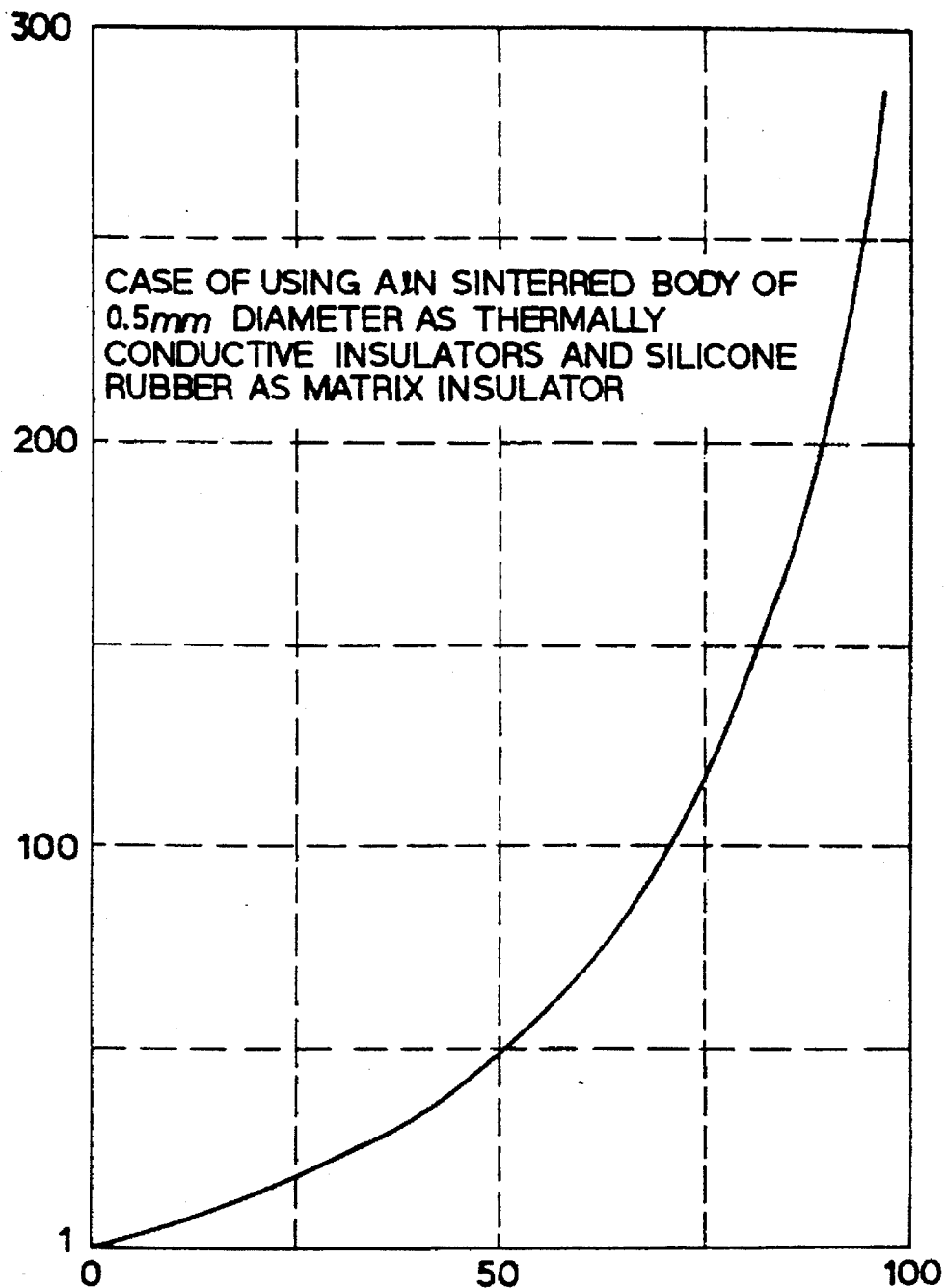
FIG. 4 is a graph showing the relationship between a ratio of the total sectional area of the highly thermally conductive insulators to the surface area of the thermal conductivity sheet and a ratio of the thermal conductivity of the thermal conductivity sheet to the thermal conductivity of the matrix insulator.

FIG. 4 represents measured data showing the relationship between a ratio of the thermal conductivity of the thermal conductivity sheet to the thermal conductivity of the matrix insulator and a ratio of the total sectional area of the highly thermally conductive insulators 3 to the surface area of the thermal conductivity sheet 1 in the thermal conductivity sheet 1 according to the first embodiment. As is apparent from the measured results, when the ratio of the total sectional area of the highly thermally conductive insulators 3 to the surface area of the thermal conductivity sheet 1 is equal to or larger than 1%, the thermal conductivity sheet had higher thermal conductivity than one formed of only the matrix insulator.

Particularly, by setting the above area ratio to be equal to or larger than 15%, the thermal conductivity sheet having thermal conductivity two or more times that of conventional typical ones could be obtained. In spite of such an increase in thermal conductivity, the modulus of elasticity (Young's modulus) of the matrix insulator was kept constant and good flexibility was maintained. It was however found that if the above area ratio exceeded 80%, the pliability of the thermal conductivity sheet was lowered, the close-contact with respect to parts to be cooled was impaired, and hence the thermal conductivity sheet had a difficulty in practical use. It was also confirmed that the thermal conductivity and the close-contact were both satisfied when the above area ratio was in the range of 15 to 60%.

By sandwiching the thermal conductivity sheet 1 of the present invention between an electronic/electric part such as an LSI package and a heat sink (cooling means) such as a heat radiating fin, the heat generated from the electronic/electric part is effectively transmitted in the direction of thickness of the thermal conductivity sheet 1 to achieve efficient cooling through the heat sink.

On the other hand, as comparative examples, measurement of thermal conductivity was carried out in a like manner on thermal conductivity sheets fabricated in accordance with conditions of embodiments disclosed in Japanese patent-laid open No. 54-163398 and No. 3-151658. As a result, the thermal conductivity obtained in the composition range where the sheets had sufficient elasticity was as low as 4 W/m·K. That value of thermal conductivity corresponds to the thermal conductivity sheet of this embodiment which has the above ratio of only 7%. Thus, by setting the area ratio of the highly thermally conductive insulators to be larger than 7% in this embodiment, the large thermal conductivity which was not obtainable with the prior art could be achieved while ensuring good flexibility.

Figure 5:
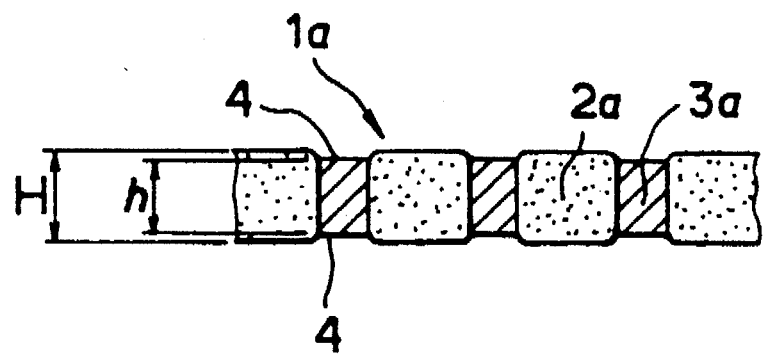
FIG. 5 is a sectional view showing a second embodiment of the thermal conductivity sheet according to the present invention.

A second embodiment of the thermal conductivity sheet according to the present invention will be described below with reference to FIG. 5. A thermal conductivity sheet 1a of the second embodiment is of basically the same structure as the thermal conductivity sheet 1 of the first embodiment except that a height h between both end faces of each of highly thermally conductive insulators 3a is set to be smaller than a thickness H of a matrix resin 2a, and recessed steps 4 having a depth of (H–h)/2 are formed between surfaces of the matrix insulator 2a and the end faces of the highly thermally conductive insulators 3a. In other words, the thermal conductivity sheet 1a manufactured such that the surfaces of the matrix insulator 2a are somewhat higher than both the end faces of the highly thermally conductive insulators 3a exposed to the surfaces of the matrix insulator 2a.

Accordingly, when the thermal conductivity sheet 1a is fitted to a rough surface of the cooled part including irregularities, the protruded surface portions of the matrix insulator 2a are allowed to freely deform following the irregularities of the part. Then, in a stage where the sheet is completely deformed, the steps 4 are disappeared so that the exposed end faces of the highly thermally conductive insulators 3a and the surfaces of the matrix insulator 2a can be satisfactorily closely contacted with the surface of the cooled part such as an electronic/electric part for effectively transmitting heat.

Figure 6:
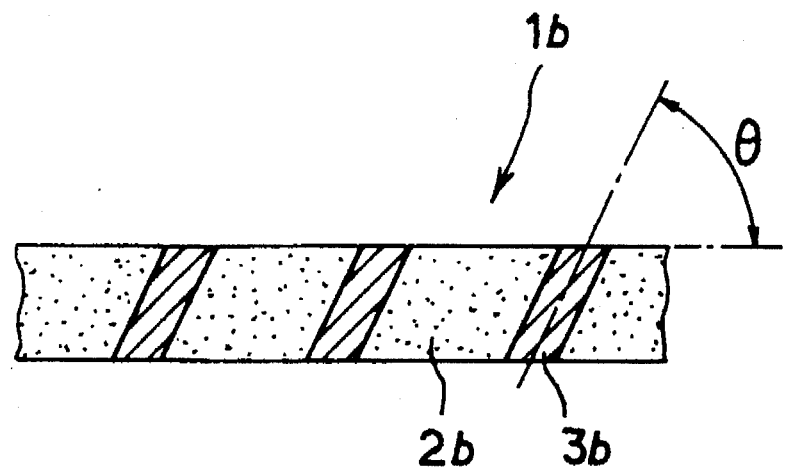
FIG. 6 is a sectional view showing a third embodiment of a thermal conductivity sheet according to the present invention.

A third embodiment of the present invention will be described below with reference to FIG. 6. FIG. 6 is a sectional view of a thermal conductivity sheet 1b of the third embodiment, the view showing an arrangement of highly thermally conductive insulators 3b combined in the thermal conductivity sheet 1b.

More specifically, the thermal conductivity sheet 1b of the third embodiment is of a structure that the columnar highly thermally conductive insulators 3b made of aluminum nitride which are the same as used in the first embodiment are arranged in the matrix insulator 2b inclined at a predetermined angle h with respect to the direction of sheet thickness. In this embodiment, too, the highly thermally conductive insulators 3b are penetrated through the sheet in the direction of sheet thickness and their both end faces are exposed to surfaces of the matrix insulator 2b.

The thermal conductivity sheet 1b of this third embodiment can be manufactured by a similar manufacture method as for the above first embodiment. However, the method for the third embodiment is different from the method for the first embodiment in that the highly thermally conductive insulators 3b are arranged somewhat obliquely with respect to the direction of sheet thickness beforehand, and then the matrix insulator 2b is filled around the highly thermally conductive insulators 3b.

Besides the above-described manufacture method, the thermal conductivity sheet in which the highly thermally conductive insulators are arranged obliquely at an optional angle can be efficiently mass-produced by forming a large-sized block-like preform in which long highly thermally conductive insulators are arrayed in a large-sized matrix resin to extend in a predetermined direction, and cutting (slicing) the block-like preform at different angles into sheets. This manufacture method will be described in more detail with reference to FIG. 7.

Figure 7:
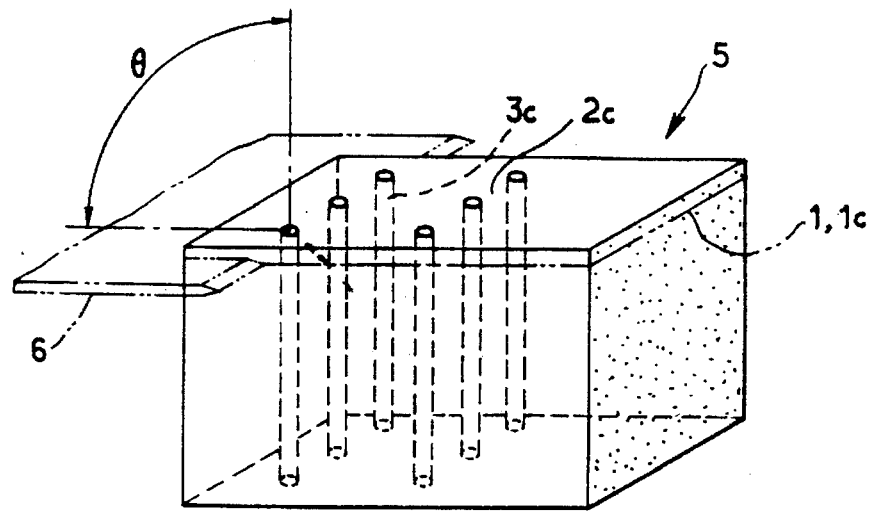
FIG. 7 is a perspective view showing one embodiment of a manufacturing method for the thermal conductivity sheet according to the present invention.

FIG. 7 is a perspective view showing a condition where a block-like preform 5 is cut by a cutting hone 6 such as a rotary cutter into thin sheets.

First, a material mixture of aluminum nitride material powder added with yttrium oxide of 3 wt % as a sintering aid was prepared and formed into columnar fillers, and the formed fillers were fired and sintered in a nitrogen atmosphere at temperature of 1800° C., thereby fabricating columnar highly thermally conductive insulators 3c each having a diameter of 0.5 mm and a length of about 100 mm). The highly thermally conductive insulators 3c were each several hundred times as long as the thickness of a thermal conductivity sheet 1c finally formed and had thermal conductivity of 200 W/m·K.

Then, to improve wettability between the matrix insulator 2c and the highly thermally conductive insulators 3c, a coating agent comprising an amide-base surfactant which contains a lipophilic group, was applied over surfaces of the highly thermally conductive insulators 3c. After that, the long columnar highly thermally conductive insulators 3c were arranged in a large number with their long axes lying in the same direction, thereby fabricating the large-sized block-like preform 5 as shown in FIG. 7.

Then, by cutting (slicing) the block-like preform 5 by using the cutting hone 6 such as a rotary cutter successively in units of thin thickness of about 0.5 mm, a plurality of thermal conductivity sheet cakes were formed in which the highly thermally conductive insulators 3c were penetrated through the matrix insulator 2c and their both ends faces are exposed to surfaces (cut planes) of the matrix insulator 2c. After masking both the ends faces of the highly thermally conductive insulators 3c exposed to surfaces of the thermal conductivity sheet cake, the thermal conductivity sheet cake was vertically placed in a mold (such that both the masked end faces of the highly thermally conductive insulators 3c were positioned to point in the direction of sheet thickness), and was pressed while being heated, thereby forming the thermal conductivity sheet 1, 1c of the respective embodiments.

By setting the cut angle θ with respect to the long axes of the highly thermally conductive insulators 3c to 90 degrees (i.e., perpendicularly to the long axes) in the above cutting operation, the thermal conductivity sheet 1 of the first embodiment in which the highly thermally conductive insulators 3 are oriented in the matrix insulator 2 so as to erect in the direction of thickness of the thermal conductivity sheet 1, as shown in FIG. 1, can be efficiently manufactured.

On the other hand, by cutting the block-like preform on condition the cut angle θ with respect to the long axes of the highly thermally conductive insulators 3c is set to an acute angle in the range of about 30 to 60 degrees, the thermal conductivity sheet 1b of the third embodiment in which the highly thermally conductive insulators 3b are oriented in the matrix insulator 2b so as to incline with respect to the direction of sheet thickness, as shown in FIG. 6, can be mass-produced.

The thermal conductivity sheet 1b of the third embodiment manufactured as described above provides the following advantages in addition to the advantages of the thermal conductivity sheet 1 of the first embodiment. Since the highly thermally conductive insulators 3b are arranged in the matrix insulator 2b so as to incline with respect to the direction of sheet thickness, the pliability and elasticity of the thermal conductivity sheet 1b in the direction of sheet thickness are increased as compared with the sheet including the highly thermally conductive insulators 3b arranged erectly like the first embodiment. As a result, the effect of releasing stress imposed from the cooled part can be developed and the close-contact of the thermal conductivity sheet 1b with respect to the cooled part can be improved.

In this respect, it was confirmed that the thermal conductivity sheet of the third embodiment, which had a thickness of 0.5 mm and contained the highly thermally conductive insulators 3b inclined with respect to the direction of sheet plane at an angle in the range of 30 to 60 degrees, could displace in the direction of sheet thickness through a distance 10 to 40% larger than the thermal conductivity sheet including the highly thermally conductive insulators 3b arranged erectly in the direction of sheet thickness, and hence had higher elasticity in the direction of sheet thickness.

Also, with the arrangement that both the end faces of the highly thermally conductive insulators 3b exposed to the surfaces of the matrix insulator 2b are positioned to lie substantially in the same planes as the surfaces of the matrix insulator 2b, as shown in FIG. 6, the contact area of the sheet with the cooled part can be increased and the thermal conductivity and elasticity in the direction of sheet thickness can be improved.

While the first to third embodiments described above employ the columnar highly thermally conductive insulators 1, 1a, 1b each of which has a central axis being substantially linear and a circular section, the highly thermally conductive insulators for use in the present invention are not limited to the above configuration, but may have a columnar shape being elliptical or polygonal, for example, in section. Also, by using the highly thermally conductive insulators of which central axes are essentially bent as described in a later embodiment, thermal conductivity sheets having more superior elasticity can be obtained.

A fourth embodiment of the present invention will be described with reference to FIGS. 8 to 10. The thermal conductivity sheet according to the fourth embodiment is a thermal conductivity sheet 1d in which a plurality of highly thermally conductive insulators 3d are dispersed in a matrix insulator 2d, the highly thermally conductive insulators 3d being oriented in the direction of thickness of the thermal conductivity sheet 1d such that the highly thermally conductive insulators 3d are penetrated through the thermal conductivity sheet 1d in the direction of thickness of thereof and their both end faces are exposed to surfaces of the matrix insulator 2d, each of the highly thermally conductive insulators 3d comprising a plurality of columnar insulator elements 7 which are adjacent to each other in the direction of thickness of the thermal conductivity sheet 1d with their central axes offset from each other, and a coupling element 8 for integrally coupling the adjacent columnar insulator elements 7 in the direction of plane of the thermal conductivity sheet 3d. Further, the thickness T of the coupling element 8 is set to be equal to or smaller than ½ of the height H of the columnar insulator elements 7.

Figure 8:
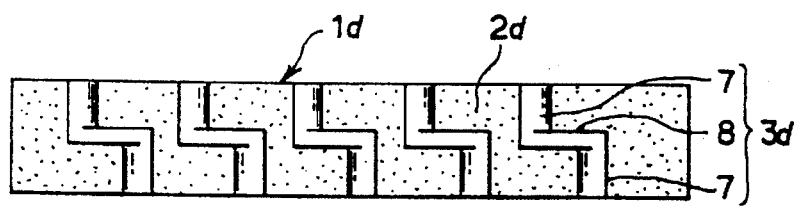
FIG. 8 is a sectional view showing a fourth embodiment of the thermal conductivity sheet according to the present invention.
Figure 9:
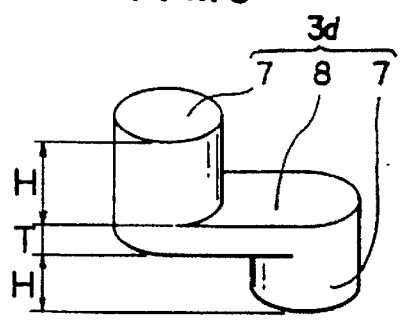
FIG. 9 is a perspective view showing the configuration of highly thermally conductive insulators for use with the fourth embodiment.
Figure 10:
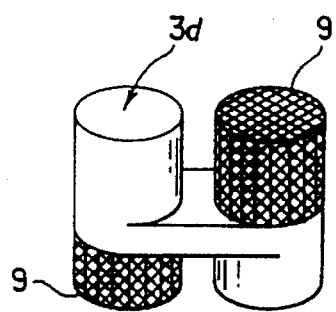
FIG. 10 is a perspective view showing a condition where matrix insulator pieces are partly bonded to the highly thermally conductive insulators shown in FIG. 9.

The highly thermally conductive insulator 3d is formed by, as shown in FIGS. 8 and 9, integrally joining the columnar insulator elements 7, 7, each of which has a diameter of 5 mm, a height of 5 mm and a cylindrical shape, to front and rear surfaces of the coupling element 8, which has a thickness of 1 mm, in the opposite end portions. The elements 7, 8 are each integrally formed of an aluminum nitride sintered body having high thermal conductivity and superior electrical insulation. The columnar insulator elements 7, 7 of the highly thermally conductive insulator 3d are substantially erected in the direction of thickness of the thermal conductivity sheet 1d and their both end faces are exposed to surfaces of the matrix insulator 2d.

Further, the highly thermally conductive insulators 3d are combined in the matrix insulator 2d while the ratio of the total sectional area of the highly thermally conductive insulators 3d to the surface area of the thermal conductivity sheet 1d is held equal to or larger than 15%, for example.

Additionally, to obtain higher thermal conductivity, the highly thermally conductive insulators 3d made of aluminum nitride are sintered with a sintering aid in advance.

The thermal conductivity sheet 1d of the fourth embodiment is manufactured by a manufacture method below. First, aluminum nitride material powder for the highly thermally conductive insulator 3d was added with yttria of 3 wt % as a sintering aid, and the mixture was formed into insulator elements in the form of a cylinder, for example, having a diameter of about 6 mm and a height of about 6 mm. An aluminum nitride green sheet being about 2 mm thick was cut into a predetermined size to prepare a coupling element preform, which was stuck at its both surfaces to respective end faces of the cylindrical insulator elements to provide a step-like preform. After that, the step-like preform was fired in a nitrogen atmosphere at 1800° C., thereby fabricating the highly thermally conductive insulator 3d with thermal conductivity of 200 W/m·K.

Then, matrix resin pieces 9 each having the same dimensions as the columnar insulator element 7 were bonded to the coupling element 8 of the highly thermally conductive insulator 3d in portions of its both surfaces opposite to the portions where the columnar insulator elements 7 had been joined. By so bonding the matrix resin pieces 9, the highly thermally conductive insulators 3d can be held in a predetermined orientation without tipping when they are arrayed on a plane at the time of forming the sheet.

Then, a coating agent comprising a surfactant, such as a coupling agent which contains a lipophilic group, was applied all over surfaces of the highly thermally conductive insulators 3d. By so applying the coating agent over the surfaces of the highly thermally conductive insulators 3d, wettability between the matrix insulator 2d and the highly thermally conductive insulators 3d is improved and the content of the highly thermally conductive insulators 3d in the entire thermal conductivity sheet 1d can be increased to ensure a predetermined high value of thermal conductivity.

Then, the highly thermally conductive insulators 3d each comprising a pair of columnar insulator elements 7, 7 horizontally interconnected by the coupling element 8 into the form of steps were arranged erectly in the direction of sheet thickness, both the end faces of the erected insulators 3d to be exposed to the surfaces of the matrix insulator 2d were covered by a masking agent, and thereafter the matrix insulator 2d was coated around the highly thermally conductive insulators 3d. After coating the matrix insulator 2d, the masking agent covering both the end faces of the highly thermally conductive insulators 3d exposed to the surfaces of the matrix insulator 2d were removed.

Then, the coated matrix insulator 2d including the highly thermally conductive insulators 3d substantially erected in the matrix insulator 2d with their both end faces exposed was placed in a mold such that both the masked end faces of the highly thermally conductive insulators 3d were positioned to lie in the opposite sheet surfaces in the direction of sheet thickness, followed by heating and pressing to thereby to manufacture the thermal conductivity sheet 1d according to the fourth embodiment.

In the thermal conductivity sheet 1d of the fourth embodiment thus obtained, as shown in FIG. 8, the step-like highly thermally conductive insulators 3d in which each pair of insulator elements 7, 7 are horizontally coupled by the coupling element 8 to each other are employed and their both the end faces are exposed to the surfaces of the matrix insulator 2d. Therefore, heat radiating paths are formed which have high thermal conductivity and are continuously extended between the front and rear surfaces of the thermal conductivity sheet 1. As with the other embodiments, accordingly, the thermal conductivity sheet 1d has superior thermal conductivity in the direction of sheet thickness, enabling the heat generated from the cooled part to be efficiently transmitted.

Further, since the thermal conductivity sheet 1d of the fourth embodiment employs the step-like highly thermally conductive insulators 3d in which each pair of columnar insulator elements 7, 7 are horizontally coupled by the coupling element 8 to each other, the highly thermally conductive insulators can be easily deformed at the coupling elements 8 to flex to some extent, when the sheet is subject to pressing force in the direction of sheet thickness. Therefore, the thermal conductivity sheet can easily release stresses and can also easily deform in conformity with any surface configurations (irregularities) of the cooled parts, thereby improving a degree of the close-contact. Particularly, by setting the thickness T of the coupling element 8 to be equal to or smaller than ½ of the height H of the columnar insulator elements 7, the thermal conductivity sheet is allowed to more easily flex at the coupling elements 8, which increases the elasticity of the thermal conductivity sheet 1d as a whole and hence provides the further improved close-contact with respect to the cooled parts.

As with the above first to third embodiments, the thermal conductivity sheet of the fourth embodiment employing the highly thermally conductive insulators 3d formed into a step-like shape could also provide thermal conductivity two or more times that of conventional thermal conductivity sheets made of only resin, by setting the ratio of the total sectional area of the highly thermally conductive insulators 3d to the surface area of the thermal conductivity sheet 1d to be equal to or larger than 15%.

More practical examples of Embodiment 4 will be described below.

Embodiment 4A

A number of highly thermally conductive insulators 3d as shown in FIG. 9 were manufactured from an aluminum nitride sintered body having thermal conductivity of 200 W/m·K. The highly thermally conductive insulators 3d each comprised a coupling element 8 being of 5 mm width×12 mm length×2 mm thickness and columnar insulator elements 7 each being of 5 mm diameter×5 mm height are fixed to front and rear surfaces of the coupling element 8 in opposite end portions. Then, columnar matrix resin pieces 9 made of silicone rubber were bonded, as shown in FIG. 10, to the highly thermally conductive insulator 3d by a silicone-base adhesive. A surfactant was applied over the surfaces of the highly thermally conductive insulators 3d thus obtained for improving wettability of the highly thermally conductive insulators 3d with respect to a matrix insulator. After that, the highly thermally conductive insulators 3d were regularly arrayed on a flat plate, and silicone rubber as a matrix insulator 2d was poured into gaps between the highly thermally conductive insulators 3d, thereby fabricating a thermal conductivity sheet 1d of Embodiment 4A as shown in FIG. 8.

Embodiment 4B

A thermal conductivity sheet of Embodiment 4B was prepared by the above-described process on the same conditions as in Embodiment 4A except that a coupling element made of tough pitch copper was employed instead of the coupling element made of an aluminum nitride sintered body in Embodiment 4A.

Embodiment 4C

A thermal conductivity sheet of Embodiment 4C was prepared by the above-described process on the same conditions as in Embodiment 4A except that a columnar member made of tough pitch copper was employed instead of the columnar insulator elements 7 made of an aluminum nitride sintered body in Embodiment 4A.

Comparative Example 4A

A thermal conductivity sheet of Comparative Example 4A was prepared by the above-described process on the same conditions as in Embodiment 4A except that the coupling element 8 had a thickness of 3 mm and the columnar insulator elements 7 had a height of 7 mm in Embodiment 4A.

For each of the thermal conductivity sheets of Embodiments 4A to 4C and Comparative Example 4A thus prepared, thermal conductivity was measured and a contact condition of the sheet fitted to a curved surface was observed. Measured results are shown in Table 1 below.

Japanese patent laid-open No. 3-151658, the thermal conductivity sheets of the embodiments can give anisotropy to the flow of heat so that a large amount of heat is allowed to flow particularly in the direction of sheet thickness.

Moreover, since the highly thermally conductive insulators $3d$ are each formed of an integral member and extended between the front and rear surfaces of the sheet, it is not required to consider the contact thermal resistance with respect to the matrix insulator $2d$. Therefore, the need of additionally contacting the fillers to each other as described in Japanese patent laid-open No. 3-20068 is eliminated.

Figure 11:
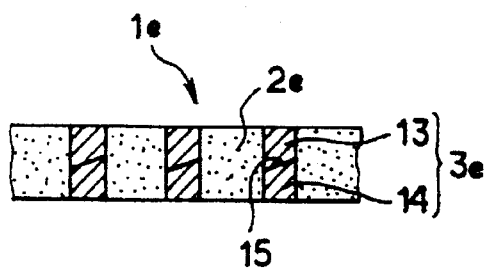
FIG. 11 is a sectional view showing a fifth embodiment of the thermal conductivity sheet according to the present invention.
Figure 12:
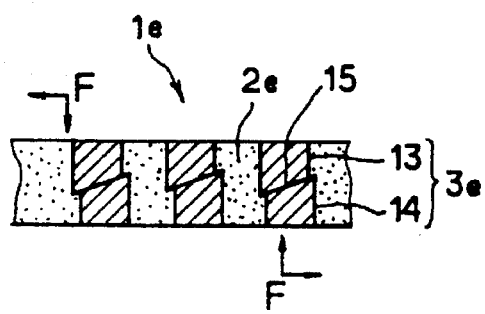
FIG. 12 is a sectional view showing a condition where the thermal conductivity sheet shown in FIG. 11 is subject to external forces.

A fifth embodiment of the present invention will be described below with reference to FIGS. 11 and 12. A thermal conductivity sheet $1e$ shown in FIG. 11 is featured in that each of the highly thermally conductive insulators distributed in a matrix insulator $2e$ comprises two insulator elements 13, 14 which are interconnected in the direction of thickness of the thermal conductivity sheet $1e$, and the insulator elements 13, 14 adjacent to each other in the axial direction are freely movable relatively at contact surfaces 15 therebetween, the contact surfaces 15 of the insulator elements 13, 14 adjacent to each other being inclined with respect to the direction of plane of the thermal conductivity sheet $1e$. Other components than mentioned above are the same as in the thermal conductivity sheet 1 of the first embodiment.

TABLE 1

| SAMPLE | RATIO OF EXPOSED AREA OF HIGHLY THERMALLY CONDUCTIVE INSULATORS TO TOTAL SURFACE AREA OF THERMAL CONDUCTIVITY SHEET (%) | THERMAL CONDUCTIVITY W/m · K | DEGREE OF CLOSE-CONTACT WITH CURVED SURFACE |
|---|---|---|---|
| EMBODIMENT 4A | 66 | 10 | ○ |
| EMBODIMENT 4B | 66 | 14 | ⊚ |
| EMBODIMENT 4C | 66 | 15 | ○ |
| COMPARATIVE EXAMPLE 4A | 66 | 10 | x |

Mark ⊚ indicates that the thermal conductivity sheet is closely contacted with the curved surface in a substantially complete condition;
Mark ○ indicates that the thermal conductivity sheet is closely contacted with the curved surface in a region equal to or larger than 95 %;
and
Mark x indicates that the thermal conductivity sheet is not closely contacted with the curved surface in a region equal to or larger than 10%.

As is apparent from the results shown in Table 1, it was found that, in Comparative Example 4A where the thickness of the coupling element exceeded ½ of the height of the columnar insulator elements, the flexibility of the thermal conductivity sheet was lowered and the close-contact with respect to the curved surface was impaired. Also, no conduction was found between both end faces of the highly thermally conductive insulators used in the sheet of each Embodiment. Further, as a result of measuring electrical resistivity of each thermal conductivity sheet, any measured value was equal to or larger than $10^{12}$ Ω-cm. It was thus confirmed that even in the case of using an electrically conductive member as part of the highly thermally conductive insulator, the thermal conductivity sheet possessed superior electrical insulation as a whole. In other words, since the thermal conductivity sheets of the embodiments have a structure capable of transmitting only heat, they can be applied with no troubles to semiconductor device parts which are apt to malfunction due to a potential difference.

Meanwhile, when a conductor such as a metal is used as a filler like thermal conductivity sheets disclosed in, e.g., Japanese patent-laid open No. 63-94504, No. 55-111014 and No. 62-240538, those sheets cannot be applied to heat generating parts such as semiconductor devices because they are easily susceptible to a short-circuit or other troubles.

Further, with no need of employing the structure that fillers are oriented in a specific direction as disclosed in With the thermal conductivity sheet $1e$ of this embodiment, similarly to the first embodiment, since the highly thermally conductive insulators $3e$ are penetrated through the thermal conductivity sheet $1e$ in the direction of sheet thickness and their both end faces are exposed to surfaces of the matrix insulator $2e$, heat radiating paths extending continuously in the direction of sheet thickness and hence superior heat radiating characteristics are obtained.

Particularly, since the insulator elements 13, 14 adjacent to each other in the axial direction have the contact surfaces 15 formed so as to make those insulator elements movable relatively, the thermal conductivity sheet $1e$ can be given with elasticity, which results in the improved close-contact. More specifically, when external forces F act on the thermal conductivity sheet $1e$ from both the horizontal direction and the direction of sheet thickness as shown in FIG. 12, the adjacent insulator elements 13, 14 are freely movable in both the horizontal direction and the direction of sheet thickness while being kept partly contacted with each other at the contact surfaces 15. Therefore, the thermal conductivity sheet $1e$ can exhibit higher elasticity than the sheet of using the highly thermally conductive insulators each of which is formed of a single piece. As a result, when the cooled part has irregularities on its surface, a satisfactory degree of the close-contact can be held and stable heat radiating characteristics can be maintained for a long term.

Figure 13:
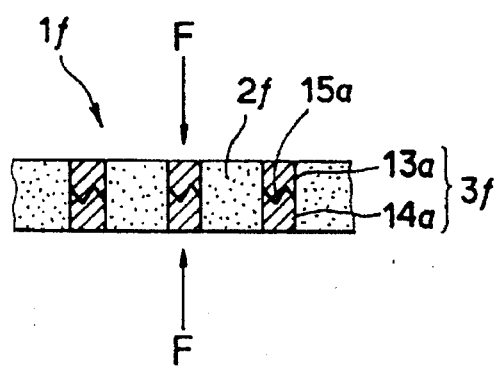
FIG. 13 is a sectional view showing a sixth embodiment of the thermal conductivity sheet according to the present invention.
Figure 14:
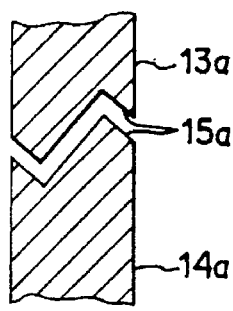
FIG. 14 is an enlarged sectional view showing one exemplified configuration of contact surfaces of the highly thermally conductive insulators shown in FIG. 13.
Figure 15:
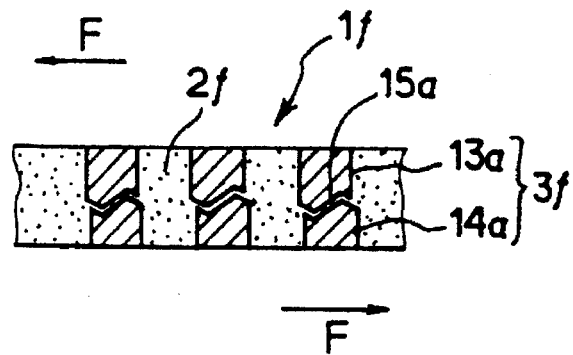
FIG. 15 is a sectional view showing a condition where the thermal conductivity sheet shown in FIG. 13 is subject to external forces.

A sixth embodiment of the present invention will be described below with reference to FIGS. 13 to 15. A thermal conductivity sheet if shown in FIG. 13 is different from the one of the fifth embodiment in that contact surfaces 15a of insulator elements 13a, 14a adjacent to each other in the axial direction are formed to be saw-toothed in section as shown in FIG. 14. Other components than mentioned above are the same as in the fifth embodiment. As shown in FIG. 14 in an enlarged scale, the contact surfaces (interface) 15a are formed such that the pair of insulator elements 13a, 14a are loosely fitted to each other at their facing end faces with some spatial margin therebetween.

As shown in FIG. 13, when external forces F act on the thermal conductivity sheet if so as to compress it in the direction of sheet thickness, the facing insulator elements 13a, 14a are held closely contacted with each other at the contact surfaces. On the other hand, as shown in FIG. 15, when external forces F act on the thermal conductivity sheet if in the direction of sheet plane, the facing insulator elements 13a, 14a are relatively shifted in the direction of sheet plane to thereby suppress generation of stresses. At this time, since the distance through which the insulator elements are moved is restricted with engagement between projections on the saw-toothed contact surfaces 15a, an excessive displacement will not take place. Also, since the insulator elements are kept partly contacted with each other at the engaging portions, a possibility that the heat radiating paths may be completely cut off is small.

On the other hand, in the thermal conductivity sheet 1e of the fifth embodiment in which the highly thermally conductive insulators 3e each include the contact surfaces 15 simply inclined as shown in FIG. 11, since the facing insulator elements 13, 14 are less engaged with each other, the displacement caused by external forces acting on the sheet may be excessively increased. With this embodiment, however, even when the insulator elements 13, 14 are displaced to a large extent, they are kept partly contacted with each other and the heat radiating paths are hardly completely cut off.

Figure 16:
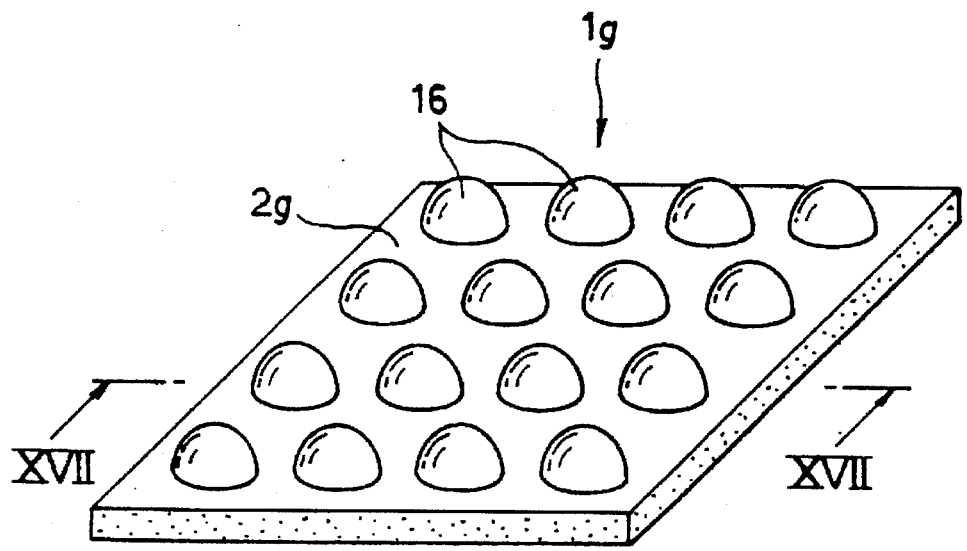
FIG. 16 is a sectional view showing a seventh embodiment of the thermal conductivity sheet according to the present invention.
Figure 17:
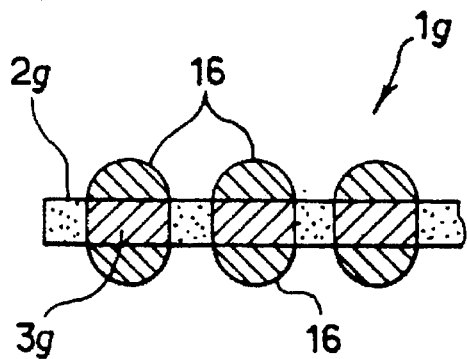
FIG. 17 is a sectional view taken along line XVII—XVII in FIG. 16.

A seventh embodiment of the present invention will be described below with reference to FIGS. 16 to 19. FIGS. 16 and 17 are respectively a perspective and sectional view showing the structure of a thermal conductivity sheet 1g according to the seventh embodiment. In the thermal conductivity sheet 1g of this embodiment, highly thermally conductive insulators 3g formed of an AlN sintered body are arranged so as to penetrate through a polyimide-made flexible sheet, as a matrix insulator 2g, in the direction of film thickness, and hemispherical bumps 16 made of a soft metal such as a Pb—Sn alloy are formed on both end faces of the highly thermally conductive insulators 3g exposed to surfaces of the matrix insulator 2g.

The hemispherical bumps 16 made of a soft metal have a function as an adhesive for firmly Joining the thermal conductivity sheet 1g to the cooled parts, and a function of increasing a degree of close-contact between both the members in the Joined portions, thereby accelerating thermal conduction. The bumps 16 for the purposes of thermal conduction and adhesion can be formed by the screen printing process or the like at the same time as when forming signal bumps conventionally used to electrically connect circuit elements on a circuit board.

Figure 18:
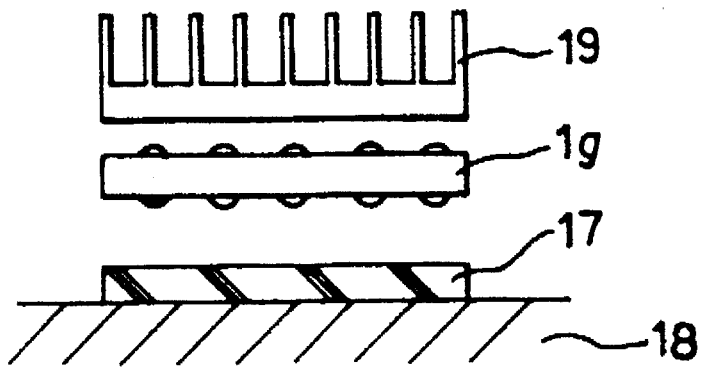
FIG. 18 is a sectional view showing a condition where a cooling fin is Joined or bonded through the thermal conductivity sheet shown in FIG. 16.
Figure 19:
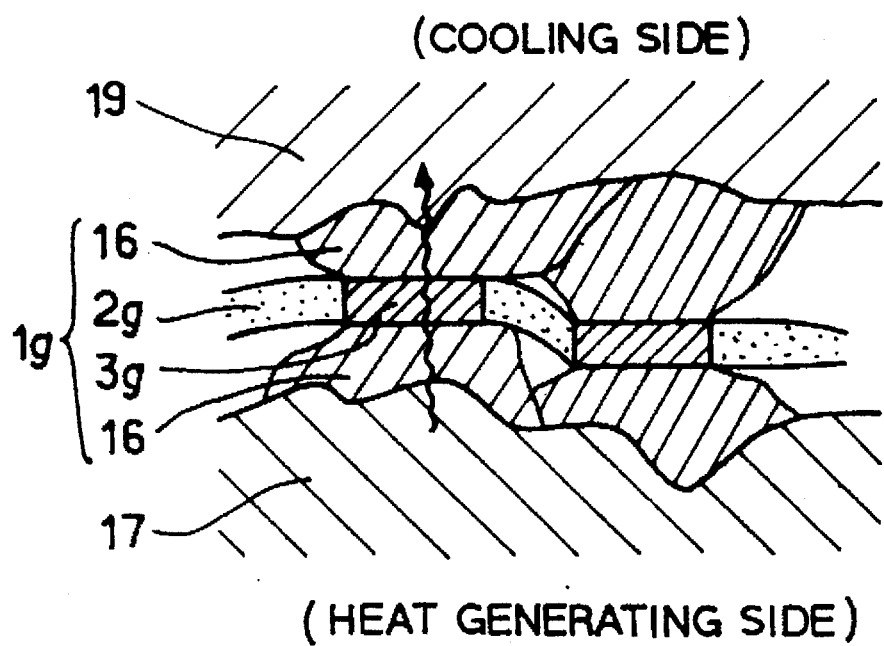
FIG. 19 is an enlarged sectional view showing a portion where a semiconductor device and the cooling fin are joined to each other through the thermal conductivity sheet shown in FIG. 16.

When the thermal conductivity sheet 1g of the above structure is, as shown in FIG. 18, sandwiched and press-fitted between a part to be cooled, such as an LSI package 18 mounting a semiconductor device 17 thereon, and a heat sink (cooling means) such as a heat radiating fin 19, the bumps 16 made of a soft metal are collapsed so as to follow irregularities on surfaces of the semiconductor device 17 and the heat radiating fin 19. As a result, a degree of close-contact between both the members is increased and the contact thermal resistance can be greatly reduced. In other words, the heat generated from the semiconductor device 17 is quickly transmitted in the direction of thickness of the thermal conductivity sheet 1g via the metal bumps 16 and the highly thermally conductive insulators 3g of the thermal conductivity sheet 1g as indicated by arrow, and is then efficiently dissipated from the heat radiating fin 19.

While the above seventh embodiment is illustrated as forming the hemispherical bumps 16, the bump shape is not limited to a hemisphere. The effect of improving a degree of the close-contact can also be similarly obtained when the bumps are formed to be disk-like, square or rectangular depending on the end shape of the highly thermally conductive insulators.

More practical examples of Embodiment 7 will be described below.

Embodiment 7A

Figure 39:
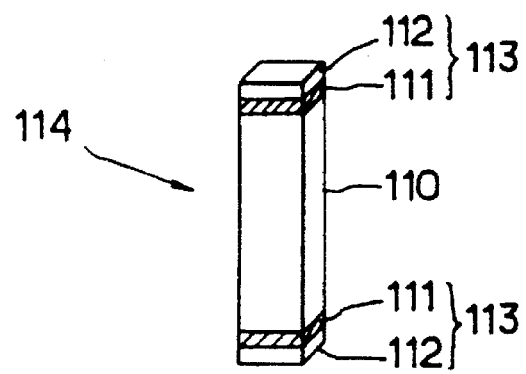
FIG. 39 is a perspective view showing the structure of highly thermally conductive insulators for use with the thermal conductivity sheet according to Embodiment 7A.

As shown in FIG. 39, Mo metallized layers 111 were formed on both end faces of an aluminum nitride sintered body 110 being in the form of a square column and having thermal conductivity of 200 W/m·K. A Sn—Pb base solder was melted and fixed to a surface of each of the Mo metallized layers 111 to thereby for solder layers 112. In this way, a highly thermally conductive insulator 114 having bumps 113, each being comprised of the Mo metallized layer 111 and the solder layer 112, formed at both the end faces of the AlN sintered body 110 was prepared. After that, a number of highly thermally conductive insulators 114 were regularly arrayed on a flat plate with gaps therebetween, and silicone rubber as a matrix insulator was poured into the gaps and then hardened, thereby fabricating a thermal conductivity sheet of Embodiment 7A.

Comparative Example 7A

On the other hand, a thermal conductivity sheet of Comparative Example 7A was prepared by the above-described process on the same conditions as in Embodiment 7A except that the bumps 113 were not formed.

Then, the thermal conductivity sheets of Embodiment 7A and Comparative Example 7A were each interposed between a heat generating body with a heater built therein and a heat radiating part, and the heater was energized. A difference $\Delta T$ between the surface temperature of the heat radiating part and the ambient temperature was measured over time. Measured results are shown in FIG. 40.

Comparative Example 7B

As another Comparative Example 7B, for the case of directly press-fitting the heat radiating part against the surface of the heat generating body without interposing the thermal conductivity sheet between both the members, time-dependent changes in the difference $\Delta T$ were also measured. Measured results are shown in FIG. 40.

Figure 40:
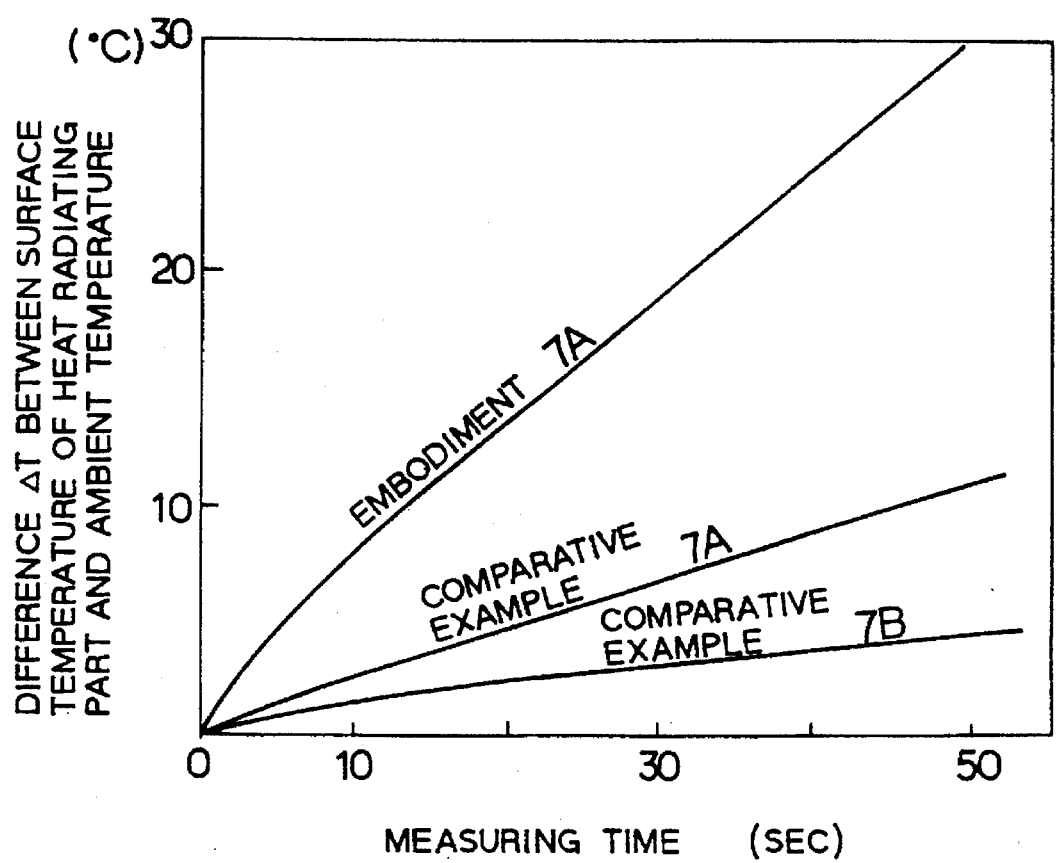
FIG. 40 is a graph showing heat radiating characteristics of a thermal conductivity sheet according to Embodiment 7A.
Figure 41:
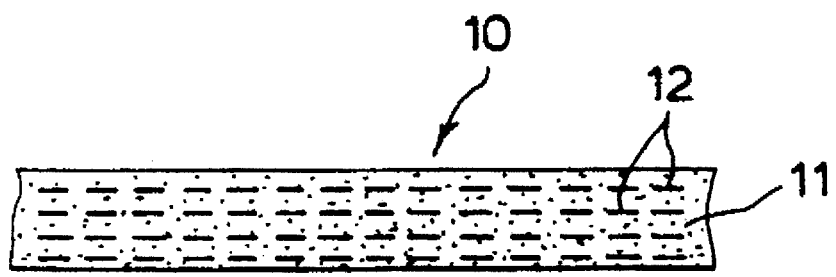
FIG. 41 is a sectional view showing an example of the structure of a prior art thermal conductivity sheet.

As is apparent from the results shown in FIG. 40, it was proved that the thermal conductivity sheet of Embodiment 7A having the bumps 113 formed thereon had much smaller contact thermal resistance than the thermal conductivity sheet of Comparative Example 7A having no bumps, and exhibited a superior cooling capability. Additionally, as a result of measuring electrical resistivity of each thermal conductivity sheet, any measured value was equal to or larger than $10^{12}$ Ω-cm. was thus confirmed that the thermal conductivity sheet possessed superior electrical insulation.

While, in any of the above-illustrated embodiments, the thermal conductivity sheets 1 to 1g are described as forming the highly thermally conductive insulators 3 to 3g of the aluminum nitride sintered body having electrical insulation, it was confirmed that similar advantages and effects could also be obtained in the case of forming the insulators of other materials, such as boron nitride and alumina ceramic, having high thermal conductivity and electrical insulation.

Embodiment 8

An embodiment of a thermal conductivity sheet wherein a particulate highly thermally conductive filler making up a composite is in the form of at least one of a polyhedron, a column, a pyramid and a hollow tube will be described below as Embodiment 8.

Figure 20:
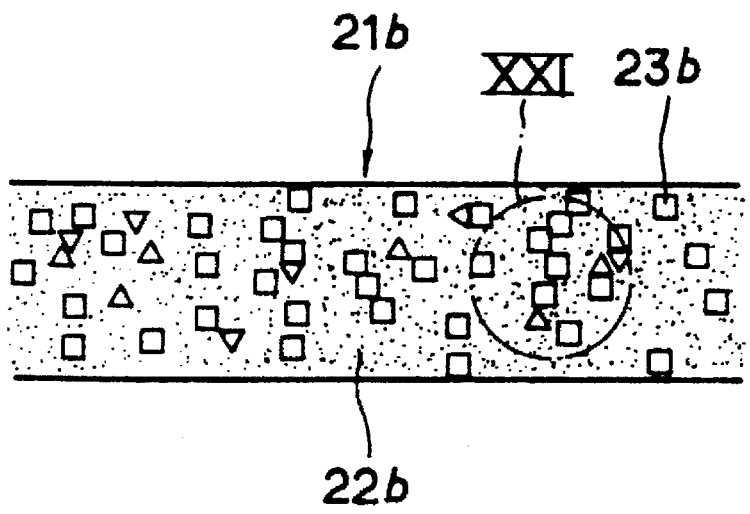
FIG. 20 is a sectional view showing another example of a structure of the matrix insulator.
Figure 21:
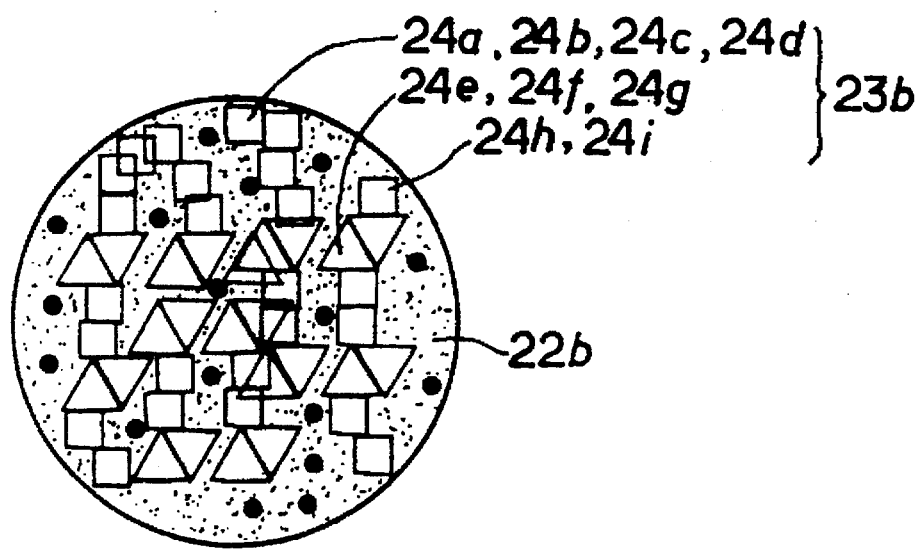
FIG. 21 is an enlarged sectional view of a portion indicated by XXI in FIG. 20.

FIG. 20 is an enlarged sectional view of a matrix insulator of a thermal conductivity sheet according to an eighth embodiment of the present invention, and FIG. 21 is an enlarged sectional view of a portion indicated by XXI in FIG. 20.

A matrix insulator 21b is formed by dispersing thermally conductive fillers 23b of various shapes in a pliable matrix resin 22b. For example, the matrix insulator 21b is manufactured by mixing the thermally conductive fillers 23b into the matrix resin 22b at a volume ratio of 10 to 80%, adding appropriate amounts of additives if necessary, and then kneading a material mixture thus prepared. A high molecular material such as a silicone resin (including rubber) can be used as the matrix resin 22b.

Figure 22I:
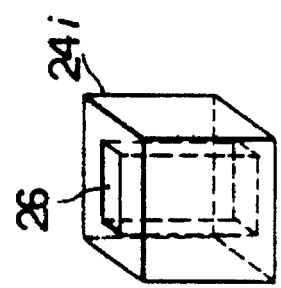
FIG. 22(A) to 22(I) are perspective views showing respective examples of configuration of thermally conductive fillers for use the thermal conductivity sheet of the present invention.
Figure 22D:
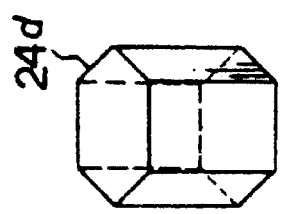
Figure 22H:
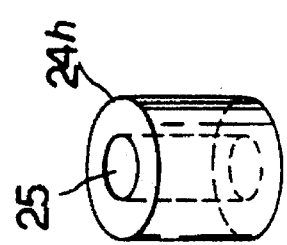
Figure 22C:
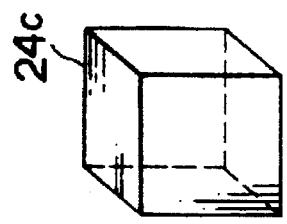
Figure 22G:
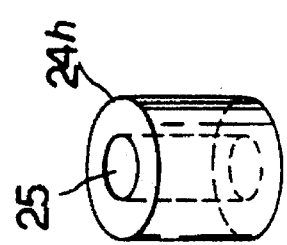
Figure 22B:
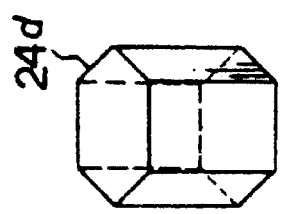
Figure 22F:
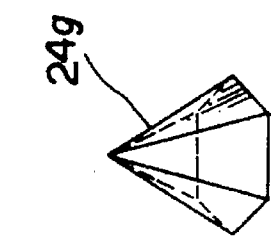
Figure 22A:
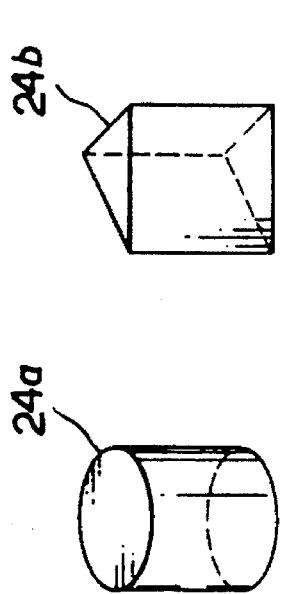
Figure 22E:
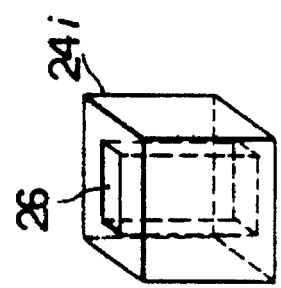

On the other hand, as the thermally conductive fillers 23b, fillers having various shapes and sizes, such as a cylindrical filler 24a as shown in FIG. 22(A), a filler 24b in the form of a triangular pillar as shown in FIG. 22(B), a filler 24c in the form of a square pillar as shown in FIG. 22(C), a filler 24d in the form of a hexagonal pillar as shown in FIG. 22(D), a filler 24e in the form of a quadrangular pyramid as shown in FIG. 22(E), a conical filler 24f as shown in FIG. 22(F), a filler 24g in the form of a hexagonal pyramid as shown in FIG. 22(G), a cylindrical filler 24h having a hollow portion 25 as shown in FIG. 22(H), and a filler 24i in the form of a square tube having a hollow portion 25 as shown in FIG. 22(I), are employed solely or as a mixture of two or more selected from among the above examples.

Particularly, by using a mixture of thermally conductive fillers in which the thermally conductive fillers 23b have irregular particle sizes and have wide distribution of the particle sizes, fine fillers are allowed to enter gaps between coarse fillers and, as a result, a density of the thermally conductive fillers 23b filled in the matrix resin 22b can be greatly increased as compared with the prior art. It is therefore possible to increase thermal conductivity of the matrix insulator 21b in the thermal conductivity sheet, and hence to increase thermal conductivity of the thermal conductivity sheet 1 as a whole.

In particular, when the cylindrical filler 24h and the square-tubular filler 24i having respectively the hollow portions 25, 26 are employed, other small fillers are allowed to enter or partly come into the hollow portions 25, 26 and this effect is advantageous in further increasing the filling density of the thermally conductive fillers 23b.

The thermally conductive fillers 23b are preferably formed of a ceramic sintered body which has thermal conductivity as high as 180 to 260 W/m·K and electrical insulation.

With the above matrix insulator 22b of the thermal conductivity sheet, because of using the thermally conductive fillers 23b in the form of a column, a polyhedron, a pyramid and a hollow tube, the thermally conductive fillers 23b are filled in the matrix resin 22b with a high density while assuming linear- and plane-contact conditions therebetween. It is therefore possible to greatly increase thermal conductivity of the thermally conductive fillers 23b as a whole.

Especially, as shown in FIG. 21, the thermally conductive fillers 23b are interconnected in linear- and plane-contact conditions successively in the direction of thickness of the thermal conductivity sheet with a higher probability, and heat conducting circuits (heat radiating circuits) having small contact thermal resistance tend to be easily formed in the direction of sheet thickness. As a result, the heat transmitted to one surface of the thermal conductivity sheet 1 passes through the matrix resin 22b having low thermal conductivity with a reduced proportion, and the matrix insulator 22b making up the thermal conductivity sheet is greatly improved in its thermal conductivity characteristics (heat radiating characteristics) as a whole.

Embodiment 9

An embodiment of the thermal conductivity sheet wherein the particulate highly thermally conductive filler making up the composite is in the columnar form will be described below as Embodiment 9.

Figure 23:
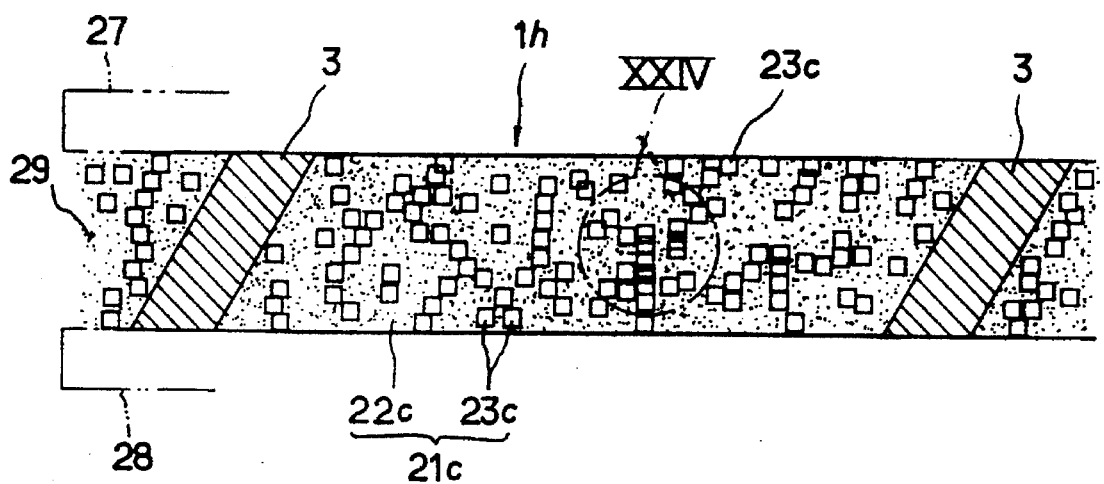
FIG. 23 is a sectional view showing a structure of the thermal conductivity sheet according to a ninth embodiment.
Figure 24:
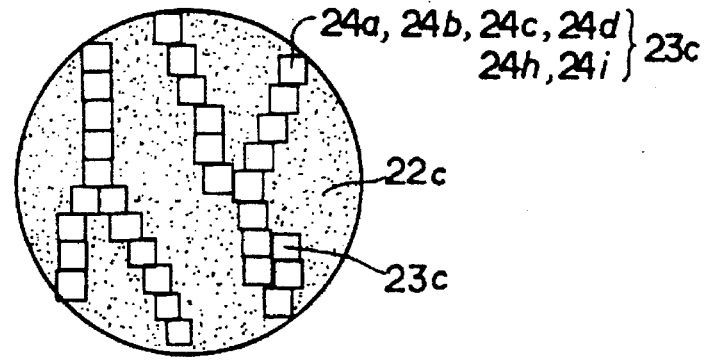
FIG. 24 is an enlarged sectional view of a portion indicated by XXIV in FIG. 23.

FIG. 23 is a sectional view of a matrix insulator 21c of a thermal conductivity sheet 1h according to Embodiment 9, and FIG. 23 is an enlarged sectional view of a portion indicated by XXIV in FIG. 23. Specifically, the matrix insulator 21c of the thermal conductivity sheet 1h according to Embodiment 9 is formed by dispersing thermally conductive fillers 23c in the form of a rectangular parallelepiped or a cylinder into silicone rubber as a matrix resin 22c.

The matrix insulator 21c of the thermal conductivity sheet 1h was manufactured as follows. First, AlN material powder was added with yttrium oxide of 3 wt % as a sintering aid to prepare a matrix mixture, and the mixture was formed into an elongate molded body by extrusion molding. The elongate molded body was cut into a predetermined size by a cutter. The molded body thus obtained was fired in a nitrogen atmosphere at 1800° C., thereby fabricating a sintered body (thermally conductive filler 23c) with thermal conductivity of about 200 W/m·K.

Then, a coating agent, such as a surfactant which contains a highly lipophilic group (e.g., amide-base surfactant), was applied over surfaces of the thermally conductive fillers 23c. By so applying the coating agent over the surfaces of the thermally conductive fillers 23c, wettability between the matrix insulator 22c and the thermally conductive fillers 23c is improved and the density of the thermally conductive fillers 23c filled in the matrix insulator 21c of the thermal conductivity sheet 1h can be increased to provide a predetermined high value of thermal conductivity.

Then, the thermally conductive insulators 3d covered with the coating agent was mixed and dispersed in the matrix resin 22c to prepare a composite. On the other hand, the highly thermally conductive insulators 3 were arranged with any desired intervals therebetween obliquely with respect to the direction of thickness of the sheet 1h, and both surfaces of the sheet were masked by glass base plates 27, 28 to form a cell 29. Thereafter, the above composite was filled into voids in the cell 29 while the cell had been evacuated. After heating and hardening the cell 29, the base plates were removed and the cell 29 was taken out, thereby manufacturing the thermal conductivity sheet 1h according to Embodiment 9.

In the thermal conductivity sheet 1h of Embodiment 9 thus manufactured, the columnar highly thermally conductive insulators 3 are arranged in the matrix insulator 21c obliquely with respect to the direction of thickness of the sheet 1b, and their both the end faces are exposed to the surfaces of the matrix insulator 21c, and the matrix insulator 21c is formed of the composite comprising the matrix resin 22c and the thermally conductive fillers 23c. Therefore, heat acting on the sheet is very effectively transmitted in the direction of sheet thickness, and the thermal conductivity sheet 1h has increased elasticity in the direction of sheet thickness.

By sandwiching the thermal conductivity sheet according to each of Embodiments 8 to 9 between an electronic/electric part such as an LSI package and a heat sink (cooling means) such as a heat radiating fin, the heat generated from the electronic/electric part can be effectively transmitted in the direction of thickness of the thermal conductivity sheet to achieve efficient cooling through the heat sink.

Embodiment 10

An embodiment wherein the matrix insulator is formed of a laminate comprising a metal assembly having flexibility and a high molecular insulating layer will be described below as Embodiment 10.

Figure 25:
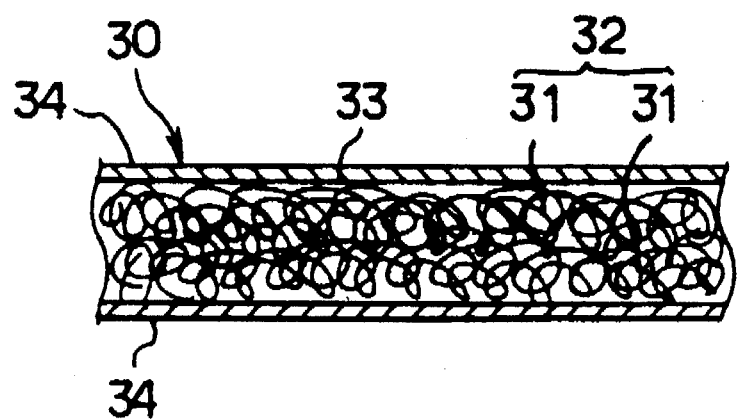
FIG. 25 is a sectional view showing the structure of a matrix insulator of a thermal conductivity sheet according to a tenth embodiment.
Figure 26:
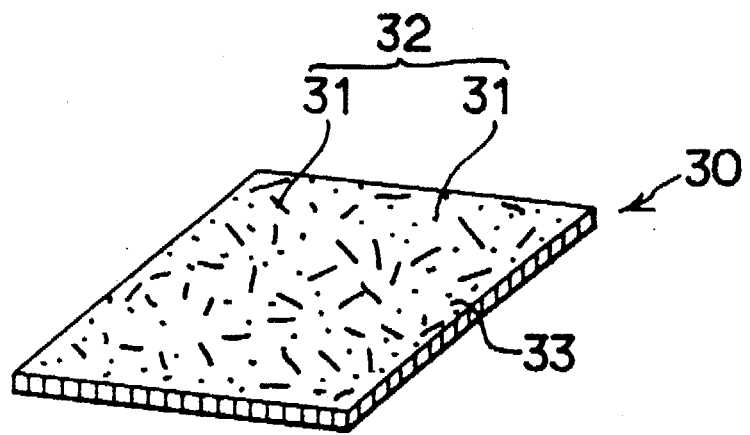
FIG. 26 is an perspective view of the matrix insulator shown in FIG. 25.

A matrix insulator 30 of a thermal conductivity sheet according to Embodiment 10 was manufactured by, as shown in FIGS. 25 and 26, filling an assembly 32 of highly thermally conductive fillers 31 having electrical conductivity, such as metal thin wires, metal fibers and metal foils, in a matrix resin 33 to form a sheet, and forming a high molecular insulating layer 34 in a thickness of 2 μm on each surface of the matrix resin 33.

More specifically, aluminum thin wires having a diameter of about 10 μm and a length of about 3 mm were treated by an amide-based surfactant to change surface properties of the wires, and were then mixed and dispersed in the matrix resin 33 made of polyolefinic elastomer to prepare a composite. Then, as with Embodiment 9, the composite was filled into cell voids under reduced pressure to form a sheet. After that, the high molecular insulating layer 34 was formed on each of sheet surfaces.

To make at least part of the assembly 32 of the thermally conductive fillers 31 exposed to surfaces of the matrix resin 33, it is preferable to adjust the amount of the matrix resin 33 added, grind the sheet surfaces slightly, or etch the sheet so that the thermally conductive fillers 31 are exposed to the sheet surfaces.

In the thermal conductivity sheet of Embodiment 10 using the matrix insulator 30 thus obtained, the thermally conductive fillers 31 are interconnected while tangling with each other, and a part of the assembly 32 is exposed to front and rear surfaces of the matrix resin 33. Therefore, although the thin high molecular insulating layers 34 having low thermal conductivity are formed on the surfaces of the matrix resin 33, heat radiating circuits are formed so as to extend continuously between the front and rear surfaces of the matrix insulator 30 in the direction of sheet thickness. As a result, heat acting on the thermal conductivity sheet is effectively transmitted in the direction of sheet thickness.

In spite of the presence of the high molecular insulating layers 34, the matrix insulator 30 had higher thermal conductivity than a matrix insulator made of only the matrix resin when a ratio of the total exposed sectional area of the assembly 32 to the total surface area of the matrix insulator 30 was equal to or larger than 1%. Particularly, by setting the above area ratio to be equal to or larger than 15%, the matrix insulator having high thermal conductivity and flexibility two or more times those of conventional general thermal conductivity sheets was obtained. It was however found that if the filling ratio of the thermally conductive fillers 31 exceeded 80 vol %, the pliability of the matrix insulator was lowered, the close-contact with respect to the cooled parts was impaired, and hence the matrix insulator had a difficulty in practical use. It was also confirmed that the thermal conductivity and the close-contact were both satisfied when the filling ratio was in the range of 15 to 70 vol %.

It is needless to say that a thermal conductivity sheet having ever higher thermal conductivity can be obtained by providing a ceramic thin film having electrical insulation instead of the high molecular insulating layer 34.

As a result of sandwiching the thermal conductivity sheet of this embodiment between an electronic/electric part such as an LSI package and a heat sink (cooling means) such as a heat radiating fin, the heat generated from the electronic/electric part could be effectively transmitted in the direction of thickness of the thermal conductivity sheet to achieve efficient cooling through the heat sink. Also, the thermal conductivity sheet constructed as described above was superior in elasticity, had a structure capable of absorbing irregularities or slants on contact surfaces of the cooled parts to which the sheet is fitted, and was free from a contact failure with respect to the cooled parts, enabling the cooled parts to be uniformly cooled.

Embodiment 11

Figure 27:
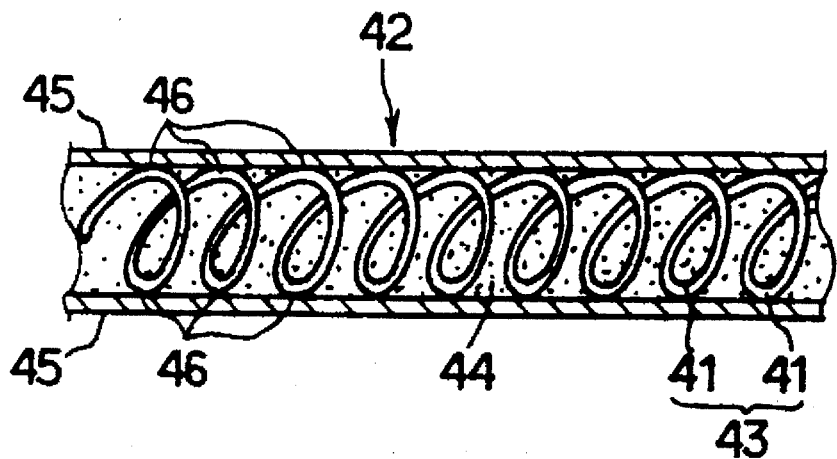
FIG. 27 is a sectional view showing the structure of a matrix insulator of a thermal conductivity sheet according to an eleventh embodiment.

An embodiment wherein a matrix insulator 42 is formed by burying an assembly 40 formed of a coiled metal thin wire, as a thermally conductive filler 41, in a matrix resin 44 will be described below with reference to FIG. 27.

A matrix insulator 42 for use in a thermal conductivity sheet according to Embodiment 11 is formed by using a copper thin wire with a diameter of 200 μmΦ as the thermally conductive filler 41, deforming the thermally conductive filler 41 into a coil to prepare the assembly 40, filling a matrix resin 44 into voids in each assembly 43 to form a sheet in which top and bottom portions of the assembly 43 are exposed to surfaces of the matrix resin 44, and coating ceramic insulating layers 45 on the surfaces of the matrix resin 44.

Therefore, exposed portions 46 of the assembly 43 in the form of a coil serve to define heat radiating paths which are penetrated through the thermally conductive sheet in the direction of sheet thickness except the ceramic insulating layers 45, and the heat radiating paths have a shorter length than in the sheet of Embodiment 10, thereby reducing thermal resistance. Further, since the assembly 43 in the form of a coil has superior elasticity in the directions of thickness and plane of the thermal conductivity sheet, the sheet can freely deform in conformity with surface configurations of the cooled parts to which it is fitted, resulting in the improved close-contact.

Embodiment 12

Figure 28:
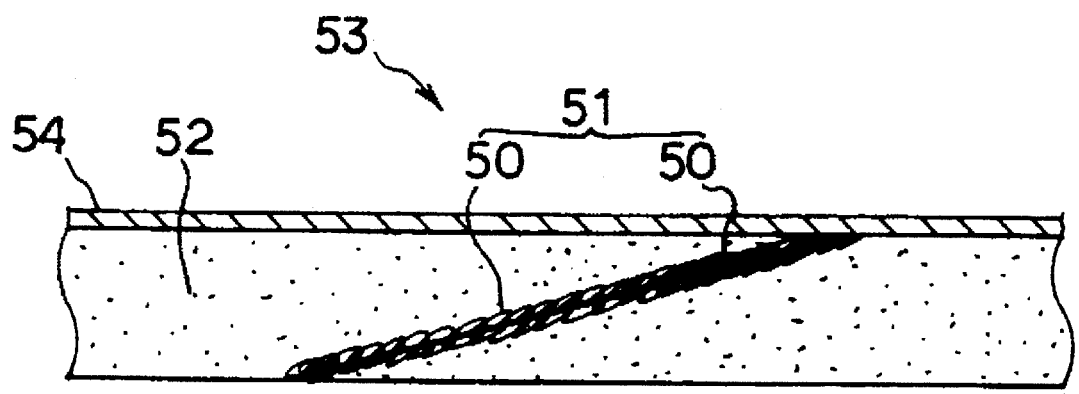
FIG. 28 is a sectional view showing the structure of a matrix insulator of a thermal conductivity sheet according to a twelfth embodiment.

An embodiment wherein a matrix insulator 53 formed by bundling metal thin wires together to prepare an assembly 51 as a thermally conductive filler 50 and burying the assembly 51 in a matrix resin 52 will be described below with reference to FIG. 28.

A matrix insulator 53 according to Embodiment 12 is formed by burying the assembly 51 comprising metal thin wires bundled together, as the thermally conductive filler 50, in the silicone resin 52 at a volume ratio of 70%. Then, by the same manufacture process as in Embodiment 9, the thermal conductivity sheet of this Embodiment 12 is fabricated by arranging a plurality of thermally conductive fillers in such a manner as to penetrate through the matrix insulator 53 in the direction of thickness thereof. Those portions where the assembly 51 in the form of metal thin wires bundled together is filled in the silicone resin 52 and exposed to resin surfaces exhibit electrical conductivity if left as they are. To give the thermal conductivity sheet electrical insulation, therefore, a ceramic insulating layer 54 having high thermal conductivity is coated over at least one surface of the matrix insulator 53.

When the thermal conductivity sheet of the above structure is closely contacted with an electronic/electric part such as an LSI package and a heat sink (cooling means) such as a heat radiating fin, heat can be effectively transmitted via the assembly 51 exposed to the surface of the matrix resin 52 on which the ceramic insulating layer 54 is not formed, thereby increasing the effect of radiating heat.

Embodiment 13

An embodiment of a thermal conductivity sheet 63 wherein a highly thermally conductive insulator 60 is formed of a laminate of an electrically conductive base 61 and an insulating layer 62 will be described below with reference to FIG. 29.

The thermal conductivity sheet 63 of this embodiment is formed by interconnecting a plurality of highly thermally conductive insulators 60 through matrix insulators 64. Each of the highly thermally conductive insulators 60 is formed by laminating the insulating layer 62 on an upper end face of the electrically conductive base 61.

With the presence of the insulating layer 62, the highly thermally conductive insulator 60 exhibits electrical insulation as a whole.

The matrix insulator is made of, for example, at least one selected from among thermoplastic resins such as polyethylene, polypropylene, polystyrene, poly-p-xylene, polyvinyl acetate, polyacrylate, polymethyl methacrylate, polyvinyl chloride, polyvinylidene chloride, fluorine-base plastic, polyvinyl ether, polyvinyl ketone, polyether, polycarbonate, thermoplastic polyester, polyamide, diene-base plastic, polyurethane-base plastic, silicone and inorganic plastic, and thermosetting resins such as a phenol resin, furan resin, xylene/formaldehyde resin, ketone/formaldehyde resin, urea resin, melamine resin, aniline resin, alkyd resin, unsaturated polyester resin and epoxy resin.

On the other hand, materials of the electrically conductive base 61 are not especially limited so long as they have high thermal conductivity, and any of general metals can be used. Thus, the electrically conductive base 61 is made of a material which is selected from among, for example, Ag, Cu, Au, Al, Be, W, Si, Mg, Ir, Mo, Zn, Ca, brass, K, Na, Cd, Ni, In, Fe, Rh, Ph, Pt, Pd, Sn, Li, Re, Cr, Co, Ta, bronze, Nb, Tl, Pt-Rh, Pb, solder, V, U, Sb, etc., and an alloy containing twos or more of those elements, and which has thermal conductivity equal to or larger than 25 W/m·K.

Figure 29:
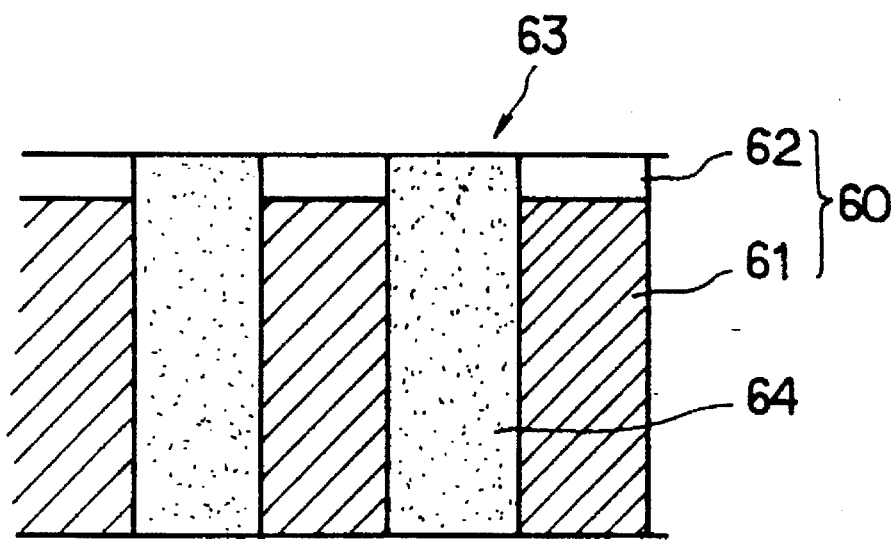
FIG. 29 is a sectional view showing the structure of a thermal conductivity sheet according to a thirteenth embodiment.

The thermal conductivity sheet 63 shown in FIG. 29 was formed by interconnecting the plurality of highly thermally conductive insulators 60 through the matrix insulators 64, the highly thermally conductive insulators 60 being each formed of a laminate comprising the electrically conductive base 61 and the insulating layer 62. The highly thermally conductive insulators 60 were arranged erectly in the direction of thickness of the thermal conductivity sheet 63 such that they were penetrated through the thermal conductivity sheet 63 in the direction of sheet thickness and their both end faces were exposed to surfaces of the thermal conductivity sheet 63. As the electrically conductive base 61, pure copper having thermal conductivity as high as 25 W/m·K and being in the form of a rectangular parallelepiped (width; 1.2 mm, length; 62 mm, thickness; 0.5 mm) was used. A uniform insulating layer 62 being 2 µm thick and made of silicon nitride was formed on an upper end face of the pure copper base so that the electrically conductive base had electrical insulation, thereby fabricating the highly thermally conductive insulator 60. Then, the plurality of highly thermally conductive insulators 60 were arranged with the insulating layers made of silicon nitride positioned top, and were interconnected by a silicone resin with equal intervals, thereby obtaining the thermal conductivity sheet 63 of Embodiment 13. A ratio of the sectional area of the highly thermally conductive insulators 60 to the total surface area of the thermal conductivity sheet 63 was about 60%. As a result of measuring thermal conductivity of the thermal conductivity sheet of this embodiment, the measured value was 40 W/m·K. Here, the insulating layers 62 made of silicon nitride served not only to provide electrical insulation, but also to greatly increase wear resistance of the thermal conductivity sheet 63.

Embodiment 14

Figure 30:
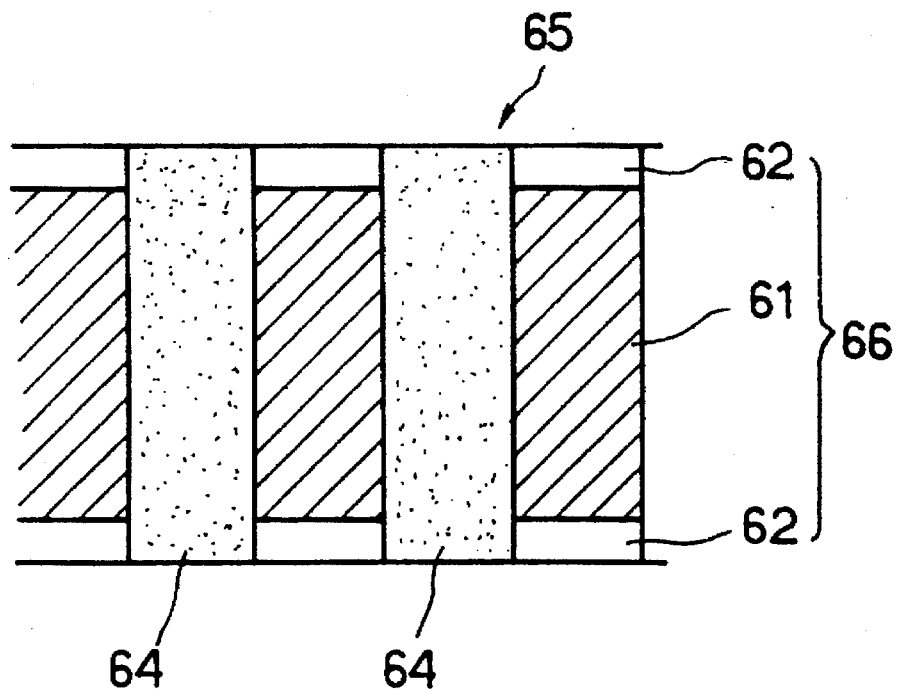
FIG. 30 is a sectional view showing the structure of a thermal conductivity sheet according to a fourteenth embodiment.

FIG. 30 is a sectional view showing the structure of a thermal conductivity sheet 65 according to Embodiment 14. The thermal conductivity sheet 65 shown in FIG. 30 is featured in that the insulating layer 62 is also formed on a lower end face of the electrically conductive base 61 of the thermal conductivity sheet 63 shown in FIG. 29. Other components are all the same as those in Embodiment 14. In other words, this embodiment employs highly thermally conductive insulators 66 each of which has the insulating layers 62 formed on both end faces of the electrically conductive base 61.

The thermal conductivity sheet 65 of the above structure is suitable for use applications which particularly require electrical insulation, because the insulating layers 62, 62 are formed on both sides of the sheet. As a result of measuring thermal conductivity of the thermal conductivity sheet 65 of this embodiment, the measured value was 38 W/m·K, i.e., a little lower than that of the thermal conductivity sheet 63 of Embodiment 13.

Embodiment 15

Figure 31:
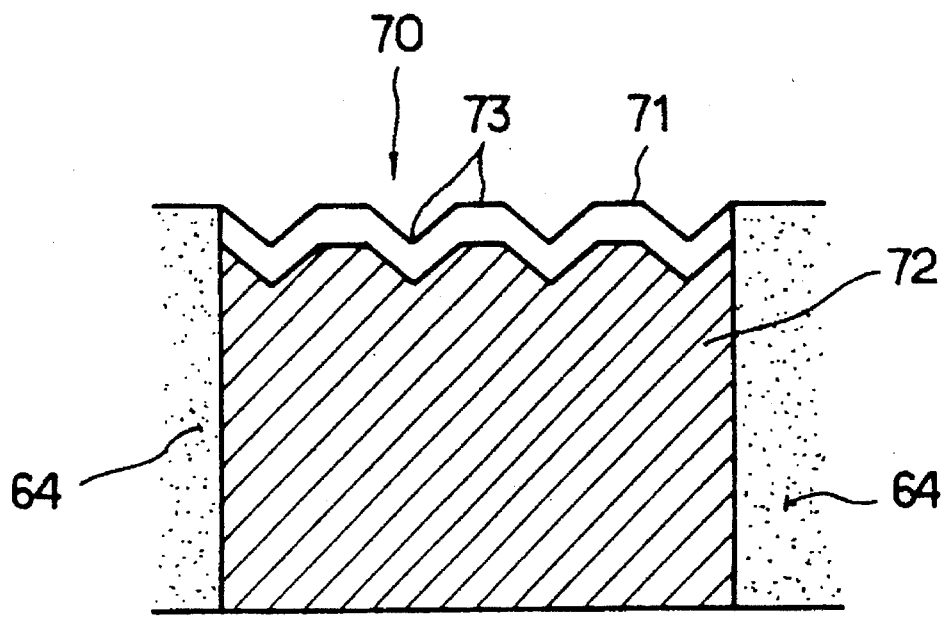
FIG. 31 is a sectional view showing the structure of a thermal conductivity sheet according to a fifteenth embodiment.

FIG. 31 is a sectional view showing the structure of a thermal conductivity sheet 70 according to Embodiment 15. In the thermal conductivity sheet 70 of this embodiment, irregularities or undulations 73 are formed in upper end faces of an insulating layer 71 and an electrically conductive base 72 made of pure copper, in addition to the structure of the thermal conductivity sheet 63 shown in FIG. 29. Other components are all the same as those of the thermal conductivity sheet 63 shown in FIG. 29.

If the highly thermally conductive insulator is made of a ceramic such as aluminum nitride rather than being of formed of the soft electrically conductive base 72 made of pure copper, the manufactured sheet may be sometimes not practical since the highly thermally conductive insulator is brittle and has poor machinability in itself. However, the soft electrically conductive base 72 made of pure copper in this embodiment has good machinability and can be easily machined to a predetermined configuration. After the machining, the insulating layer 71 made of a ceramic such as silicon nitride can be formed on the surface of the electrically conductive base 72. Accordingly, the undulations 73 can be formed in this manner.

With the thermal conductivity sheet 70 of this embodiment, since the undulations 73 are formed in the surfaces of the insulating layer 71 and the electrically conductive base 72, the sheet can more intimately fit to the surface of an electronic/electric part having irregularities, thereby providing good close-contact. As a result of measuring thermal conductivity, a sufficiently large value of 33 W/m·K was obtained. It was also found that there had been initially a fear of damaging the insulating layer 71 by the presence of the ruggednesses or undulations 73 in the sheet surface, but the sheet was sufficiently practicable.

Embodiment 16A

Figure 32:
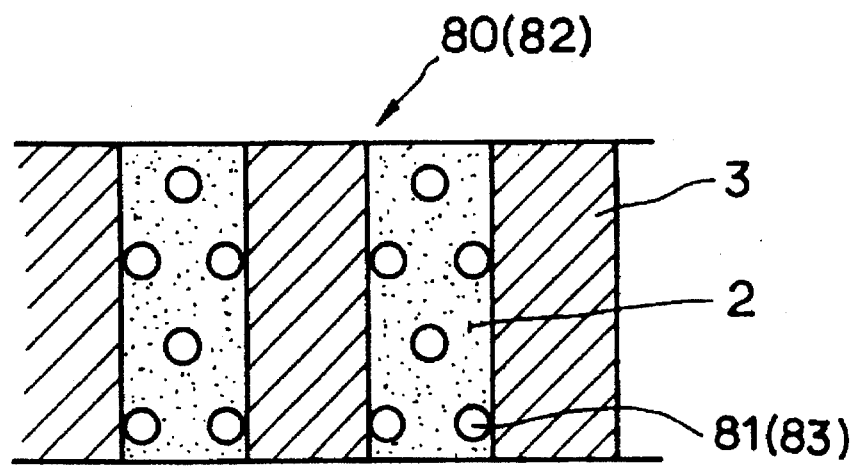
FIG. 32 is a sectional view showing the structure of a thermal conductivity sheet according to a sixteenth embodiment.

A thermal conductivity sheet wherein the matrix insulator is formed of a composite consisted of a high molecular material and a highly thermally conductive filler will be described below with reference to FIG. 32. FIG. 32 is a sectional view showing the structure of a thermal conductivity sheet 80 according to Embodiment 16A. The thermal conductivity sheet 80 is featured in that particulate highly thermally conductive fillers 81 are dispersed in the matrix insulator 2 in addition to the structure of the thermal conductivity sheet 1 shown in FIG. 1. In other words, the plurality of highly thermally conductive insulators 3 are interconnected by the matrix insulator 2 in which the highly thermally conductive fillers 81 are dispersed.

The matrix insulator 2 can be made of any material selected from various resins cited above in Embodiment 13. The highly thermally conductive filler 81 is made of, for example, a nitride such as aluminum nitride, boron nitride and silicon nitride, diamond, carbon having the diamond structure, or an oxide such as alumina. The shape of the highly thermally conductive filler 81 is not particularly limited, and may be in the form of powder, fibers, etc. Usually, the filler 81 in the form of powder and fibers is used.

The columnar highly thermally conductive insulator 3 is made of a nitride such as aluminum nitride, boron nitride and silicon nitride, diamond, carbon having the diamond structure, or an oxide such as alumina. The laminate comprising the electrically conductive base of a metal or the like with the insulating layer formed on at least one end face of the base, as illustrated in Embodiment 13, may be used as the highly thermally conductive insulator 3.

The thermal conductivity sheet 80 of Embodiment 16A was manufactured as follows. AlN fine powder having two peaks at the average particle size of 6 μm and 28 μm in particle size distribution was added with a solution of bis(dioctyl pyrophosphate)oxy-acetate titanate at a ratio of 6 wt % with respect to the AlN fine powder. The mixture was sufficiently stirred and dispersed to change surface properties, thereby forming a slurry. The slurry was passed through a pipe heated up to 300° C. to dry the slurry for removing the solvent. The AlN powder having the changed surface properties was recovered in a collector pipe at 120° C. Then, the recovered AlN powder was filled at a ratio of 50 wt % and sufficiently dispersed in silicone rubber having low viscosity to prepare a composite consisted of the AlN powder as the thermally conductive filler 81 and silicone rubber as the matrix insulator 2.

On the other hand, cylindrical aluminum nitride sintered bodies each having a diameter of 0.5 mm and a height of 0.5 mm were arranged as the highly thermally conductive insulators 3 erectly on one glass base plate, and the other glass base plate was placed over upper end faces of the sintered bodies to form a cell between the glass base plates. Thereafter, the above composite was filled into the cell while the cell had been evacuated, followed by heating and hardening to manufacture the thermal conductivity sheet 80. A ratio of the sectional area of the highly thermally conductive insulators 3 to the total surface area of the thermal conductivity sheet 80 was 60%, and the thickness of the thermal conductivity sheet 80 was 0.5 mm. It was confirmed that the thermal conductivity sheet 80 had thermal conductivity of 34 W/m·K and hence had the superior effect of radiating heat.

As a reference example, characteristics of the thermal conductivity sheet using the highly thermally conductive insulators 60 shown in FIG. 29 instead of the highly thermally conductive insulators 3 shown in FIG. 32 will be described below. The highly thermally conductive insulators 60 were each formed of a laminate comprising the electrically conductive base 61 made of pure copper and the insulating layer 62 formed on the upper end face of the electrically conductive base 61. As the electrically conductive base 61, pure copper having thermal conductivity as high as 400 W/m·K and being in the form of a rectangular parallelepiped (width; 1.2 mm, length; 62 mm, thickness; 0.5 mm) was used. The uniform insulating layer 62 being 2 μm thick and made of silicon nitride was formed on the upper end face of the pure copper base so that the electrically conductive base had electrical insulation, thereby fabricating the highly thermally conductive insulator 60 in plural number.

Then, the plurality of highly thermally conductive insulators 60 were arranged with the insulating layers 62 positioned top, and thereafter the composite was poured, heated and hardened in the same manner as in Embodiment 16, thereby obtaining the thermal conductivity sheet. The ratio of the sectional area of the highly thermally conductive insulators 60 to the total surface area of the thermal conductivity sheet was about 60%. As a result of measuring thermal conductivity of the thermal conductivity sheet, the measured value was 41 W/m·K. Here, it was found that the insulating layers 62 made of silicon nitride was effective not only to give the electrically conductive base 61 electrical insulation, but also to increase wear resistance of the thermal conductivity sheet.

The highly thermally conductive fillers 81 for use in the composite are not limited to insulating particles mentioned above, but may be formed by coating surfaces of metal particles with insulating layers to provide electrical insulation.

Embodiment 16B

Another thermal conductivity sheet 82 wherein the matrix insulator is formed of a composite consisted of a high molecular material and a highly thermally conductive filler will be described below with reference to FIG. 32. The thermal conductivity sheet 82 of this embodiment is featured in that fibrous highly thermally conductive fillers 83 are dispersed in the matrix insulator 2 in addition to the structure of the thermal conductivity sheet 1 shown in FIG. 1. In other words, the plurality of columnar highly thermally conductive insulators 3 are interconnected by the matrix insulator 2 in which the highly thermally conductive fillers 83 are dispersed. Also, the highly thermally conductive insulators 3 are exposed to surfaces of the thermal conductivity sheet 82.

The thermal conductivity sheet 82 of Embodiment 16B was manufactured as follows. AlN short fibers having an average diameter of 2 μm and a length of 2 to 4 mm was added with a solution of diisopropyl-bis(dioctyl pyrophosphate) titanate at a ratio of 4 wt % with respect to the AlN short fibers. The mixture was sufficiently stirred and dispersed to change surface properties, thereby forming a slurry. The slurry was passed through a pipe heated up to 180° C. to dry the slurry for removing the solvent. The AlN fibers having the changed surface properties were recovered in a collector pipe at 120° C. Then, the recovered AlN fibers was filled at a ratio of 50 wt % and sufficiently dispersed in silicone rubber having low viscosity to prepare a composite consisted of the AlN fibers as the thermally conductive filler 83 and silicone rubber as the matrix insulator 2.

On the other hand, AlN sintered bodies each having a length and a width of 1.2 mm and a thickness of 0.5 mm were arranged as the columnar highly thermally conductive insulators 3 erectly on one glass base plate with equal intervals, and the other glass base plate was placed over upper end faces of the AlN sintered bodies to form a cell between the glass base plates. Thereafter, the above composite was filled into the cell while the cell had been evacuated, followed by heating and hardening to manufacture the thermal conductivity sheet 82. A ratio of the sectional area of the highly thermally conductive insulators 3 to the total surface area of the thermal conductivity sheet 82 was 40%, and the thickness of the thermal conductivity sheet 82 was 0.5 mm. It was confirmed that the thermal conductivity sheet 82 had thermal conductivity of 44.3 W/m·K and hence had the superior effect of radiating and dissipating heat.

With the thermal conductivity sheet 82 described above, high thermal conductivity is expected not only in the direction of thickness of the highly thermally conductive insulators 3, but also in the coupling portions which are formed of the composite and had flexibility. Also, since fibrous AlN is used, a part of the fibers is thoroughly extended between front and rear surfaces of the sheet to form larger heat radiating paths. Consequently, heat can be more effectively transmitted.

Embodiment 17

A thermal conductivity sheet using highly thermally conductive insulators which are formed to have sectional areas changed in the axial direction thereof will be described below with reference to FIG. 33 to 34.

Any of the thermal conductivity sheets of Embodiments 1, 2, 3, 5, 6, 7, 13, 15 and 16 employs the highly thermally conductive insulators of which sectional areas are constant in the axial direction thereof. In such a structure, as the thickness of the thermal conductivity sheet is reduced, the contact area between each of the highly thermally conductive insulators and the matrix insulator is also reduced and an adhesion therebetween is lowered. Therefore, when the thermal conductivity sheet is entirely subject to shearing external forces or twisting external forces, the highly thermally conductive insulators may slip off from the matrix insulator, making it difficult to keep high thermal conductivity. Particularly, when the thermal conductivity sheet is fitted to a curved surface, the highly thermally conductive insulators become more apt to slip off upon the sheet being deformed to a large extent.

Figure 33:
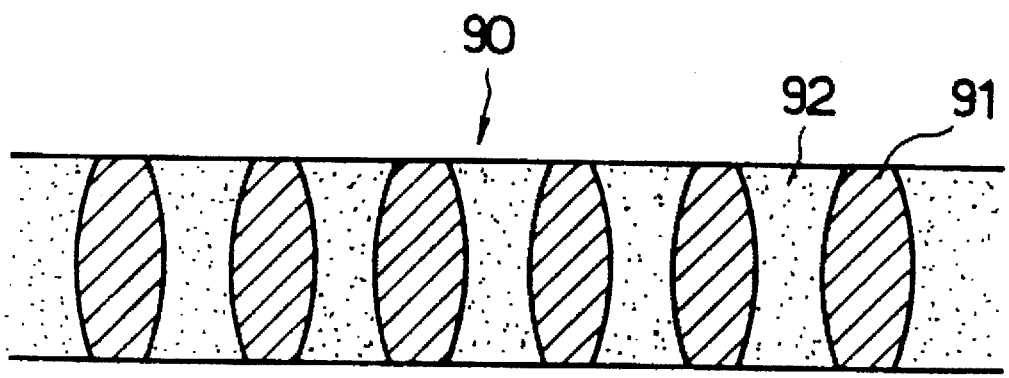
FIG. 33 is a sectional view showing the structure of a thermal conductivity sheet according to a seventeenth embodiment.

To solve the above problem, a thermal conductivity sheet 90 of Embodiment 17 is structured as shown in FIG. 33.

More specifically, the thermal conductivity sheet 90 is fabricated by erectly arranging the highly thermally conductive insulators 91 with intervals, which have sectional areas changed in the axial direction thereof, and filling a matrix resin 92 into gaps between the highly thermally conductive insulators 91, 91 adjacent each other.

Figure 34:
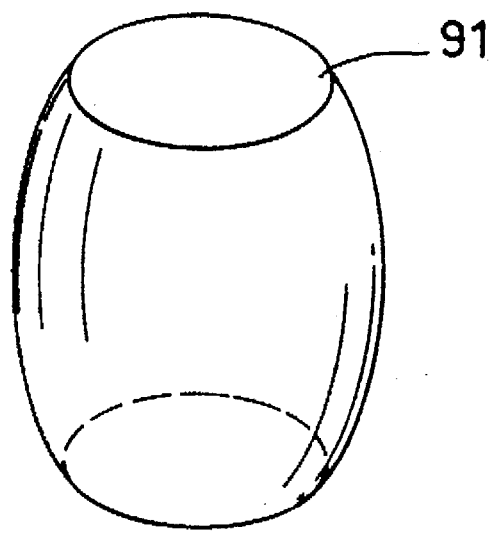
FIG. 34 is a perspective view showing the configuration of highly thermally conductive insulators for use with the thermal conductivity sheet shown in FIG. 33.

The highly thermally conductive insulators 91 are each formed into a barrel shape, for example, which has a larger sectional area in an axially central portion as shown in FIG. 34. The barrel-shaped highly thermally conductive insulators 91 are formed by, for example, mechanically grinding a cylindrical ceramic compact into the form of a barrel, and then sintering the shaped compact.

With the thermal conductivity sheet 90 of Embodiment 17, because of using the highly thermally conductive insulators 91 with intervals which have sectional areas changed in the axial direction thereof, the highly thermally conductive insulators 91 are hardly slipped off from the matrix resin 92 and superior heat radiating characteristics can be maintained for a long term. Also, even when the thermal conductivity sheet 90 is closely contacted with curved surfaces of the cooled parts by applying external forces, a possibility that the thermal conductivity sheet 90 may be damaged is small.

Embodiment 18

Figure 35:
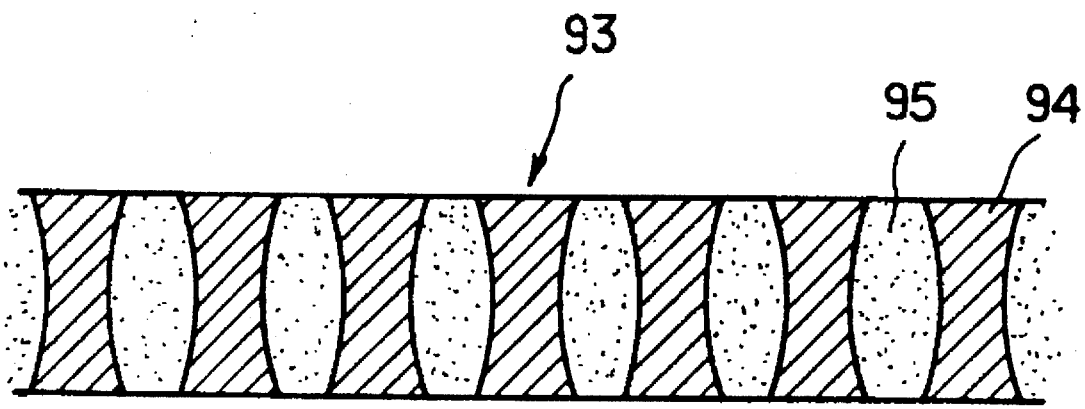
FIG. 35 is a sectional view showing the structure of a thermal conductivity sheet according to an eighteenth embodiment.
Figure 36:
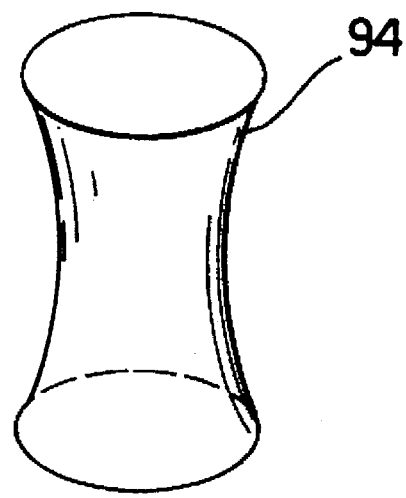
FIG. 36 is a perspective view showing the configuration of highly thermally conductive insulators for use with the thermal conductivity sheet shown in FIG. 35.

FIG. 35 is a sectional view showing the structure of a thermal conductivity sheet 93 according to Embodiment 18. Also in this embodiment, a plurality of highly thermally conductive insulators 94 are interconnected through matrix resins 95 so as to form the thermal conductivity sheet 93. But, as shown in FIG. 36, the highly thermally conductive insulators 94 are each formed into the shape of a hyperboloidal drum of which sectional area is relatively reduced in an axially central portion.

The thermal conductivity sheet 93 of this embodiment can also provide similar advantages as in the thermal conductivity sheet 90 of Embodiment 17. Thus, even when the thermal conductivity sheet 93 is subject to external forces and is deformed to a large extent, the highly thermally conductive insulators 94 are prevented from slipping off from the matrix resin 95, and superior durability is maintained for a long term.

Embodiment 19A

A thermal conductivity sheet which has anisotropy in the modulus of elasticity (Young's modulus) and thermal conductivity in the direction of sheet plane will be described below with reference to FIG. 37 to 38.

Figure 37:
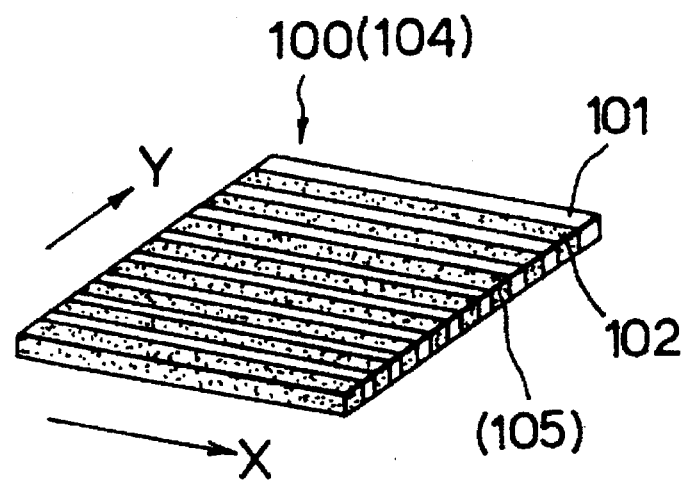
FIG. 37 is a perspective view showing the structure of a thermal conductivity sheet according to a nineteenth embodiment.

A thermal conductivity sheet 100 according to Embodiment 19 shown in FIG. 37 was fabricated by alternately arranging elongate highly thermally conductive insulators 101 in the form of rods and a matrix insulator 102. The highly thermally conductive insulators 101 were penetrated through the thermal conductivity sheet 100 in the direction of sheet thickness and their both upper and lower end faces were exposed to surfaces of the thermal conductivity sheet 100. Silicone rubber was used as the matrix insulator 102. The highly thermally conductive insulators 101 were each formed of an aluminum nitride sintered body having thermal conductivity of 200 W/m·K, the modulus of elasticity (Young's modulus) of 330 GPa, a width of 0.5 mm and a length of 150 mm. To improve moisture resistance and water resistance, the highly thermally conductive insulators 101 were treated beforehand by a solution of aluminum phosphate or a titanate-base surface treating agent containing a phosphoric group, a pyrophosphoric group or an orthophosphoric group for changing surface properties. The highly thermally conductive insulators 101 were also treated by a coupling agent for improving wettability thereof with respect to the matrix insulator 102.

The thermal conductivity sheet 100 had thermal conductivity of 23 W/m·K, and the highly thermally conductive insulators 101 had the Young's modulus of 330 GPa in the axial direction X and the modulus of elasticity of 3 GPa in a direction Y perpendicular to the axial direction X. Thus, the thermal conductivity sheet 100 having such anisotropy that the Young's modulus was different 100 or more times between the directions X and Y was obtained.

With the thermal conductivity sheet 100 described above, since heat radiating paths are continuously formed not only in the direction of sheet thickness but also in the axial direction X of the highly thermally conductive insulators, heat can be effectively transmitted. Also, the thermal conductivity sheet 100 can be easily bent in the direction Y perpendicular to the axial direction, and hence can be fitted to cylindrically curved surfaces of the cooled equipment with a high degree of close-contact.

In the case that the thermal conductivity sheet 100 is used in a condition where the sheet undergoes stress from the cooled part, by fitting the thermal conductivity sheet 100 to the cooled part such that the acting direction of the stress agrees with the direction Y in which the thermal conductivity sheet 100 has the low modulus of elasticity, the effect of releasing the stress is developed so as to maintain the close-contact between the thermal conductivity sheet 100 and the cooled part for a long term.

Embodiment 19B

Another thermal conductivity sheet 104 wherein the matrix insulator is formed of a composite consisted of a high molecular material and a highly thermally conductive filler will be described below with reference to FIG. 37. The thermal conductivity sheet 104 of this embodiment is featured in that particulate highly thermally conductive fillers 105 are dispersed in the matrix insulator 102 in addition to the structure of the thermal conductivity sheet 100 shown in Embodiment 19A. In other words, the plurality of columnar highly thermally conductive insulators 101 are interconnected by the matrix insulators 102 in which the highly thermally conductive fillers 105 are dispersed. Also, the plurality of columnar highly thermally conductive insulators 101 each have a length equal to the width of the thermal conductivity sheet 104 and are exposed to side end faces of the thermal conductivity sheet 104 as well as to front and rear surfaces thereof.

The thermal conductivity sheet 104 of Embodiment 19B was manufactured as follows. AlN fine powder having two peaks at the average particle size of 6 μm and 28 μm in particle size distribution was added with a solution of diisopropyl-bis(dioctyl pyrophosphate) titanate at a ratio of 5 wt % with respect to the AlN fine powder. The mixture was sufficiently stirred and dispersed to change surface properties, thereby forming a slurry. The slurry was passed through a pipe heated up to 240° C. to dry the slurry for removing the solvent. The AlN powder having the changed surface properties was recovered in a collector pipe at 120° C. Then, the recovered AlN powder was filled at a ratio of 50 wt % and sufficiently dispersed in silicone rubber having low viscosity to prepare a composite consisted of the AlN powder as the thermally conductive filler and silicone rubber as the matrix insulators 101.

On the other hand, aluminum nitride sintered bodies each in the form of a rectangular parallelepiped having a width of 1.2 mm, a length of 62.3 m and a thickness of 0.5 mm were arranged as the highly thermally conductive insulators 101 erectly on one glass base plate, and the other glass base plate was placed over upper end faces of the AlN sintered bodies to form a cell between the glass base plates. Thereafter, the above composite was filled into the cell while the cell had been evacuated, followed by heating and hardening to manufacture the thermal conductivity sheet 104. A ratio of the sectional area of the columnar highly thermally conductive insulators 101 to the total surface area of the thermal conductivity sheet 104 was 67%, and the thickness of the thermal conductivity sheet 104 was 0.5 mm. It was confirmed that the thermal conductivity sheet 104 had thermal conductivity of 38 W/m·K and hence had the superior effect of radiating and dissipating heat.

The thermal conductivity sheet 104 had the Young's modulus of 330 GPa in the axial direction X and the Young's modulus of 6 GPa in a direction Y perpendicular to the axial direction X. Thus, the thermal conductivity sheet 104 having such anisotropy that the Young's modulus was different about 55 times between the directions X and Y was obtained.

As a reference example, a thermal conductivity sheet was fabricated as a trial by using silicone rubber solely as the matrix insulators 102 instead of the above composite, and setting the ratio of the sectional area of the columnar highly thermally conductive insulators 101 to the total surface area of the thermal conductivity sheet to 67% (fixed). This thermal conductivity sheet had thermal conductivity of 30 W/m·K. It was thus confirmed that the thermal conductivity of the thermal conductivity sheet as a whole could be improved by increasing the thermal conductivity of the insulator portions which interconnected the columnar highly thermally conductive insulators 101 and had flexibility.

With the thermal conductivity sheet 104 described above, since thermal conductivity is expected not only in the directions of thickness and axis of the highly thermally conductive insulators 10, but also in the coupling portions formed of the composite and having flexibility, and larger heat radiating paths than the case of using a high molecular material (e.g., silicone rubber) solely as the matrix insulators, heat can be more effectively transmitted. Also, the thermal conductivity sheet 104 can be easily bent in the direction Y, and hence can be fitted to cylindrically curved surfaces of the cooled equipment with a high degree of close-contact.

It is a matter of course that the highly thermally conductive fillers 105 for use in the composite are not limited to insulating particles mentioned above, but may be formed by coating surfaces of metal particles with insulating layers to provide electrical insulation.

Embodiment 20

Figure 38:
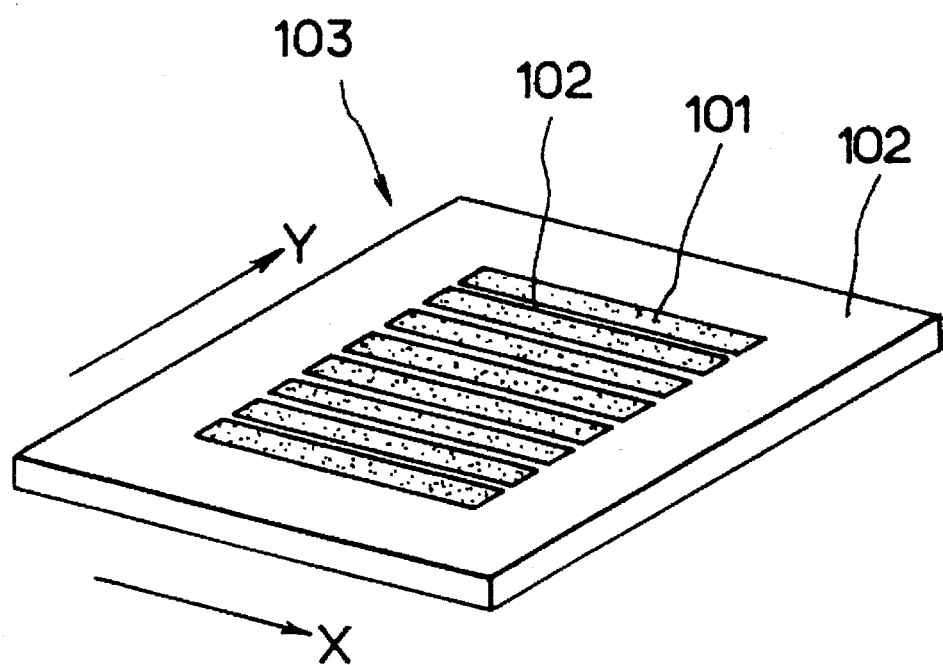
FIG. 38 is a perspective view showing the structure of a thermal conductivity sheet according to a twentieth embodiment.

A thermal conductivity sheet 103 of Embodiment 20 shown in FIG. 38 was fabricated by integrally forming the same matrix insulator 102 as described above along an outer circumference of the thermal conductivity sheet 100 shown in FIG. 37. Also in this thermal conductivity sheet 103, since the elongate thermally conductive insulators 101 and the elongate matrix insulators 102 are regularly arranged, thermal conductivity and the modulus of elasticity are higher in the direction X than in the direction Y.

As described above, since the thermal conductivity sheets 100, 103 have thermal conductivity and the modulus of elasticity both different depending on directions, these sheets can be adapted for various cooled parts, which are different in moving direction of heat and direction of elongation, in accordance with individual required characteristics.

Embodiment 21

Embodiments of a thermal conductivity sheet wherein a sintered or calcined body of ceramics are used as the highly thermally conductive insulator will be described below.

To evaluate characteristics of the thermal conductivity sheets of Embodiments 21A, 21B and Comparative Examples 21A, 21B, thermal conductivity and electrical conductivity were measured and checked. Obtained results are shown in Table 2 below.

TABLE 2

| SAMPLE | HIGHLY THERMALLY CONDUCTIVE INSULATORS OR FILLERS | RATIO OF EXPOSED AREA OF INSULATORS OR FILLERS TO TOTAL SURFACE AREA OF THERMAL CONDUCTIVITY SHEET (%) | THERMAL CONDUCTIVITY (W/m·K) | ELECTRICAL CONDUCTIVITY |
|---|---|---|---|---|
| EMBODIMENT 21A | AlN SINTERED BODY | 66 | 30 | NON-CONDUCTIVE |
| EMBODIMENT 21B | AlN CALCINATED BODY | 66 | 8 | NON-CONDUCTIVE |
| COMPARATIVE EXAMPLE 21A | Al METAL | 66 | 35 | CONDUCTIVE |
| COMPARATIVE EXAMPLE 21B | AlN MATERIAL POWDER | — | 2 | NON-CONDUCTIVE |

Embodiment 21A

Aluminum nitride material powder was added with yttrium oxide of 3 wt %, acrylic resin of 5% as an organic coupling agent, and ethanol as a solvent. The mixture was mixed by a pot mill to prepare a slurry.

The prepared slurry was dried by a spray drier to be agglomerated, thereby forming granules.

The granules were placed in a pressing mold and compacted into the form of a square pillar under pressure of 1 ton/cm$^2$. The compact was degreased in a flow of nitrogen gas and sintered in a nitrogen atmosphere at 1850° C. The obtained AlN sintered body (highly thermally conductive insulator) had thermal conductivity of 200 W/m·K.

The AlN sintered bodies were covered at their both end faces with paraffin coatings and then arrayed regularly. Silicone rubber was poured into gaps between the sintered bodies and hardened, followed by removing the paraffin layers to obtain a thermal conductivity sheet of Embodiment 21A.

Embodiment 21B

The granules obtained in Embodiment 21A were likewise compacted into the form of a square pillar. The compact was degreased in a flow of nitrogen gas and calcined in a nitrogen atmosphere at 1200° C. The obtained AlN calcined body had thermal conductivity of 50 W/m·K. Subsequently, as with Embodiment 21A, silicone rubber was poured around the AlN sintered bodies and hardened, thereby obtaining a thermal conductivity sheet of Embodiment 21B.

Comparative Example 21A

A highly thermally conductive filler of the same size as the AlN sintered body of Embodiment 21A was formed of an aluminum metal. Subsequently, as with Embodiment 21A, silicone rubber was poured around the highly thermally conductive fillers and hardened, thereby fabricating a thermal conductivity sheet of Comparative Example 21A.

Comparative Example 21B

AlN material powder of 65 vol % was added to silicone rubber, kneaded and then hardened, thereby fabricating a thermal conductivity sheet of Comparative Example 21B.

As is apparent from the results shown in Table 2, it was found that the thermal conductivity sheets of Embodiments 21A, 21B each had high thermal conductivity and electrical resistivity equal to or larger than $10^{12}$ Ω-cm, i.e., superior electrical insulation. On the other hand, the thermal conductivity sheet of Comparative Example 21A using an Al metal as the fillers had high thermal conductivity, but was electrically conductive. Therefore, this thermal conductivity sheet is sometimes not suitable for heat generating part such as semiconductor devices which require a high degree of electrical insulation. It was confirmed that the thermal conductivity sheet of Comparative Example 21B containing the AlN material powder simply dispersed in the silicone rubber was poor in both thermal conductivity and heat radiating capability.

Corresponding to the thermal conductivity sheets of Embodiments 1 to 21 described above and the thermal conductivity sheets of various comparative examples disclosed in the prior arts, thermal conductivity sheets of Embodiments (Samples 1 to 25) and Comparative Examples (Samples 26 to 36) was fabricated in accordance with specifications shown in Tables 3 to 5 by forming the highly thermally conductive insulators and the matrix insulators of various materials.

Embodiments and/or Comparative Examples relating to typical ones of the above various samples will be described below.

Comparison between Embodiment (Sample 1) and Comparative Example (Sample 28)

AlN sintered bodies each having a length and a width of 2.5 mm and a thickness of 0.5 mm were arranged as the columnar highly thermally conductive insulators erectly on one glass base plate with equal intervals, and the other glass base plate was placed over upper end faces of the AlN sintered bodies to form a cell between the glass base plates. Thereafter, silicone rubber was filled into gaps between the columnar highly thermally conductive insulators while the cell had been evacuated, followed by heating and hardening to manufacture a thermal conductivity sheet of Sample 1. A ratio of the exposed area of the columnar highly thermally conductive insulators to the total surface area of the thermal conductivity sheet was 69%, and the thickness of the thermal conductivity sheet was 0.5 mm.

It was confirmed that the thermal conductivity sheet had thermal conductivity of 32 W/m·K and hence had the superior effect of radiating and dissipating heat. The electrical resistivity of the thermal conductivity sheet in the direction of thickness thereof was $6 \times 10^{12}$ Ω-cm.

Comparative Example (Sample 28) in which metal fibers are planted on and buried in each of an electrically conductive base and an electrically insulating base through an adhesive layer is as follows. An adhesive was coated in thickness of 20 μm over each of steel sheets as the electrically conductive bases, and then short fibers of AlN and copper were erectly planted on the bases. A thickness of 20 μm was required as an adhesive layer for the base as a whole to maintain electrical insulation. The resulting thermal conductivity sheets had thermal conductivity of 11 W/m·K and 13 W/m·K, respectively.

Next, short fibers of AlN and copper were likewise erectly planted on plastic base plates. The resulting plates had thermal conductivity of 3 W/m·K and 5 W/m·K, respectively. Thus, high thermal conductivity was not achieved owing to low thermal conductivity of the base plates. For only the thermal conductivity sheets using steel sheets and having high thermal conductivity, a heat radiating and dissipating test was made by placing each sheet between a heat generating portion of an electronic/electric part and a heat radiating fin. As a result, a short-circuit was caused between terminals of the electronic/electric part because of the short fibers being electrically conductive.

Comparison between Embodiment (Sample 2) and Comparative Example (Sample 26)

AlN sintered bodies each having a length and a width of 1.2 mm and a thickness of 0.5 mm and having thermal conductivity of 200 W/m·K were arranged as the columnar highly thermally conductive insulators obliquely on one glass base plate with equal intervals. Thereafter, by a similar filling process as for Sample 1, silicone rubber was filled into gaps between the AlN sintered bodies, followed by heating and hardening to manufacture a thermal conductivity sheet of Sample 2. A ratio of the exposed area of the columnar highly thermally conductive insulators to the total surface area of the thermal conductivity sheet was 40%, and the thickness of the thermal conductivity sheet was 0.5 mm.

It was confirmed that the thermal conductivity sheet had thermal conductivity of 19 W/m·K and hence had the superior effect of radiating and dissipating heat. The electrical resistivity of the thermal conductivity sheet in the direction of thickness thereof was $3 \times 10^{12}$ Ω-cm. The damping effect in the direction of sheet thickness was also confirmed owing to the oblique arrangement of the highly thermally conductive insulators.

On the other hand, an AlN sintered body having thermal conductivity of 200 W/m·K was pulverized and screened to prepare, as the highly thermally conductive fillers, aluminum nitride powder having two peaks at the average particle size of 5 μm and 35 μm in particle size distribution. The aluminum nitride powder was dispersed in and kneaded with a matrix resin (silicone rubber), thereby fabricating a thermal conductivity sheet of Sample 26 having a thickness of 0.5 mm. As a result of observing thermal conductivity and flexibility (pliability) while variously changing the amount of aluminum nitride powder filled in the matrix resin, as the amount of filled aluminum nitride powder increased, the thermal conductivity was increased, but the flexibility (pliability) was remarkably reduced. The thermal conductivity in the range where satisfactory flexibility (pliability) was maintained was about 4 W/m·K. The value of thermal conductivity measured on the thermal conductivity sheet of Sample 26 was only about ⅕ of the value measured on Sample 2. Comparison between Embodiment (Sample 5) and Comparative Example (Sample 35)

$Si_3N_4$ sintered bodies each having a length and a width of 1.2 mm and a thickness of 0.5 mm were arranged as the columnar highly thermally conductive insulators obliquely on one glass base plate with equal intervals. Thereafter, by a similar filling process as for Sample 1, silicone rubber was filled into gaps between the $Si_3N_4$ sintered bodies, followed by heating and hardening to manufacture a thermal conductivity sheet of Sample 5. A ratio of the exposed area of the columnar highly thermally conductive insulators ($Si_3N_4$ sintered bodies) to the total surface area of the thermal conductivity sheet was 59%, and the thickness of the thermal conductivity sheet was 0.5 mm. It was confirmed that the thermal conductivity sheet had thermal conductivity of 24 W/m·K and hence had the superior effect of radiating and dissipating heat. The electrical resistivity of the thermal conductivity sheet in the direction of thickness thereof was $3 \times 10^{12}$ Ω-cm. The damping effect in the direction of sheet thickness was also confirmed owing to the oblique arrangement of the highly thermally conductive insulators.

On the other hand, silicon nitride powder having the particle size of 2 to 4 μm was, as the highly thermally conductive fillers, dispersed in and kneaded with a matrix resin (silicone rubber), thereby fabricating a thermal conductivity sheet of Sample 35 having a thickness of 0.5 mm. As a result of observing thermal conductivity and flexibility (pliability) while variously changing the amount of silicon nitride powder filled in the matrix resin, as the amount of filled silicon nitride powder increased, the thermal conductivity was increased, but the flexibility (pliability) was remarkably reduced. The thermal conductivity in the range where satisfactory flexibility (pliability) was maintained was about 1.5 to 3.5 W/m·K. The value of thermal conductivity measured on the thermal conductivity sheet of Sample 35 was about ⅑ of the value measured on Sample 5.

Embodiment (Sample 6)

Artificial diamonds each having a length and a width of 2.5 mm and a thickness of 0.5 mm were arranged as the columnar highly thermally conductive insulators erectly on one glass base plate with equal intervals. Thereafter, by a similar filling process as for Sample 1, a silicone resin was filled into gaps between the artificial diamonds, followed by heating and hardening to manufacture a thermal conductivity sheet of Sample 6. A ratio of the exposed area of the columnar highly thermally conductive insulators to the total surface area of the thermal conductivity sheet was 52%, and the thickness of the thermal conductivity sheet was 0.5 mm. It was confirmed that the thermal conductivity sheet had thermal conductivity of 39 W/m·K and hence had the superior effect of radiating and dissipating heat. The electrical resistivity of the thermal conductivity sheet in the direction of thickness thereof was $2 \times 10^{12}$ Ω-cm.

Comparison between Embodiment (Sample 7) and Comparative Example (Sample 36)

BN sintered bodies each having a length and a width of 2.5 mm and a thickness of 0.5 mm were arranged as the columnar highly thermally conductive insulators obliquely on one glass base plate with equal intervals. Thereafter, by a similar filling process as for Sample 1, silicone rubber was filled into gaps between the BN sintered bodies, followed by heating and hardening to manufacture a thermal conductivity sheet of Sample 7. A ratio of the exposed area of the columnar highly thermally conductive insulators to the total surface area of the thermal conductivity sheet was 52%, and the thickness of the thermal conductivity sheet was 0.5 mm. It was confirmed that the thermal conductivity sheet had thermal conductivity of 15 W/m·K and hence had the superior effect of radiating and dissipating heat. The electrical resistivity of the thermal conductivity sheet in the direction of thickness thereof was $3 \times 10^{12}$ Ω·cm.

On the other hand, boron nitride (BN) powder being in the flat form and having the average particle size of 12 μm was, as the highly thermally conductive fillers, dispersed in and kneaded with a matrix resin, thereby fabricating a thermal conductivity sheet of Sample 36 having a thickness of 0.5 mm. As a result of observing thermal conductivity and flexibility (pliability) while variously changing the amount of boron nitride powder filled in the matrix resin, as the amount of filled silicon nitride powder increased, the thermal conductivity was increased and showed about 3 to 4 W/m·K in the range where satisfactory flexibility (pliability) was maintained. The value of thermal conductivity measured on the thermal conductivity sheet of Sample 36 was about ⅓ of the value measured on Sample 7.

Embodiment (Sample 8)

$Al_2O_3$ sintered bodies each having a length and a width of 1.2 mm and a thickness of 0.5 mm were arranged as the columnar highly thermally conductive insulators obliquely on one glass base plate with equal intervals. Thereafter, by a similar filling process as for Sample 1, silicone rubber was filled into gaps between the $Al_2O_3$ sintered bodies, followed by heating and hardening to manufacture a thermal conductivity sheet of Sample 8. A ratio of the exposed area of the columnar highly thermally conductive insulators to the total surface area of the thermal conductivity sheet was 52%, and the thickness of the thermal conductivity sheet was 0.5 mm. It was confirmed that the thermal conductivity sheet had thermal conductivity of 15 W/m·K and hence had the superior effect of radiating and dissipating heat. The electrical resistivity of the thermal conductivity sheet in the direction of thickness thereof was $3 \times 10^{12}$ Ω·cm.

Embodiment (Sample 9)

BN sintered bodies each having a length and a width of 2.5 mm and a thickness of 0.5 mm were arranged as the columnar highly thermally conductive insulators obliquely on one glass base plate with equal intervals. Thereafter, by a similar filling process as for Sample 1, a liquid epoxy resin was filled into gaps between the BN sintered bodies, followed by heating and hardening to manufacture a thermal conductivity sheet of Sample 9. A ratio of the exposed area of the columnar highly thermally conductive insulators to the total surface area of the thermal conductivity sheet was 52%, and the thickness of the thermal conductivity sheet was 0.5 mm. It was confirmed that the thermal conductivity sheet had thermal conductivity of 9.8 W/m·K and hence had the superior effect of radiating and dissipating heat. The electrical resistivity of the thermal conductivity sheet in the direction of thickness thereof was $3 \times 10^{12}$ Ω·cm.

Embodiment (Sample 10)

A thermal conductivity sheet of Sample 10 was manufactured by a similar process as for Sample 9 except that an acrylic resin was used instead of the epoxy resin in Sample 9. A ratio of the exposed area of the columnar BN sintered bodies to the total surface area of the thermal conductivity sheet was 52%, and the thickness of the thermal conductivity sheet was 0.5 mm. It was confirmed that the thermal conductivity sheet had thermal conductivity of 9.7 W/m·K and hence had the superior effect of radiating and dissipating heat. The electrical resistivity of the thermal conductivity sheet in the direction of thickness thereof was $2 \times 10^{12}$ Ω·cm.

Embodiment (Sample 11)

A thermal conductivity sheet of Sample 11 was manufactured by a similar process as for Sample 9 except that a vinyl chloride resin was used instead of the epoxy resin in Sample 9. This thermal conductivity sheet had thermal conductivity of 10.2 W/m·K.

Embodiment (Sample 21)

BN powder having the average particle size of 5 μm was filled in silicone rubber having low viscosity at a ratio of 50 wt % and was fully dispersed to prepare a composite.

On the other hand, a $Si_3N_4$ thin film having a thickness of 2.5 μm was formed as the insulating layer on one surface of an Al plate having a diameter of 0.5 mm and a height of 0.5 mm, thereby preparing a laminate as the columnar highly thermally conductive insulator. Then, the laminates were arranged erectly on one glass base plate with equal intervals such that the $Si_3N_4$ thin films were positioned top, and the other glass base plate was placed over the laminates to form a cell between the glass base plates. Thereafter, the above composite was filled into the cell while the cell had been evacuated, followed by heating and hardening to manufacture a thermal conductivity sheet of Sample 21. A ratio of the total exposed area of the highly thermally conductive insulators to the total surface area of the thermal conductivity sheet was 59%, and the thickness of the thermal conductivity sheet was 0.5 mm. The thermal conductivity sheet had thermal conductivity of 29 W/m·K.

Embodiment (Sample 22)

An AlN thin film having a thickness of 1.2 μm was formed as the insulating layer on one surface of a copper plate having a length and a width of 1.2 mm and a height of 0.5 mm, thereby preparing a laminate as the columnar highly thermally conductive insulator. Then, the laminates were arranged erectly on one glass base plate with equal intervals such that the AlN thin films were positioned top, and the other glass base plate was placed over the laminates to form a cell between the glass base plates. Thereafter, silicone rubber having low viscosity was filled into the cell while the cell had been evacuated, followed by heating and hardening to manufacture a thermal conductivity sheet of Sample 22. A ratio of the total exposed area of the highly thermally conductive insulators to the total surface area of the thermal conductivity sheet was 61%, and the thickness of the thermal conductivity sheet was 0.5 mm. The thermal conductivity sheet had thermal conductivity of 32 W/m·K.

Embodiment (Sample 24)

A thermal conductivity sheet of Sample 24 was manufactured by the above-described process on the same conditions as for Sample 22 except that pure copper plates each having a surface length and width of 1.2 mm and a height of 0.5 mm were used and arranged obliquely.

This thermal conductivity sheet had thermal conductivity of 32 W/m·K comparable to that for Sample 22 in which the copper plates were arranged erectly.

When the pure copper plates were arranged erectly like Sample 22, elasticity in the direction of sheet thickness is small. It was however confirmed that by arranging the pure copper plates obliquely like Sample 24, the sheet could be displaced in the direction of sheet thickness through a 40% larger distance than that for Sample 22, and elasticity was increased not only in the direction of sheet plane but also in the direction of sheet thickness.

Embodiment (Sample 25)

A thermal conductivity sheet of Sample 25 was manufactured by the above-described process on the same conditions as for Sample 22 except that the silicon rubber as the matrix insulator was replaced by an epoxy resin in Sample 22.

This thermal conductivity sheet had thermal conductivity of 33 W/m·K comparable to that for Sample 23. But, because of using an epoxy resin as the matrix resin, the Young's modulus and the insulation resistivity were increased to $2 \times 10^9$ N/m$^2$ and $9 \times 10^{12}$ Ω·cm, respectively.

Characteristic values of electrical insulation, thermal conductivity, flexibility, etc. of the thermal conductivity sheets of Embodiments 1 to 36 are shown together in Tables 3 to 5 below.

TABLE 3

| | COMPOSITION | | | | | CHARACTERISTIC VALUE | | |
|---|---|---|---|---|---|---|---|---|
| | HIGHLY THERMALLY CONDUCTIVE | | HIGHLY THERMALLY CONDUCTIVE INSULATOR | | | INSULATION | THERMAL | FLEXIBILITY |
| | INSULATOR OR FILLER | MATRIX INSULATOR | SHAPE | ORIENTATION | PENETRATED OR NOT | MATRIX INSULATOR COMPOSITION | (RESISTIVITY) (Ω·cm) | CONDUCTIVITY (W/m·K) | (YOUNG'S MODULUS) (N/m$^2$) |
| EMBODIMENTS | | | | | | | | | |
| SAMPLE 1 | AlN | SILICONE | COLUMNAR SINTERED BODY | ERECT | PENETRATED | HIGH MOLECULAR MATERIAL SIMPLE SUBSTANCE | $3 \times 10^{12}$ | 24 | $2 \times 10^8$ |
| SAMPLE 2 | AlN | SILICONE | COLUMNAR SINTERED BODY | OBLIQUE | PENETRATED | HIGH MOLECULAR MATERIAL SIMPLE SUBSTANCE | $3 \times 10^{12}$ | 19 | $2 \times 10^8$ |
| SAMPLE 3 | AlN | SILICONE | BARREL | ERECT | PENETRATED | HIGH MOLECULAR MATERIAL SIMPLE SUBSTANCE | $3 \times 10^{12}$ | 7.6 | $2 \times 10^8$ |
| SAMPLE 4 | AlN | SILICONE | COIL | OBLIQUE | PENETRATED | HIGH MOLECULAR MATERIAL SIMPLE SUBSTANCE | $3 \times 10^{12}$ | 21 | $2 \times 10^8$ |
| SAMPLE 5 | Si$_3$N$_4$ | SILICONE | COLUMNAR SINTERED BODY | OBLIQUE | PENETRATED | HIGH MOLECULAR MATERIAL SIMPLE SUBSTANCE | $3 \times 10^{12}$ | 24 | $3 \times 10^8$ |
| SAMPLE 6 | DIAMOND | SILICONE | CRYSTAL | ERECT | PENETRATED | HIGH MOLECULAR MATERIAL SIMPLE SUBSTANCE | $2 \times 10^{12}$ | 55 | $3 \times 10^8$ |
| SAMPLE 7 | BN | SILICONE | COLUMNAR SINTERED BODY | OBLIQUE | PENETRATED | HIGH MOLECULAR MATERIAL SIMPLE SUBSTANCE | $3 \times 10^{12}$ | 15 | $3 \times 10^8$ |
| SAMPLE 8 | Al$_2$O$_3$ | SILICONE | COLUMNAR SINTERED BODY | OBLIQUE | PENETRATED | HIGH MOLECULAR MATERIAL SIMPLE SUBSTANCE | $3 \times 10^{12}$ | 12 | $3 \times 10^8$ |
| SAMPLE 9 | BN | EPOXY | COLUMNAR SINTERED BODY | OBLIQUE | PENETRATED | HIGH MOLECULAR MATERIAL SIMPLE SUBSTANCE | $9 \times 10^{12}$ | 9.8 | — |
| SAMPLE 10 | BN | ACRYLIC | COLUMNAR SINTERED BODY | OBLIQUE | PENETRATED | HIGH MOLECULAR MATERIAL SIMPLE SUBSTANCE | $4 \times 10^{12}$ | 9.7 | — |
| SAMPLE 11 | BN | VINYL CHLORIDE | COLUMNAR SINTERED BODY | OBLIQUE | PENETRATED | HIGH MOLECULAR MATERIAL SIMPLE SUBSTANCE | $3 \times 10^{12}$ | 10.2 | — |
| SAMPLE 12 | AlN | SILICONE | STAGGED CYLINDER | ERECT | PENETRATED | HIGH MOLECULAR MATERIAL SIMPLE SUBSTANCE | $3 \times 10^{12}$ | 10 | $3 \times 10^8$ |
| SAMPLE 13 | TOUGH PITCH COPPER | SILICONE | STAGGED CYLINDER | ERECT (LAMINATED) | PENETRATED | HIGH MOLECULAR MATERIAL SIMPLE SUBSTANCE | $3 \times 10^{12}$ | 14 | $4 \times 10^8$ |
| SAMPLE 14 | PURE COPPER | SILICONE | METAL/INSULATING LAYER | ERECT (LAMINATED) | PENETRATED | HIGH MOLECULAR MATERIAL SIMPLE SUBSTANCE | $3 \times 10^{12}$ | 15 | $4 \times 10^8$ |

TABLE 4

| | COMPOSITION | | | | | CHARACTERISTIC VALUE | | |
|---|---|---|---|---|---|---|---|---|
| | HIGHLY THERMALLY CONDUCTIVE INSULATOR OR FILLER | HIGHLY THERMALLY CONDUCTIVE INSULATOR | | | | INSULATION (RESISTIVITY) ($\Omega \cdot cm$) | THERMAL CONDUCTIVITY (W/m·K) | FLEXIBILITY (YOUNG'S MODULUS) ($N/m^2$) |
| | | MATRIX INSULATOR | SHAPE | ORIENTATION | PENETRATED OR NOT | MATRIX INSULATOR COMPOSITION | | |
| EMBODIMENTS | | | | | | | | |
| SAMPLE 15 | AlN | SILICONE | COLUMNAR SINTERED BODY | ERECT ※NOTE 1 (LAMINATED) | PENETRATED | HIGH MOLECULAR MATERIAL SIMPLE SUBSTANCE | $3 \times 10^{12}$ | 14 | $3 \times 10^8$ |
| SAMPLE 16 | AlN | SILICONE | COLUMNAR ※NOTE 2 SINTERED BODY | ERECT | PENETRATED | HIGH MOLECULAR MATERIAL SIMPLE SUBSTANCE | $3 \times 10^{12}$ | 30 | $3 \times 10^8$ |
| SAMPLE 17 | AlN | SILICONE | COLUMNAR ※NOTE 3 CALCINED BODY | ERECT | PENETRATED | HIGH MOLECULAR MATERIAL SIMPLE SUBSTANCE | $3 \times 10^{12}$ | 8 | $3 \times 10^8$ |
| SAMPLE 18 | AlN | SILICONE | COLUMNAR SINTERED BODY | ERECT | PENETRATED | COMPOSITE (POWDER) | $3 \times 10^{12}$ | 38 | $9 \times 10^8$ |
| SAMPLE 19 | AlN | SILICOME | COLUMNAR SINTERED BODY | ERECT | PENETRATED | COMPOSITE (FIBER) | $3 \times 10^{12}$ | 44.3 | $9 \times 10^8$ |
| SAMPLE 20 | AlN | SILICONE | COLUMNAR SINTERED BODY | ERECT | PENETRATED | COMPOSITE (CRYSTAL) | $3 \times 10^{12}$ | 41 | $9 \times 10^8$ |
| SAMPLE 21 | ALUMINUM | SILICONE | METAL/INSULATING LAYER | ERECT (LAMINATED) | PENETRATED | COMPOSITE (BN) | $3 \times 10^{12}$ | 29 | $7 \times 10^8$ |
| SAMPLE 22 | PURE COPPER | SILICONE | METAL/INSULATING LAYER | ERECT (LAMINATED) | PENETRATED | HIGH MOLECULAR MATERIAL SIMPLE SUBSTANCE | $3 \times 10^{12}$ | 32 | $1 \times 10^8$ |
| SAMPLE 23 | PURE COPPER | SILICONE | METAL/ ※NOTE 4 INSULATING LAYER | ERECT (LAMINATED) | PENETRATED | HIGH MOLECULAR MATERIAL SIMPLE SUBSTANCE | $3 \times 10^{12}$ | 33 | $1 \times 10^8$ |
| SAMPLE 24 | PURE COPPER | SILICONE | METAL/INSULATING LAYER | OBLIQUE (LAMINATED) | PENETRATED | HIGH MOLECULAR MATERIAL SIMPLE SUBSTANCE | $3 \times 10^{12}$ | 32 | $1 \times 10^8$ ※NOTE 5 |
| SAMPLE 25 | PURE COPPER | EPOXY | METAL/INSULATING LAYER | ERECT (LAMINATED) | PENETRATED | HIGH MOLECULAR MATERIAL SIMPLE SUBSTANCE | $9 \times 10^{12}$ | 33 | $2 \times 10^9$ |

※NOTE 1: Mo METALIZED LAYER AND SOLDER LAYER WERE FORMED ON BOTH END FACES
NOTE 2: THERMAL CONDUCTIVITY WAS 200 W/m·K
NOTE 3: THERMAL CONDUCTIVITY WAS 50 W/m·K
NOTE 4: UNDULATIONS WERE FORMED ON METAL END FACES
NOTE 5: SHEET HAD ELASTICITY IN DIRECTION OF THICKNESS

TABLE 5

| | COMPOSITION | | | | | CHARACTERISTIC VALUE | | |
|---|---|---|---|---|---|---|---|---|
| | HIGHLY THERMALLY CONDUCTIVE INSULATOR OR FILLER | HIGHLY THERMALLY CONDUCTIVE INSULATOR | | | | INSULATION (RESISTIVITY) ($\Omega \cdot cm$) | THERMAL CONDUCTIVITY (W/m·K) | FLEXIBILITY (YOUNG'S MODULUS) ($N/m^2$) |
| | | MATRIX INSULATOR | SHAPE | ORIENTATION | PENETRATED OR NOT | MATRIX INSULATOR COMPOSITION | | |
| COMPARATIVE EXAMPLE | | | | | | | | |
| SAMPLE 26 | AlN | SILICONE | POWDER | IRREGULAR | NOT | COMPOSITE | $3 \times 10^{12}$ | 4 | $8 \times 10^8$ |

TABLE 5-continued

| COMPOSITION | | | | | | CHARACTERISTIC VALUE | | |
|---|---|---|---|---|---|---|---|---|
| HIGHLY THERMALLY | | HIGHLY THERMALLY CONDUCTIVE INSULATOR | | | MATRIX | INSULATION | THERMAL CONDUCTIVITY | FLEXIBILITY |
| CONDUCTIVE INSULATOR OR FILLER | MATRIX INSULATOR | SHAPE | ORIENTATION | PENETRATED OR NOT | INSULATOR COMPOSITION | (RESISTIVITY) ($\Omega \cdot cm$) | (W/m·K) | (YOUNG'S MODULUS) ($N/m^2$) |
| SAMPLE 27 AlN | SILICONE | UNIFORMLY DISPERSED FIBERS | IRREGULAR | NOT | COMPOSITE | $3 \times 10^{12}$ | 9 | $9 \times 10^8$ |
| SAMPLE 28 AlN | SILICONE | UNIFORMLY DISPERSED FIBERS PLANTED | REGULAR (ERECT) | PENETRATED | COMPOSITE | $3 \times 10^{12}$ | 11 | $4 \times 10^9$ |
| SAMPLE 29 BN | SILICONE | POWDER INTERCONNECTED | REGULAR (ERECT) | PENETRATED | COMPOSITE | $5 \times 10^{12}$ | 5 | $7 \times 10^9$ |
| SAMPLE 30 $Al_2O_3$ | EPOXY | POWDER UNIFORMLY DISPERSED | IRREGULAR | NOT | COMPOSITE | $9 \times 10^{12}$ | 2.6 | $6 \times 10^9$ |
| SAMPLE 31 $Al_2O_3$ | EPOXY | POWDER UNIFORMLY DISPERSED | IRREGULAR | NOT | COMPOSITE | $9 \times 10^{12}$ | 4.5 | $6 \times 10^9$ |
| SAMPLE 32 AlN | EPOXY | POWDER UNIFORMLY DISPERSED | IRREGULAR | NOT | COMPOSITE | $9 \times 10^{12}$ | 3.5 | $6 \times 10^9$ |
| SAMPLE 33 Ni POWDER | POLYURETHANE | POWDER UNIFORMLY DISPERSED | IRREGULAR | PENETRATED | COMPOSITE | 58 | 3.7 | $5 \times 10^8$ |
| SAMPLE 34 CARBON POWDER | POLYURETHANE | POWDER UNIFORMLY DISPERSED | IRREGULAR | PENETRATED | COMPOSITE | 43 | 3.2 | $5 \times 10^8$ |
| SAMPLE 35 SILICON NITRIDE ($Si_3N_4$) | SILICONE | POWDER UNIFORMLY DISPERSED | IRREGULAR | NOT | COMPOSITE | $3 \times 10^{12}$ | 1.5–3.5 | — |
| SAMPLE 36 BN | SILICONE | POWDER UNIFORMLY DISPERSED | IRREGULAR | NOT | COMPOSITE | $4 \times 10^{12}$ | 3–4 | — |

As is apparent from the results shown in Tables 3 to 5, any of the thermal conductivity sheets of respective Embodiments has high thermal conductivity and superior heat radiating characteristics. It is also confirmed that although a conductor such as a metal is used as a part of the highly thermally conductive insulator, any thermal conductivity sheet has electrical resistivity equal to or larger than $10^{12}$ $\Omega$·cm in its entirety and hence exhibits a high degree of electrical insulation. Further, in spite of having high thermal conductivity, the thermal conductivity sheet of each Embodiment has lower modulus of elasticity and higher flexibility than those of the thermal conductivity sheets of Comparative Examples, and can be fitted to surfaces of the cooled parts with a high degree of close-contact.

Even for the sheet which uses the highly thermally conductive insulators each partly formed of a conductor such as a metal, no short-circuit takes place between the highly thermally conductive insulators. Therefore, the thermal conductivity sheets of Embodiments can be applied without troubles to, in particular, those semiconductor devices which tend to malfunction due to potential changes.

Consequently, any of the thermal conductivity sheets of Embodiments according to the present invention possesses three major characteristics; i.e., high thermal conductivity, flexibility and electrical insulation, and hence is extremely suitable as a thermal conductivity sheet for various heat generating parts of which output power will be ever increased in future. Meanwhile, the thermal conductivity sheets of Comparative Examples are insufficient in one or more of the above major characteristics.

Methods for improving chemical stability of component materials of the thermal conductivity sheet and increasing durability of the thermal conductivity sheet will be described below. Some of highly thermally conductive insulators and highly thermally conductive fillers used as component materials of the thermal conductivity sheet is insufficient in chemical stability, and may deteriorate over time and eventually impair characteristics of the thermal conductivity sheet. In particular, aluminum nitride (AlN) having high thermal conductivity is problematic in that it lacks chemical stability and may change in properties as a result of nitrogen being dissolved into moisture in air or pharmaceuticals. This problem becomes more significant when AlN is in the form of powder having a large surface area, resulting in a more serious problem that a large amount of ammonia is generated. To solve those problems, Japanese patent laid-open No. 63-170289 discloses a method of forming a stable oxide film on the surface of an AlN base material to maintain chemical stability.

However, the disclosed method has such problems in manufacture as requiring a difficult process, a high cost, and a large amount of energy, because the heat treatment temperature required to form the oxide film as high as 900° to 1100° C. Another possible problem is that the oxide film easily cracks or peels off due to the difference in thermal expansion between the oxide film and AlN. Further, the bonding force between the oxide film and AlN is so weak that the oxide film may easily peel off during the manufacture process of the thermal conductivity sheet. This leads to the problem that the non-treated surface is exposed, chemical stability is lost, and durability, heat radiating characteristics, etc. of the thermal conductivity sheet are deteriorated.

Therefore, the inventors have made intensive studies with a view of obtaining thermal conductivity sheet materials which are superior in resistance against moisture and pharmaceuticals. As a result, the inventors have reached the finding that thermal conductivity sheet materials having good durability are obtained when surface properties of AlN powder and an AlN sintered body are changed so as to form a hydrophobic coating film made of an ammonium phosphate compound or any of various coupling agents.

Specific measures for forming a coating film, which is mainly consisted of an aluminum phosphate compound, on the surface of AlN powder will be described separately for a wet process utilizing liquid phase and a dry process utilizing gas phase.

In the wet process utilizing liquid phase, material powder of phosphoric acid or phosphate used to form the coating film is prepared as an aqueous solution, and AlN powder is immersed in the solution. Alternatively, when material powder is mixed in an organic solvent, AlN powder is immersed in a mixture solution. Alternatively, AlN powder is immersed in a molten solution of material powder. Here, the solution preferably has pH 3 or more. If the solution is in an acid region less than pH 3, the solution would be so unstable that it is difficult to form the uniform coating film of an ammonium phosphate compound. The solution concentration is preferably equal to or higher than 50 ppm in terms of phophorous content. If the phophorous content is too low, a sufficient film thickness could not be achieved. It is more preferable that the solution has pH 6.5 ore more and the phophorous content equal to or higher than 100 ppm.

After that, heat treatment is carried out to develop a chemical reaction between the solution and the AlN powder. While the heat treatment can be satisfactorily performed in the temperature range not lower than 100° C. and not higher than 320° C., the heat treatment temperature is preferably equal to or higher than 350° C. In the case of using the molten solution equal to or higher than 350° C., the coating of the powder surface with the solution and the reaction therebetween can be progressed at the same time. When heating the solution up to temperature equal to or higher than 500° C., the heat treatment is preferably carried out in an inert gas atmosphere to prevent oxidation of the powder surface. With such heat treatment, a stable film of aluminum phosphate being several hundred microns thick is formed on the surface of the AlN powder, the chemical reaction takes place on the powder surface, and a coating film mainly consisted of aluminum phosphate is formed.

As the dry process utilizing gas phase, a thin film forming process such as a sputtering process, a vacuum evaporation process or a CVD process is selectively employed depending on phosphoric acid or the kind of phosphates as materials. In the case of using the sputtering process, for example, sputtering is performed in an atmosphere containing water while using an inorganic compound as a sputtering target, or a sputtered film is treated in a highly moist atmosphere. After that, heat treatment is carried out to develop a chemical reaction between the solution and the AlN powder. While the heat treatment can be satisfactorily performed in the temperature range not lower than 100° C. and not higher than 320° C., the heat treatment temperature is preferably equal to or higher than 350° C. from the standpoint of moisture resistance. When the sputtering is performed in an atmosphere at temperature equal to or higher than 350° C., the reaction with the powder can be effected at the same time.

While the thickness of the coating film depends on the phosphorus content and the immersion time for the wet process and the film forming time for the dry process, the film thickness is desirably in the range not lower than 5 nm and not higher than 10 µm. If the film thickness is less than 5 nm, it would be difficult to sufficiently cover irregularities of the powder surface and hence to form a continuous film. On the other hand, if the film thickness exceeds 10 µm, internal stress of the film would be so large that the film tends to easily crack. Therefore, the film thickness is preferably in the range not lower than 5 nm and not higher than 10 µm, more preferably in the range not lower than 10 nm and not higher than 9 µm.

The coating film thus formed is denser than an oxide film and, therefore, the film thickness can be easily reduced. Further, since the chemical composition formed at the interface between the coating film and AlN is changed at a gradient, characteristics of AlN can be sufficiently developed. Therefore, the AlN powder surface covered with the hydrophobic coating film mainly made of an aluminum phosphate compound is greatly improved in resistance against moisture and water. As a result, the thermal conductivity sheet using the thermally conductive insulators or fillers formed of the AlN powder has superior durability, and heat radiating characteristics, etc. are less deteriorated over time.

A method of treating the AlN powder surface by a coupling agent to form a hydrophobic coating film will be described below. First, a coupling agent having a phosphoric group, a pyrophosphoric group or an orthophosphoric group as a hydrophobic side-chain organic functional group is added to a solvent such as toluene, MEK, n-propanol or n-hexane, and then sufficiently mixed and stirred to thereby prepare a coupling agent solution. Next, the prepared coupling agent solution is added to an AlN powder material to thereby form a coating film, which is .made of aluminum phosphate, aluminum pyrophosphate, aluminum orthophosphate compound or salt thereof, on the AlN surface.

Whether the coating film remains as an organic thin film or an inorganic thin film depends on the conditions of removing the solvent after the surface treatment or the subsequent heating temperature. The coating film mainly made of aluminum phosphate, aluminum pyrophosphate or aluminum orthophosphate compound is preferably uniformly coated all over the AlN powder surface, and is formed by adsorption or chemical reaction between the AlN component and phosphoric acid, pyrophosphoric acid, orthophosphoric acid or salt thereof on the powder surface. In other words, a phosphoric ion of aluminum phosphate, aluminum pyrophosphate, aluminum orthophosphate compound or salt thereof selectively reacts an Al ion of AlN to form an aluminum phosphate compound, an aluminum pyrophosphate compound or an aluminum orthophosphate compound. Also, aluminum and a phosphoric compound have high reactivity and can improve both coupling property and stability.

The coupling agent used is preferably a titanate-base coupling having a phosphoric group, a pyrophosphoric group or an orthophosphoric group. When AlN powder or the like employed as a component material of the thermal conductivity sheet for use in the semiconductor field, it is required to avoid influences of ions of alkaline metals such as Na and K and ions of multivalent metals such as Fe and Mn to the utmost. If such impurity ions remain on the AlN powder surface, this would cause a drawback of, for example, lowering the surface resistance of a circuit board. It is therefore required to strictly check and control the amount of impurity ions depending on the application field of the AlN powder.

Specific embodiments will be described below in detail.

Embodiment 22

$H_3PO_4$ (Sample 101), $Ca(PO_4)_2$ (Sample 102), $(NH_4)_3PO_4$ (Sample 103), $(NH_4)_2HPO_4$ (Sample 104) and $NH_4H_2PO_4$ (Sample 105) were dissolved as phosphoric acid or phosphates in respective solvents shown in Table 6 to prepare phosphoric solutions having various contents. AlN powder having two peaks at the average particle size of 6 μm and 28 μm in particle size distribution was immersed in each of the solutions for 1 minute, and then was subject to heat treatment under conditions shown in Table 6 to form coating films mainly made of aluminum phosphate compounds, thereby fabricating AlN powders of Samples 101 to 105 shown in Table 6. An atmosphere during the heat treatment was Ar gas when the surface treatment temperature was equal to or higher than 500° C., and atmospheric air when it was lower than 500° C.

The coating films thus formed had components being mainly of Al, P and O and containing N at a gradient composition. For the AlN powders of Samples 101 to 105 and non-treated AlN powder (Sample 200), stability of moisture resistance and water resistance was evaluated as follows. (1) A predetermined amount of sample powder was immersed in distilled water at 18° C. and its pH value was measured. Then, the temperature of the distilled water was gradually raised up to 80° C. while continuing the measurement. A hydrophobic property of the sample powder was evaluated by measuring weight changes due to elution of nitrogen and pH changes of the distilled water. Measured results used for evaluation are shown in Table 6 below. Except for Comparative Sample, all Samples exhibited good results.

the hydrophobic coating films mainly made of aluminum phosphate compounds showed small weight changes and small pH changes, and were extremely superior in resistance against moisture and pharmaceuticals. On the other hand, it was proved that the AlN powder of Comparative Sample 200 being not subject to the surface treatment showed large weight changes and large pH changes, and was insufficient in chemical stability.

Embodiment 23

$(CH_3CH_2CH_2CH_2O)_3PO_4$ (Sample 106), $Mg(H_2PO_4)$—$2H_2O$ (Sample 107), $Zn(H_2PO_4)_2$—$2H_2O$ (Sample 108), $(CH_3C_6H_4)_3PO_4$ (Sample 109) and $(C_6H_5)_3PO_4$ (Sample 110) were dissolved as the phosphates in respective solvents shown in Table 7. AlN powder was immersed in the respective solutions for 1 minute, and then was subject to heat treatment at temperatures shown in Table 7 to form coating films mainly made of aluminum phosphates, thereby fabricating AlN powders of Samples 106 to 110. An atmosphere during the heat treatment was Ar gas when the surface treatment temperature was equal to or higher than 500° C., and atmospheric air when it was lower than 500° C.

The coating films thus formed had components being mainly of Al, P and O and containing N at a gradient composition. Subsequently, each AlN powder was immersed in hydrochloric acid of 0.1 M at temperature of 100° C. for 2 hours, and was subject to a Presher-Coucker test for 100 hours, followed by measuring weight changes due to elution of nitrogen and pH changes over time as with Embodiment 22. Measured results are shown in Table 7 below. Except for Comparative Sample, all Samples exhibited good results.

TABLE 6

| No. | SOLVENT | CONTENT (WT %) | HEAT TREATMENT TEMPERATURE (°C.) | WEIGHT CHANGE (mg) | pH CHANGE |
| --- | --- | --- | --- | --- | --- |
| SAMPLE 101 | PURE WATER | 20 | 200 | 0 | 5.9→4.7 |
| SAMPLE 102 | PURE WATER | 10 | 350 | 0 | 5.9→5.0 |
| SAMPLE 103 | PURE WATER | 30 | 500 | 0 | 5.8→4.6 |
| SAMPLE 104 | PURE WATER | 25 | 550 | 0 | 5.9→4.7 |
| SAMPLE 105 | PURE WATER | 18 | 280 | 0 | 5.8→4.8 |
| SAMPLE 200 | NONE | NONE | NONE | −50 | 8.0→9.8 |

As is apparent from the results shown in Table 6, it was found that the AlN powders of Samples 101 to 105 having

TABLE 7

| No. | SOLVENT | CONTENT (WT %) | HEAT TREATMENT TEMPERATURE (°C.) | WEIGHT CHANGE (mg) | pH CHANGE |
| --- | --- | --- | --- | --- | --- |
| SAMPLE 106 | ACETONE | 30 | 480 | 0 | 5.8→4.5 |
| SAMPLE 107 | PHOSPHORIC SOLUTION | 15 | 400 | 0 | 5.9→4.7 |
| SAMPLE 108 | PHOSPHORIC SOLUTION | 18 | 100 | 0 | 5.8→4.8 |

TABLE 7-continued

| No. | SOLVENT | CONTENT (WT %) | HEAT TREATMENT TEMPERATURE (°C.) | WEIGHT CHANGE (mg) | pH CHANGE |
|---|---|---|---|---|---|
| SAMPLE 109 | ACETONE | 40 | 490 | 0 | 6.0→4.1 |
| SAMPLE 110 | ACETONE | 40 | 470 | 0 | 6.0→4.2 |
| SAMPLE 200 | NONE | NONE | NONE | −50 | 8.0→9.8 |

Embodiment 24

AlN powder having two peaks at the average particle size of 6 μm and 28 μm in particle size distribution as with Embodiment 22 was immersed in toluene, and a titanate-base coupling agent was added to the solution in a predetermined content shown in Table 8, followed by stirring for 10 minutes to prepare a slurry for changing surface properties. The coupling agent used was isopropyl-triisostearoyl titanate (Sample 111) having a carboxyl group as the hydrophobic side chain functional group, isopropyl-tris(dioctyl pyrophosphate) titanate (Sample 112) having a pyrophosphoric group, tetra(2,2-diaryloxymethyl-1-butyl)bis(ditridecyl)phosphoric titanate (Sample 113) having a phosphoric group, and isopropyl-tri(N-aminoethyl-aminoethyl) titanate (Sample 114) having an amino group.

The content of the coupling agent was 1 wt %, 3 wt %, 5 wt % and 8 wt % as shown in Table 8. Then, the slurry was passed through a heated pipe at 160° C. to remove the solvent, and AlN powder treated by the coupling agent was collected in a collector pipe at 120° C.

For the AlN powders of Samples 111 to 114 and the non-treated AlN powder (Sample 200), stability of moisture resistance and water resistance was evaluated based on the following two methods. As with Embodiment 22, (1) a predetermined amount of sample powder was immersed in distilled water at 18° C. and its pH value was measured, and the temperature of the distilled water was gradually raised up to 80° C. while continuing the measurement. For the sample powder of which pH value was shifted to the alkaline side, it was judged that ammonia was produced upon hydrolysis occurred when the powder was immersed in the distilled water, and surface properties were not changed. On this judgment, that sample powder was not subject to the evaluation (2) below.

For Sample which was judged as having been changed in surface properties, (2) a predetermined amount of sample powder was added to hot water at 100° C. and concentrations or densities of Al, P and N ions were measured for evaluation after extraction under pressure for 90 minutes. Then, the sample powder was left to stand at 20° C. for 17 hours, and densities of eluted ions were measured by the ICP emission spectrochemical method and the Nessler's absorbance photometric method for evaluating hydrophobic property and chemical stability. Measured results are shown in Table 8 below.

TABLE 8

| No. | SOLVENT | CONTENT WT % | pH CHANGE | AMOUNT OF IONS ELUTED (ppm) | | |
|---|---|---|---|---|---|---|
| | | | | Al | P | N |
| SAMPLE 111 | TOLUENE | 1 | — | — | — | — |
| | TOLUENE | 3 | 6.7→7.4 | — | — | — |
| | TOLUENE | 5 | 6.2→7.2 | — | — | — |
| | TOLUENE | 8 | 6.5→7.1 | — | — | — |
| SAMPLE 112 | TOLUENE | 1 | — | — | — | — |
| | TOLUENE | 3 | — | — | — | — |
| | TOLUENE | 5 | 5.6→3.3 | <5 | 690 | 2190 |
| | TOLUENE | 8 | 5.4→3.3 | <5 | 700 | 1990 |
| SAMPLE 113 | TOLUENE | 1 | — | — | — | — |
| | TOLUENE | 3 | — | — | — | — |
| | TOLUENE | 5 | 5.5→6.5 | <5 | | 1240 |
| | TOLUENE | 8 | 5.8→5.7 | <5 | 310 | 730 |
| SAMPLE 114 | TOLUENE | 1 | — | — | — | — |
| | TOLUENE | 3 | 6.5→9.4 | — | — | — |
| | TOLUENE | 5 | — | — | — | — |
| | TOLUENE | 8 | — | — | — | — |
| SAMPLE 200 | NONE | — | 8.0→9.8 | — | — | — |

As is apparent from the results shown in Table 8, it was confirmed that the AlN powders of Samples 112 to 113, which was subject to the surface treatment by the coupling agent solutions containing 5 wt % of isopropyl-tris(dioctylpyrophosphate)titanate having a pyrophosphoric group or tetra (2,2diaryloxymethyl-1-butyl)bis(ditridecyl) phosphate titanate having a phosphoric group, had the small amount of eluted ions and possessed stable characteristics.

Embodiment 25

AlN powder having two peaks at the average particle size of 6 μm and 28 μm in particle size distribution as with Embodiment 22 was immersed in toluene, and a titanate-base coupling agent was added to the solution in a predetermined content shown in Table 9, followed by stirring for 10 minutes to prepare a slurry for changing surface properties. The coupling agent used was tetraoctylbis(ditridecyl phosphate) titanate (Sample 115) having a phosphoric group as the hydrophobic side-chain functional group, and bis(dioctyl pyrophosphate)oxyacetate titanate (Sample 116), bis(dioctyl pyrophosphate)ethylene titanate (Sample 117) and diisopropyl-bis(dioltyl pyrophosphate) titanate (Sample 118) each having a pyrophosphoric group. Also, acetoalcoxyaluminumdiisopropylate (Sample 119) was used as an aluminum-base coupling agent.

The content of the coupling agent was set to the same values as in Embodiment 24. Then, the slurry was passed through a heated pipe at 160° C. to remove the solvent, and AlN powder treated by the coupling agent was collected in a collector pipe at 120° C. As with Embodiment 24, (1) a predetermined amount of sample powder was immersed in distilled water at 18° C. and its pH value was measured, and the temperature of the distilled water was gradually raised up to 80° C. while continuing the measurement. For the sample powder of which pH value was shifted to the alkaline side, it was judged that ammonia was produced upon hydrolysis occurred when the powder was immersed in the distilled water, and surface properties were not changed. On this judgment, that sample powder was not subject to the evaluation (2) below. For Sample which was judged as having been changed in surface properties, (2) a predetermined amount of sample powder was added to hot water at 100° C. and densities of Al, P and N ions were measured for evaluation after extraction under pressure for 90 minutes. Then,. the sample powder was left to stand at 20° C. for 17 hours, and densities of eluted ions were measured by the ICP emission spectrochemical method and the Nessler's absorbance photometric method for evaluation. Measured results are shown in Table 9 below.

As is apparent from the results shown in Table 9, good results were obtained for the AlN powders treated by bis (dioctyl pyrophosphate)oxyacetate titanate (Sample 116), bis(dioctyl pyrophosphate)ethylene titanate (Sample 117) and diisopropyl-bis(dioctylpyrophosphate) titanate (Sample 118) each having a pyrophosphoric group. The AlN powder treated by tetraoctylbis(ditridecyl phosphate) titanate (Sample 115) showed good stability ranked next.

TABLE 9

| No. | SOLVENT | CONTENT (WT %) | pH CHANGE | AMOUNT OF IONS ELUTED (ppm) | | |
|---|---|---|---|---|---|---|
| | | | | Al | P | N |
| SAMPLE 115 | TOLUENE | 1 | — | — | — | — |
| | TOLUENE | 3 | — | — | — | — |
| | TOLUENE | 5 | 5.6→6.6 | — | — | — |
| | TOLUENE | 8 | 5.8→5.6 | — | — | — |
| SAMPLE 116 | TOLUENE | 1 | — | — | — | — |
| | TOLUENE | 3 | — | — | — | — |
| | TOLUENE | 5 | 5.6→4.6 | <5 | 360 | 610 |
| | TOLUENE | 8 | 5.6→4.3 | <5 | 390 | 760 |
| SAMPLE 117 | TOLUENE | 1 | — | — | — | — |
| | TOLUENE | 3 | — | — | — | — |
| | TOLUENE | 5 | 5.6→4.6 | — | — | — |
| | TOLUENE | 8 | 5.7→4.3 | <5 | 580 | 1190 |
| SAMPLE 118 | TOLUENE | 1 | 5.8→7.3 | 1140 | 180 | 1600 |
| | TOLUENE | 3 | 5.9→5.5 | 7 | 120 | 22 |
| | TOLUENE | 5 | 5.8→5.4 | 43 | 180 | 160 |
| | TOLUENE | 8 | 5.7→4.7 | 2 | 250 | 24 |
| SAMPLE 119 | TOLUENE | 1 | 5.8→7.7 | — | — | — |
| | TOLUENE | 3 | 5.9→8.4 | — | — | — |
| | TOLUENE | 5 | 5.8→9.0 | — | — | — |
| | TOLUENE | 8 | 6.0→8.6 | — | — | — |
| SAMPLE 200 | NONE | — | 8.0→9.8 | — | — | — |

Embodiment 26

$(NH_4)_3PO_4$ (Samples 121 to 124) and $Na_2HPO_4$ (Sample 125) were employed as phosphates to prepare phosphate solutions having respective solvents, phosphorus contents and pH values shown in Table 10. AlN powder having two peaks at the average particle size of 6 µm and 28 µm in particle size distribution was immersed in each of the solutions for 1 minute, and then stirred and mixed using ultrasonic waves for 1 minute. After that, the AlN powder was washed by water and then subject to heat treatment at 100° C. for 1 hour, thereby fabricating AlN powders of Samples 121 to 125. Also, Sample 200 was given by non-treated AlN powder. These AlN powders were heated and extracted using water and acid, and the amount of eluted nitrogen was measured by the steam distillation—Nessler's absorbance photometric method. Measured results are shown in Table 10 below.

TABLE 10

| No. | PHOSPHORUS CONTENT (ppm) | pH | AMOUNT OF NITROGEN ELUTED AFTER TREATMENT (ppm) |
|---|---|---|---|
| SAMPLE 121 | 50 | 7 | 8–10 |
| SAMPLE 122 | 200 | 7 | 1–2 |
| SAMPLE 123 | 50 | 7 | 8–15 |
| SAMPLE 124 | 30 | 7 | 30–50 |
| SAMPLE 125 | 400 | 7 | 2–4 |
| SAMPLE 200 | NONE | — | 66700 |

As is apparent from Table 10, except for the AlN powder of Comparative Example 200 not subject to surface treatment, all other AlN powders showed the small amount of eluted nitrogens and possessed superior chemical stability.

According to the surface property changing method employed in Embodiments 22 to 26, as described above, chemical stability which has been problem in the conventional AlN powder can be greatly improved without impairing high thermal conductivity, by forming a coating film mainly made of an aluminum phosphate compound on the AlN powder surface, more particularly, a coating film made of a coupling agent which contains at least one of phosphoric acid, pyrophosphoric acid and orthophosphoric acid.

Accordingly, when the highly thermally conductive insulators and fillers are formed of AlN of which surface is treated to form the coating film, and these insulators and fillers are combined with the matrix insulator to manufacture the thermal conductivity sheet, the thermal conductivity sheet having superior chemical stability is obtained. Furthermore, the obtained thermal conductivity sheet is less deteriorated in characteristics over time, is superior in durability, and has a long service life.

INDUSTRIAL APPLICABILITY

According to the thermal conductivity sheet of the present invention, as described above, since highly thermally conductive insulators combined in a matrix insulator are arranged obliquely or erectly in the direction of thickness of the thermal conductivity sheet such that at least one end faces of the highly thermally conductive insulators are exposed to a surface of the matrix insulator, heat radiating paths with high thermal conductivity are formed continuously in the direction of thickness of the thermal conductivity sheet. It is therefore possible to effectively transmit heat is the direction of thickness of the thermal conductivity sheet, and to greatly improve the efficiency of cooling electronic/electric parts to which the thermal conductivity sheet is fitted.

Particularly, by arranging the highly thermally conductive insulators in the matrix insulator such that the insulators are oriented obliquely with respect to the direction of thickness of the thermal conductivity sheet, the sheet can have higher elasticity in the direction of sheet thickness than the sheet in which the insulators are oriented erectly. It is therefore possible to develop an effect of releasing stresses imposed from parts to be cooled, and to improve close-contact of the thermal conductivity sheet with respect to the cooled parts. As a result, the thermal conductivity sheet serves as an extremely useful means for efficiently dissipating, to the exterior, the heat generated from electronic/electric equipment parts such as transistors, capacitors and LSI packages, medical equipment such as ultrasonic diagnosis apparatus, nuclear magnetic resonance diagnosis apparatus and X-ray diagnosis apparatus, office automation (OA) equipment such as copying machines and printers, analyzers such as X-ray analyzers, radio wave equipment such as broadcasting satellites, and other heat generating equipment such as for military and defense purposes and domestic purposes.

We claim:

1. A thermal conductivity sheet in which a plurality of thermally conductive insulators, each insulator having two end faces, and are continuously interconnected through a flexible matrix insulator, wherein only a portion of said thermally conductive insulators are arranged obliquely in the direction of thickness of said thermal conductivity sheet such that at least one end face of each of said thermally conductive insulators in said portion of insulators arranged obliquely is exposed to a surface of said matrix insulator.

2. A thermal conductivity sheet according to claim 1, wherein only a portion of said thermally conductive insulators are arranged obliquely in the direction of thickness of said thermal conductivity sheet such that both end faces of said thermally conductive insulators in said portion of insulators are exposed to surfaces of said matrix insulator.

3. A thermal conductivity sheet according to claim 1, wherein an area ratio of portions where said thermally conductive insulators are exposed to the surface of said matrix insulator to a total surface area of said thermal conductivity sheet is at least 1%.

4. A thermal conductivity sheet according to claim 1, wherein said thermal conductivity sheet has anisotropy in thermal conductivity in the direction of plane of said thermal conductivity sheet.

5. A thermal conductivity sheet according to claim 1, wherein said thermally conductive insulators are formed such that sectional areas of said thermally conductive insulators are changed in the axial direction thereof.

6. A thermal conductivity sheet according to claim 1, wherein said thermally conductive insulator comprises a plurality of columnar thermally conductive insulator elements which are adjacent to each other in the direction of thickness of said thermal conductivity sheet with their central axes offset from each other, and a coupling element for integrally coupling said adjacent columnar thermally conductive insulator elements in the direction of plane of said thermal conductivity sheet.

7. A thermal conductivity sheet according to claim 6, wherein said coupling element has a thickness equal to or smaller than ½ of the height of said columnar thermally conductive insulator elements.

8. A thermal conductivity sheet according to claim 1, wherein said thermally conductive insulator comprises a plurality of columnar thermally conductive insulator elements which are interconnected in the direction of thickness of said thermal conductivity sheet, and said columnar thermally conductive insulator elements adjacent to each other are freely movable relatively at contact surfaces therebetween.

9. A thermal conductivity sheet according to claim 8, wherein the contact surfaces of said columnar thermally conductive insulator elements adjacent to each other are inclined with respect to the direction of plane of said thermal conductivity sheet.

10. A thermal conductivity sheet according to claim 8, wherein the contact surfaces of said columnar thermally conductive insulator elements adjacent to each other are formed to be saw-toothed in section.

11. A thermal conductivity sheet according to claim 1, wherein a height between both end faces of said thermally conductive insulators are set to be smaller than the thickness of said matrix insulator so that recessed steps are formed between surfaces of said matrix insulator and the end faces of said thermally conductive insulators.

12. A thermal conductivity sheet according to claim 1, wherein bumps made of a soft metal are formed on at least one end faces of said thermally conductive insulators exposed to the surface of said matrix insulator.

13. A thermal conductivity sheet according to claim 1, wherein said thermally conductive insulators have a thermal conductivity of at least 25 W/m·K.

14. A thermal conductivity sheet according to claim 1, wherein said thermally conductive insulators have electrical insulation resistivity of at least $10^{12}$ Ω·cm.

15. A thermal conductivity sheet according to claim 1, wherein said thermally conductive insulators are made of aluminum nitride.

16. A thermal conductivity sheet according to claim 15, wherein said aluminum nitride making up said thermally conductive insulators is a sintered or calcined body.

17. A thermal conductivity sheet according to claim 1, wherein said matrix insulator has electrical insulation resistivity of at least $10^{12}$ Ω·cm.

18. A thermal conductivity sheet according to claim 1, wherein said matrix insulator is selected from the group consisting of silicone, epoxy, acrylic, vinyl chloride, and polyurethane.

19. A thermal conductivity sheet according to claim 1, wherein said matrix insulator is formed of a composite selected from the group consisting of silicone, epoxy, acrylic, vinyl chloride, and polyurethane and a thermally conductive filler.

20. A thermal conductivity sheet according to claim 18, wherein said matrix insulator is made of at least one of a thermoplastic resin and a thermosetting resin.

21. A thermal conductivity sheet according to claim 19, wherein said composite is a mixture or laminate Selected from the group consisting of silicon, epoxy, acrylic, vinyl chloride, and polyurethane and a thermally conductive filler.

22. A thermal conductivity sheet according to claim 19, wherein said thermally conductive filler making up said composite has a thermal conductivity of at least 0.3 W/m·K.

23. A thermal conductivity sheet according to claim 19, wherein said thermally conductive filler making up said composite is at least kind of ceramics selected from among aluminum nitride, silicon nitride, boron nitride and aluminum oxide.

24. A thermal conductivity sheet according to claim 19, wherein said thermally conductive filler making up said composite is in the form of at least one of powders, particles and fibers.

25. A thermal conductivity sheet according to claim 19, wherein said thermally conductive filler making up said composite is a single crystal.

26. A thermal conductivity sheet according to claim 19, wherein said thermally conductive filler making up said composite and being in the form of powder is at least one of sintered powder, baked powder, calcined powder and material powder.

27. A thermal conductivity sheet according to claim 19, wherein said thermally conductive filler making up said composite has average size of 0.3 μm to 3 mm.

28. A thermal conductivity sheet according to claim 19, wherein said thermally conductive filler making up said composite is in the form of a polyhedron.

29. A thermal conductivity sheet according to claim 28, wherein said thermally conductive filler making up said composite and being in the form of a polyhedron is in the form of at least one of a regular polyhedron, a regular hexahedron, a rectangular parallelepiped, a specule, and a polypyramid.

30. A thermal conductivity sheet according to claim 19, wherein said thermally conductive filler making up said composite is in the form of at least one of an ellipsoid, a sphere, a cylinder, a cone, and a sphere having bosses.

31. A thermal conductivity sheet according to claim 19, wherein said thermally conductive filler making up said composite is a hollow body.

32. A thermal conductivity sheet according to claim 19, wherein said thermally conductive filler making up said composite is made of aluminum nitride, and a coating film mainly made of an aluminum phosphate compound is formed on a surface of said thermally conductive filler.

33. A thermal conductivity sheet according to claim 1, wherein said thermally conductive insulator is formed of a laminate of an electrically conductive base and an insulating layer, and said electrically conductive base has thermal conductivity of at least 25 W/m·K.

34. A thermal conductivity sheet according to claim 33, wherein said laminate comprises a metal as said electrically conductive base and said insulating layer is selected from the group consisting of silicone, epoxy, acrylic, vinyl chloride, and polyurethane, having electrical insulation resistivity of at least $10^{12}$ Ω·cm.

35. A thermal conductivity sheet according to claim 34, wherein said metal making up said laminate has a thermal conductivity of at least 25 W/m·K.

36. A thermal conductivity sheet according to claim 34, wherein said metal making up said laminate is at least one of gold, silver, copper, aluminum, brass, bronze and solder.

37. A thermal conductivity sheet according to claim 34, wherein said metal making up said laminate is in the form of fibers, foils, or an assembly of said fibers or foils.

38. A thermal conductivity sheet according to claim 34, wherein said insulating layer making up said laminate has a thickness equal to or smaller than 0.1 mm.

39. A thermal conductivity sheet according to claim 33, wherein said insulating layer has irregularities formed on its surface.

40. A thermal conductivity sheet according to claim 33, wherein said laminate has a thermal conductivity of at least 2 W/m·K.

41. A thermal conductivity sheet according to claim 1, wherein the modulus of elasticity of said thermal conductivity sheet in the direction of plane thereof is anisotropic.

42. A thermal conductivity sheet according to claim 1, wherein the Young's moduli of said thermal conductivity sheet in two orthogonal directions are different from each other at least 50 times.

43. A thermal conductivity sheet according to claim 1, wherein a coating layer containing a lipophilic group is formed on a surface of said thermally conductive insulator.

44. A thermal conductivity sheet according to claim 1, wherein said portion of thermally conductive insulators arranged obliquely in the direction of thickness of said thermal conductivity sheet are inclined with respect to the direction of the plane of said sheet at an angle θ of 30≦θ<90 degrees.

45. A thermal conductivity sheet according to claim 1, wherein said thermally conductive insulators have long axes and wherein said long axes of said insulators which are arranged obliquely in the direction of thickness of said thermal conductivity sheet are aligned at specific angles.

46. A thermal conductivity sheet according to claim 1, wherein some of said thermally conductive insulators penetrate through said sheet and some of said thermally conductive insulators do not penetrate through said sheet and all of said insulators lie horizontally or obliquely in said sheet and are mixed together.

47. A thermal conductivity sheet according to claim 1, wherein said thermally conductive insulators comprise an assembly of wires, fibers or foils.

48. A thermal conductivity sheet according to claim 47, wherein said thermally conductive insulators are silicon nitride fibers ($Si_3N_4$) which are contained within said matrix insulator.

49. A thermal conductivity sheet according to claim 1, wherein said thermally conductive insulators are bent.

50. A thermal conductivity sheet according to claim 1, wherein said thermally conductive insulators are made of a material selected from the group consisting of aluminum nitride, boron nitride, silicon nitride, silicon carbide, BeO, C—BN, diamond, HP—TiC and alumina ceramic.

51. A thermal conductivity sheet according to claim 44, wherein the area ratio of said thermally conductive insulators are which are exposed to the surface of said matrix insulator to the total surface area of said thermal conductivity sheet is at least 1%.

* * * * *